US009361957B2

(12) United States Patent
Nakamura et al.

(10) Patent No.: US 9,361,957 B2
(45) Date of Patent: *Jun. 7, 2016

(54) LOWER ENERGY CONSUMPTION AND HIGH SPEED COMPUTER SYSTEM AND A MARCHING MAIN MEMORY ADAPTED FOR THE COMPUTER SYSTEM, WITHOUT THE MEMORY BOTTLENECK

(71) Applicants: Tadao Nakamura, Sendai (JP); Michael J. Flynn, Palo Alto, CA (US)

(72) Inventors: Tadao Nakamura, Sendai (JP); Michael J. Flynn, Palo Alto, CA (US)

( * ) Notice: Subject to any disclaimer, the term of this patent is extended or adjusted under 35 U.S.C. 154(b) by 74 days.

This patent is subject to a terminal disclaimer.

(21) Appl. No.: 14/552,572

(22) Filed: Nov. 25, 2014

(65) Prior Publication Data
US 2015/0149718 A1 May 28, 2015

Related U.S. Application Data

(63) Continuation of application No. 13/384,774, filed as application No. PCT/JP2010/004642 on Jul. 20, 2010, now Pat. No. 8,949,650.

(60) Provisional application No. 61/227,325, filed on Jul. 21, 2009.

(51) Int. Cl.
| *G06F 1/12* | (2006.01) |
| *G06F 1/08* | (2006.01) |
| *G11C 7/10* | (2006.01) |
| *G06F 15/78* | (2006.01) |
| *G06F 5/08* | (2006.01) |
| *G06F 9/30* | (2006.01) |
| *G06F 9/38* | (2006.01) |
| *G11C 19/18* | (2006.01) |
| *G06F 5/06* | (2006.01) |
| *G06F 12/08* | (2016.01) |
| *G06F 7/57* | (2006.01) |

(52) U.S. Cl.
CPC .............. *G11C 7/1072* (2013.01); *G06F 5/065* (2013.01); *G06F 5/08* (2013.01); *G06F 9/30134* (2013.01); *G06F 9/3889* (2013.01); *G06F 12/0875* (2013.01); *G06F 15/7821* (2013.01); *G11C 19/184* (2013.01); *G06F 1/08* (2013.01); *G06F 7/57* (2013.01); *Y02B 60/1207* (2013.01); *Y02B 60/1225* (2013.01)

(58) Field of Classification Search
CPC ................ G06F 1/12; G06F 1/14; G06F 1/08
See application file for complete search history.

(56) References Cited

U.S. PATENT DOCUMENTS 5,506,998 A 4/1996 Kato et al.

OTHER PUBLICATIONS

European office action letter issued on Mar. 19, 2015 in the counterpart EP patent application.

*Primary Examiner* — Phil Nguyen
(74) *Attorney, Agent, or Firm* — Mots Law, PLLC

(57) ABSTRACT

A computer system encompasses a processor (11) including a control unit (111) and an ALU (112) configured to execute arithmetic and logic operations synchronized with the clock signal, and a marching main memory (31), which embraces an array of memory units, configured to store information in each of memory units and to transfer synchronously with the clock signal, providing the processor (11) with the stored information actively and sequentially so that the ALU (112) can execute the arithmetic and logic operations with the stored information. The results of the processing in the ALU (112) are sent out to the marching main memory (31), but there is only one way of instructions flow from the marching main memory (31) to the processor.

20 Claims, 46 Drawing Sheets

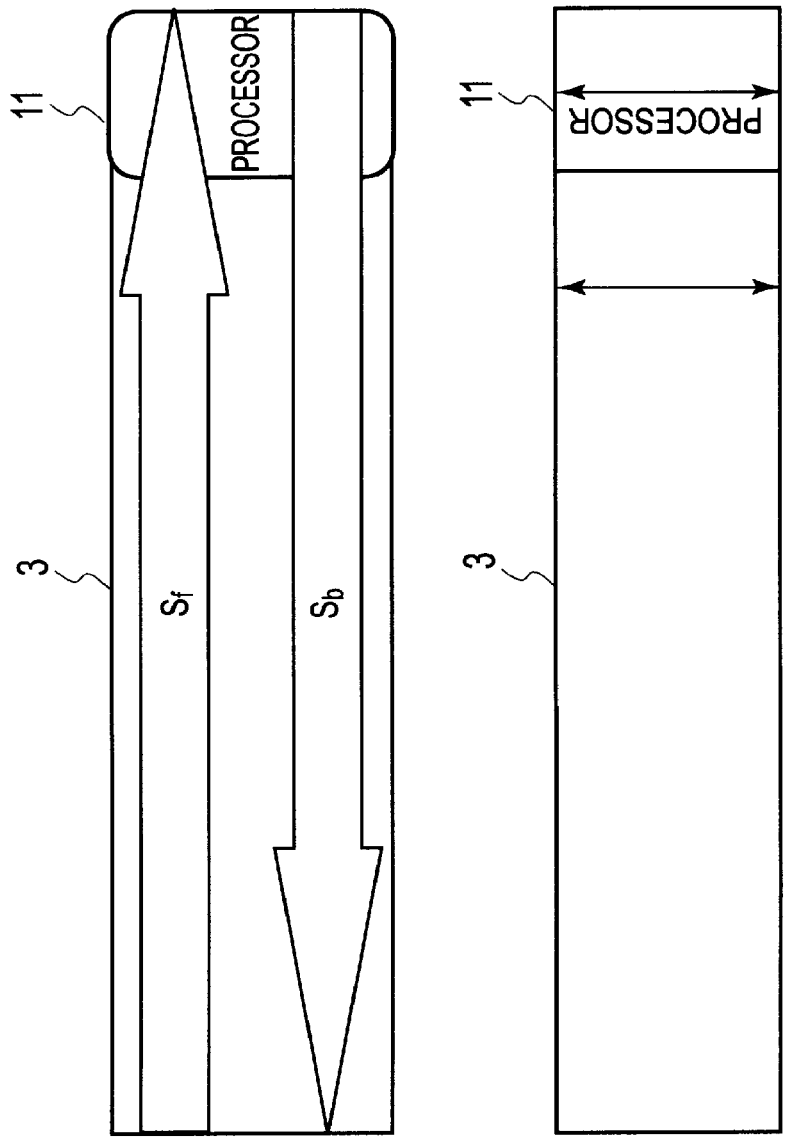

SPEED / CAPABILITY

SPEED / CAPABILITY

SPEED / CAPABILITY

SPEED / CAPABILITY

SPEED / CAPABILITY

[Fig. 30]
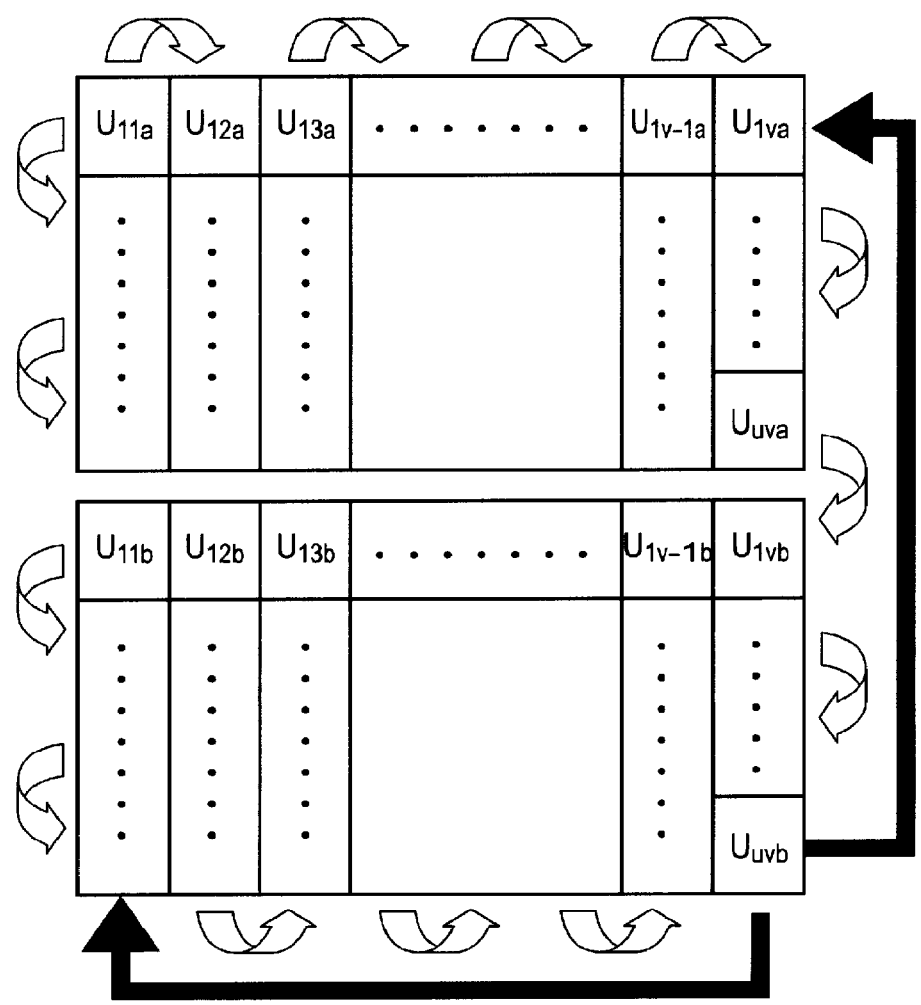

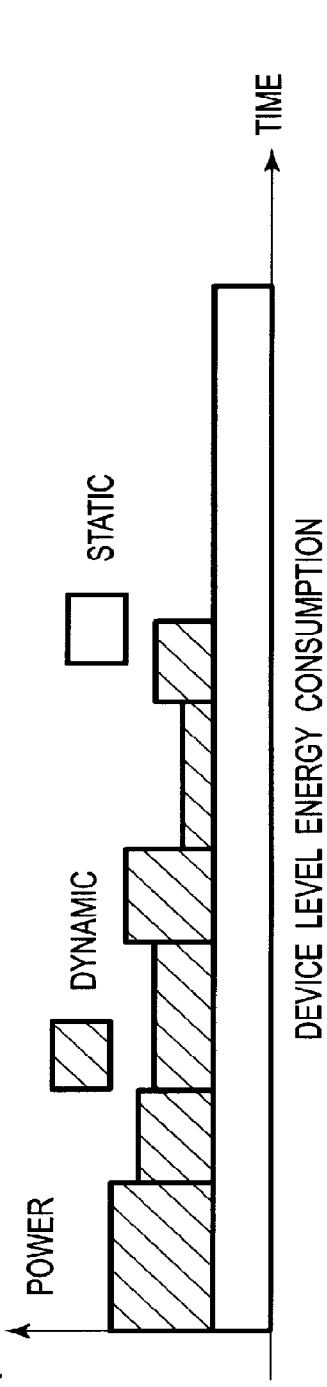
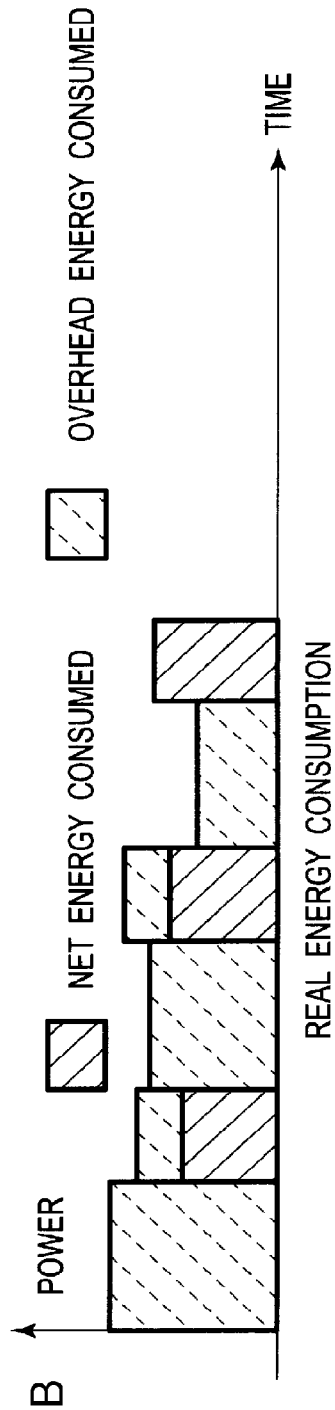
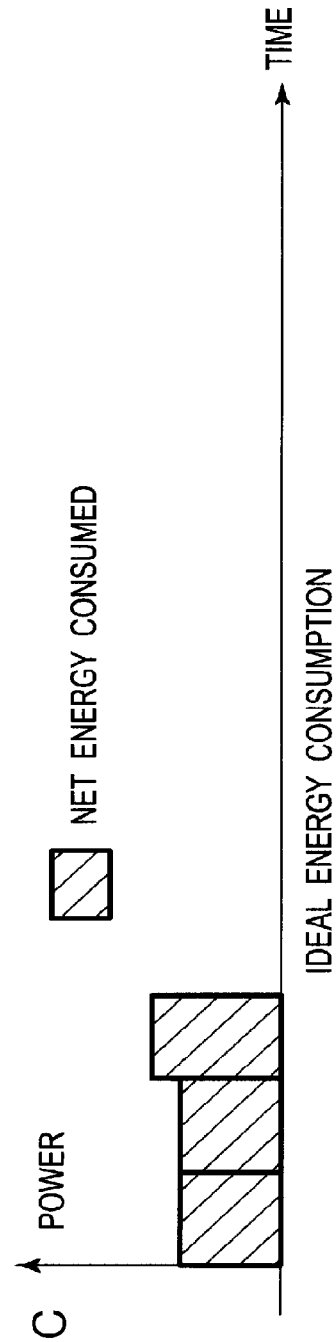
Fig. 31A
Fig. 31B
Fig. 31C

[Fig. 32]
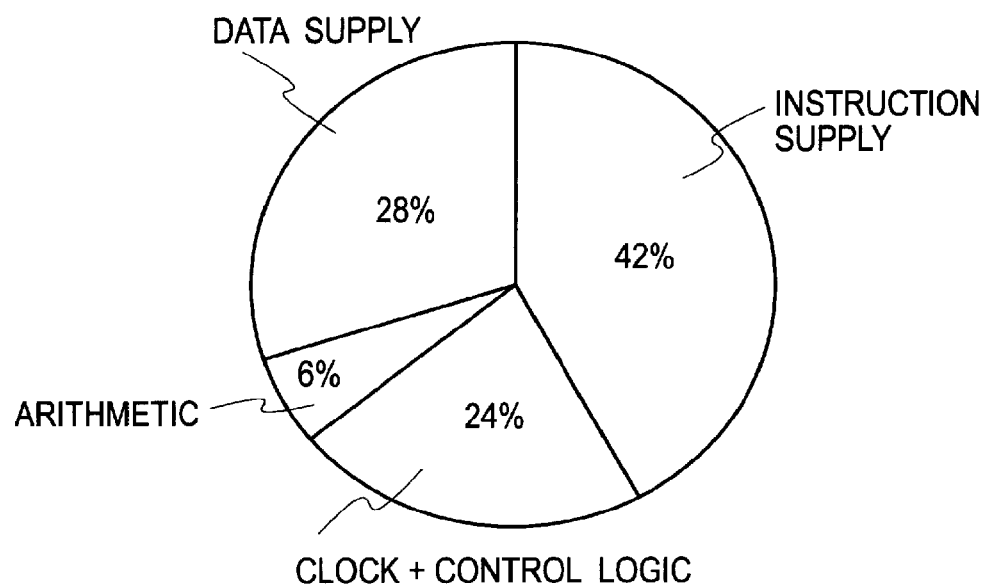

US 9,361,957 B2

LOWER ENERGY CONSUMPTION AND HIGH SPEED COMPUTER SYSTEM AND A MARCHING MAIN MEMORY ADAPTED FOR THE COMPUTER SYSTEM, WITHOUT THE MEMORY BOTTLENECK

This application is a continuation of application Ser. No. 13/384,774, filed on Jan. 19, 2012, which is a U.S. National Phase under 35 U.S.C. §371 of international application No. PCT/JP2010/004642, filed on Jul. 20, 2010, which is based upon and claims the benefit of priority from the prior U.S. provisional application No. 61/227,325, filed on Jul. 21, 2009, and whereby the contents of which are incorporated in their entirety herein by reference.

TECHNICAL FIELD

The instant invention relates to computer systems, which operate at a low energy consumption and high speed.

BACKGROUND ART

Since von Neumann and others more than 60 years ago developed a stored program electronic computer, the fundamental memory accessing principle has not been changed. While the processing speeds of computers have increased significantly over the years for whole range of high performance computing (HPC) applications, it has been accomplished either by device technology or by schemes that avoid memory accessing (such as using cache). However, the memory accessing time still limits performance. Currently computer systems use many processors 11 and large-scale main memory 331, as shown in FIG. 1.

The computer system shown in FIG. 1 includes a processor 11, a cache memory (321a, 321b) and a main memory 331. The processor 11 includes a control unit 111 having a clock generator 113 configured to generate a clock signal, an arithmetic logic unit (ALU) 112 configured to execute arithmetic and logic operations synchronized with the clock signal, a instruction register file (RF) 322a connected to the control unit 111 and a data register file (RF) 322b connected to the ALU 112. The cache memory (321a, 321b) has an instruction cache memory 321a and a data cache memory 321b. A portion of the main memory 331 and the instruction cache memory 321a are electrically connected by wires and/or buses, which limits the memory access time (or having the Von Neumann bottleneck).351. The remaining portion of the main memory 331, and the data cache memory 321b are electrically connected to enable a similar memory access. 351. Furthermore, wires and/or buses, which implement memory access. 352, electrically connect between the data cache memory 321b and the instruction cache memory 321a, and the instruction register file 322a and the data register file 322b.

Even though the HPC systems are expected to operate at high speed and low energy consumption, there are speed limitations due to the memory accessing bottlenecks 351, 352. The bottlenecks 351, 352 are ascribable to the wirings between processors 11 and the main memory 331, because the wire length delays access to the computers and stray capacitance existing between wires cause additional delay. Such capacitance requires more power consumption that is proportional to the processor clock frequency in 11.

Currently some HPC processors are implemented using several vector arithmetic pipelines. This vector processor makes better use of memory bandwidth and is a superior machine for HPC applications that can be expressed in vector notation. The vector instructions are made from loops in a source program and each of these vector instructions is executed in an arithmetic pipeline in a vector processor or corresponding units in a parallel processor. The results of these processing schemes give the same results.

However, even the vector processor based system has the memory bottleneck 351, 352 between all the units. Even in a single system with a wide memory and large bandwidth, the same bottleneck 351, 352 appears and if the system consists of many of the same units as in a parallel processor, and the bottleneck 351, 352 is unavoidable.

There are two essential memory access problems in the conventional computer systems. The first problem is wiring lying not only between memory chips and caches or between these two units even on a chip but also inside memory systems. Between chips the wiring between these two chips/units results in more dynamic power consumption due to capacity and the wire signal time delay. This is extended to the internal wire problems within a memory chip related to access lines and the remaining read/write lines. Thus in both inter and intro wiring of memory chips, there exists energy consumption caused by the capacitors with these wires.

The second problem is the memory bottleneck 351, 352 between processor chip, cache and memory chips. Since the ALU can access any part of cache or memory, the access path 351, 352 consists of global wires of long length. These paths are also limited in the number of wires available. Such a bottleneck seems to be due to hardware such as busses. Especially when there is a high speed CPU and a large capacity of memory, the apparent bottleneck is basically between these two.

The key to removing the bottleneck is to have the same memory clock cycle as the CPU's. First, addressing proceeding must be created to improve memory access. Secondly the time delay due to longer wires must be significantly reduced both inside memory and outside memory.

By solving these two issues, a fast coupling between memory and the CPU is made, which fact enables a computer without the Memory Bottleneck.

The processor consumes 70% of the total energy because of these problems, which is divided into 42 percent for supplying instructions and 28 percent for data as shown in FIG. 32. The wiring problems generate not only power consumption but also time delay of signals. Overcoming the wiring problems implies the elimination of bottlenecks 351, 352 that limits the flow of data/instructions. If we could remove the wirings of intra/inter chips, the problems of power consumption, time delay and memory bottlenecks 351, 352 would be solved.

SUMMARY OF INVENTION

An inherent aspect of the present invention is a computer system encompassing (a) a processor including a control unit having a clock generator configured to generate a clock signal, and an arithmetic logic unit configured to execute arithmetic and logic operations synchronized with the clock signal; and (b) a marching main memory encompassing an array of memory units, usually called locations, each having a unit of information, input terminals of the array and output terminals of the array, configured to store information in each of the memory units and to transfer synchronously with the clock signal, step by step, toward the output terminals, so as to provide the processor with the stored information actively and sequentially so that the arithmetic logic unit can execute the arithmetic and logic operations with the stored information in addition to the results of the processing in the arithmetic logic unit are sent out to the marching main memory, except that in case of instructions movement, there is only one way of instructions flow from the marching main memory to the processor.

BRIEF DESCRIPTION OF DRAWINGS

FIG. 11($a$) illustrates a forward data stream flowing from the marching memory structure, which includes the marching main memory, to the processor (CPU) and backward data stream flowing from the processor (CPU) to the marching memory structure in the computer system pertaining to the first embodiment of the present invention, and FIG. 11($b$) illustrates bandwidths established between the marching memory structure and the processor (CPU) under an ideal condition that the memory unit streaming time of the marching memory structure is equal to the clock cycle of the processor (CPU);

FIG. 15($a$) compares with FIG. 15($b$), illustrating an inner configuration of existing memory, in which each memory unit is labeled by an address, and FIG. 15($b$) illustrates an inner configuration of present one-dimensional marching main memory, in which the positioning of individual memory unit is at least necessary to identify the starting point and ending point of a set of successive memory units in vector/streaming data.

FIG. 16($c$) illustrates an inner configuration of present one-dimensional marching main memory, in which position indexes are at least necessary to identify the starting point and ending point of a set of successive memory units in vector/streaming data;

FIG. 30 illustrates a further another example of the array of two-dimensional memory units, each of the memory units storing and transferring data or instructions, implementing a marching main memory used in the computer system pertaining to the first embodiment of the present invention;

FIG. 31(a) illustrates device level energy consumption in current microprocessors, decomposing into static and dynamic energy consumptions, FIG. 31(b) illustrates net and overhead of the power consumption in the dynamic energy consumption shown in FIG. 31(a), and FIG. 31(c) illustrates the net energy consumption in the current microprocessors;

FIG. 32 illustrates an actual energy consumption distribution over a processor including registers and caches in the conventional architecture, estimated by Dally;

DESCRIPTION OF EMBODIMENTS

Figure 1:
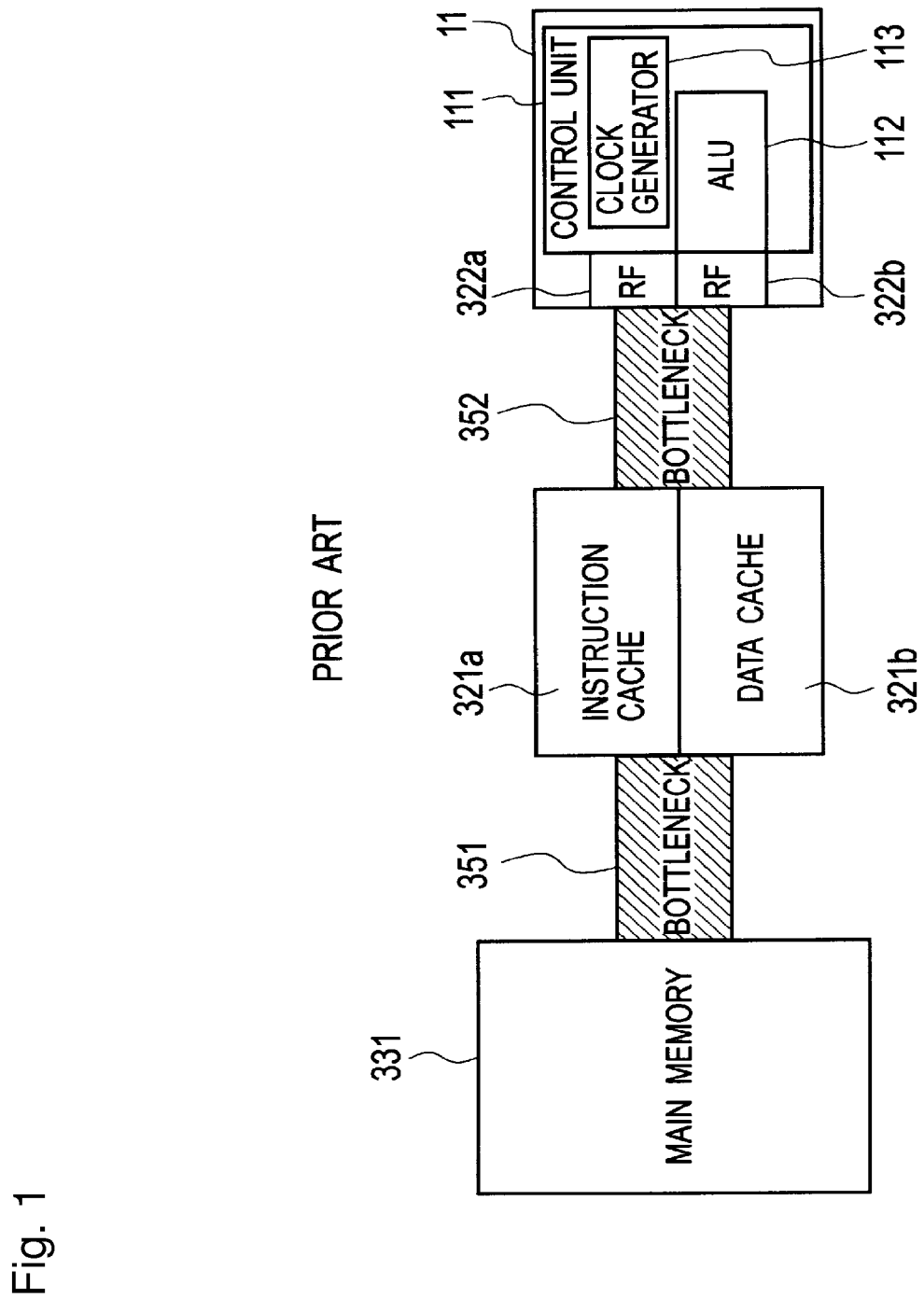
FIG. 1 illustrates a schematic block diagram showing an organization of a conventional computer system.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings. In the following description specific details are set forth, such as specific materials, processes and equipment in order to provide a thorough understanding of the present invention. It will be apparent, however, to one skilled in the art that the present invention may be practiced without these specific details. In other instances, well-known manufacturing materials, processes and equipment are not set forth in detail in order not to unnecessarily obscure the present invention. Prepositions, such as "on", "over", "under", "beneath", and "normal" are defined with respect to a planar surface of the substrate, regardless of the orientation in which the substrate is actually held. A layer is on another layer even if there are intervening layers.

First Embodiment

Fundamental Organization of Computer System

Figure 2:
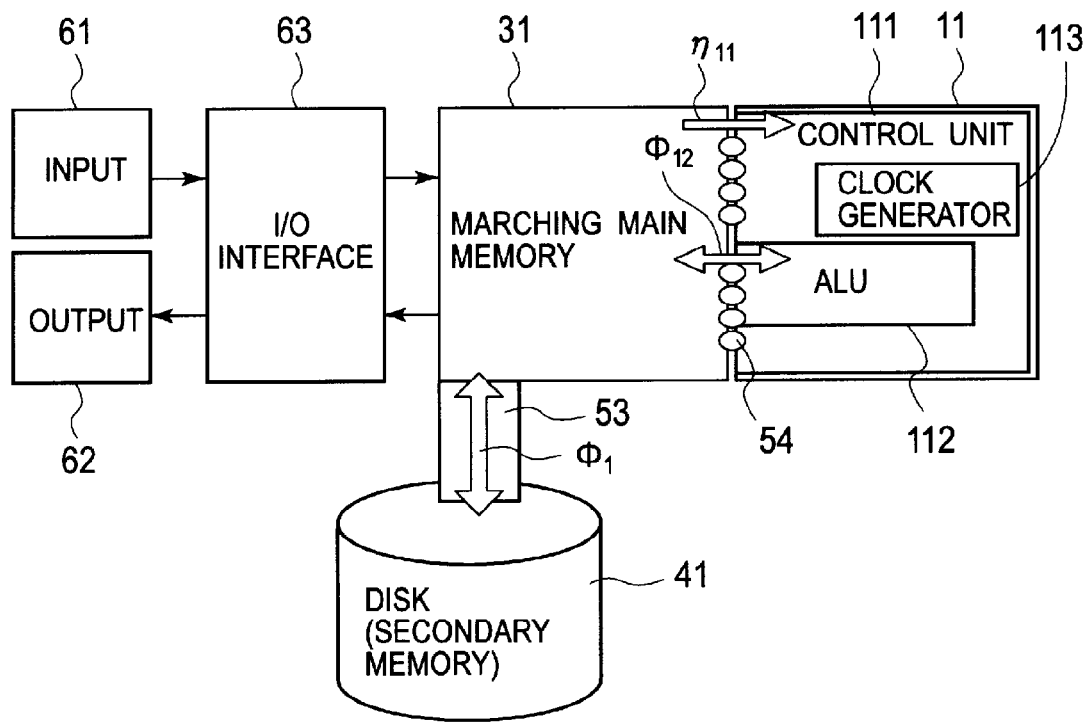
FIG. 2 illustrates a schematic block diagram showing a fundamental organization of a computer system pertaining to a first embodiment of the present invention.
Figure 3:
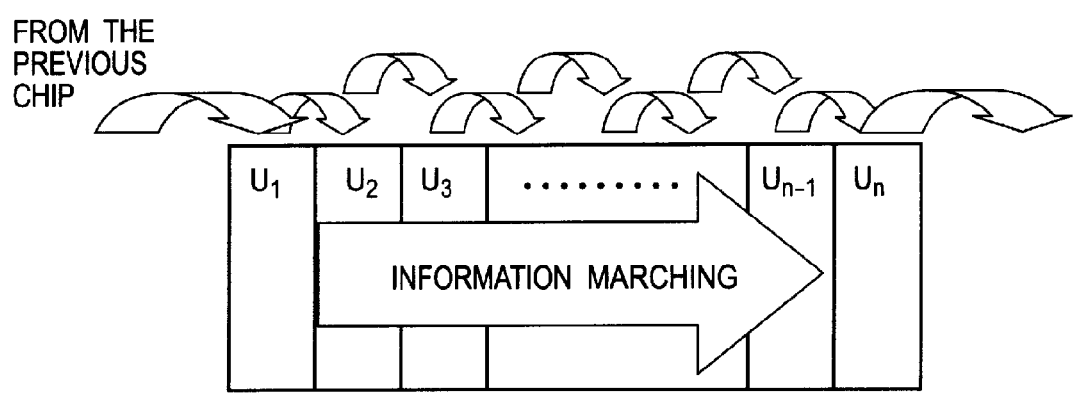
FIG. 3 illustrates an array of memory units implementing a marching main memory used in the computer system pertaining to the first embodiment of the present invention, and a transfer of information in the marching main memory.

As shown in FIG. 2, a computer system pertaining to a first embodiment of the present invention encompasses a processor 11 and a marching main memory 31. The processor 11 includes a control unit 111 having a clock generator 113 configured to generate a clock signal, and an arithmetic logic unit (ALU) 112 configured to execute arithmetic and logic operations synchronized with the clock signal. As shown in FIG. 3, the marching main memory 31 encompasses an array of memory units $U_1, U_2, U_3, \ldots, U_{n-1}, U_n$, each of memory units $U_1, U_2, U_3, \ldots, U_{n-1}, U_n$ having a unit of information including word size of data or instructions, input terminals of the array and output terminals of the array. As shown in FIG. 3, the marching main memory 31 stores the information in each of memory units $U_1, U_2, U_3, \ldots, U_{n-1}, U_n$ and transfers the information synchronously with the clock signal, step by step, toward the output terminals, so as to provide the processor 11 with the stored information actively and sequentially so that the ALU 112 can execute the arithmetic and logic operations with the stored information.

As shown in FIG. 2, the marching main memory 31 and the processor 11 are electrically connected by a plurality of joint members 54. For example, each of joint members 54 may be implemented by a first terminal pin attached to the marching main memory 31, a second terminal pin attached to the processor 11, and an electrical conductive bump interposed between the first and second terminal pins. For the material of the electrical conductive bumps, solder balls, gold (Au) bumps, silver (Ag) bumps, copper (Cu) bumps, nickel-gold (Ni—Au) alloy bumps or nickel-gold-indium (Ni—Au—In) alloy bumps, etc. are acceptable. The resultant data of the processing in the ALU 112 are sent out to the marching main memory 31 through the joint members 54. Therefore, as represented by bi-directional arrow PHI(Greek-letter)$_{12}$, data are transferred bi-directionally between the marching main memory 31 and the processor 11 through the joint members 54. On the contrary, as represented by uni-directional arrow eta(Greek-letter)$_{11}$, as to the instructions movement, there is only one way of instruction-flow from the marching main memory 31 to the processor 11.

As shown in FIG. 2, the organization of the computer system pertaining to the first embodiment of the present invention further encompasses an external secondary memory 41 such as disk, an input unit 61, an output unit 62 and input/output (I/O) interface circuit 63. Similar to a conventional von Neumann computer, the signals or data are received by the input unit 61, and the signals or data are sent from the output unit 62. For instance, known keyboards and known mice can be considered as the input unit 6, while known monitors and printers can be considered as the output unit 62. Known devices for communication between computers, such as modems and network cards, typically serve for both the input unit 61 and the output unit 62. Note that the designation of a device as either the input unit 61 or the output unit 62 depends on the perspective. The input unit 61 takes as input physical movement that the human user provides and converts it into signals that the computer system pertaining to the first embodiment can understand. For example, the input unit 61 converts incoming data and instructions into a pattern of electrical signals in binary code that are comprehensible to the computer system pertaining to the first embodiment, and the output from the input unit 61 is fed to the marching main memory 31 through the I/O interface circuit 63. The output unit 62 takes as input signals that the marching main memory 31 provides through the I/O interface circuit 63. The output unit 62 then converts these signals into representations that human users can see or read, reversing the process of the input unit 61, translating the digitized signals into a form intelligible to the user. The I/O interface circuit 63 is required whenever the processor 11 drives the input unit 61 and the output unit 62. The processor 11 can communicate with the input unit 61 and the output unit 62 through the I/O interface circuit 63. If in the case of different data formatted being exchanged, the I/O interface circuit 63 converts serial data to parallel form and vice-versa. There is provision for generating interrupts and the corresponding type numbers for further processing by the processor 11 if required.

The secondary memory 41 stores data and information on a more long-term basis than the marching main memory 31. While the marching main memory 31 is concerned mainly with storing programs currently executing and data currently being employed, the secondary memory 41 is generally intended for storing anything that needs to be kept even if the computer is switched off or no programs are currently executing. The examples of the secondary memory 41 are known hard disks (or hard drives) and known external media drives (such as CD-ROM drives). These storage methods are most commonly used to store the computer's operating system, the user's collection of software and any other data the user wishes. While the hard drive is used to store data and software on a semi-permanent basis and the external media drives are used to hold other data, this setup varies wildly depending on the different forms of storage available and the convenience of using each. As represented by bi-directional arrow PHI (Greek-letter)$_1$, data are transferred bi-directionally between the secondary memory 41 and the marching main memory 31 and the processor 11 through existing wire connection 53.

Although the illustration is omitted, in the computer system of the first embodiment shown in FIG. 2, the processor 11 may includes a plurality of arithmetic pipelines configured to receive the stored information through the output terminals from the marching main memory 31, and as represented by bi-directional arrow PHI(Greek-letter)$_{12}$, data are transferred bi-directionally between the marching main memory 31 and the plurality of arithmetic pipelines through the joint members 54.

In the computer system of the first embodiment shown in FIG. 2, there are no buses consisting of the data bus and address bus because the whole computer system has no global wires even in any data exchange between the processor 11 and the marching main memory 31, while the wires or the buses implement the bottleneck in the conventional computer system. There are only short local wires within the marching main memory 31 or connecting portions of the marching main memory 31 with a corresponding ALU 112. As there are no global wires, which generate time delay and stray capacitances between these wires, the computer system of the first embodiment can achieve much higher processing speed and lower power consumption.

(Cell-Level Representation of Marching Main Memory)

In most conventional computers, the unit of address resolution is either a character (e.g. a byte) or a word. If the unit is a word, then a larger amount of memory can be accessed using an address of a given size. On the other hand, if the unit is a byte, then individual characters can be addressed (i.e. selected during the memory operation). Machine instructions are normally fractions or multiples of the architecture's word size. This is a natural choice since instructions and data usually share the same memory subsystem.

Figure 4:
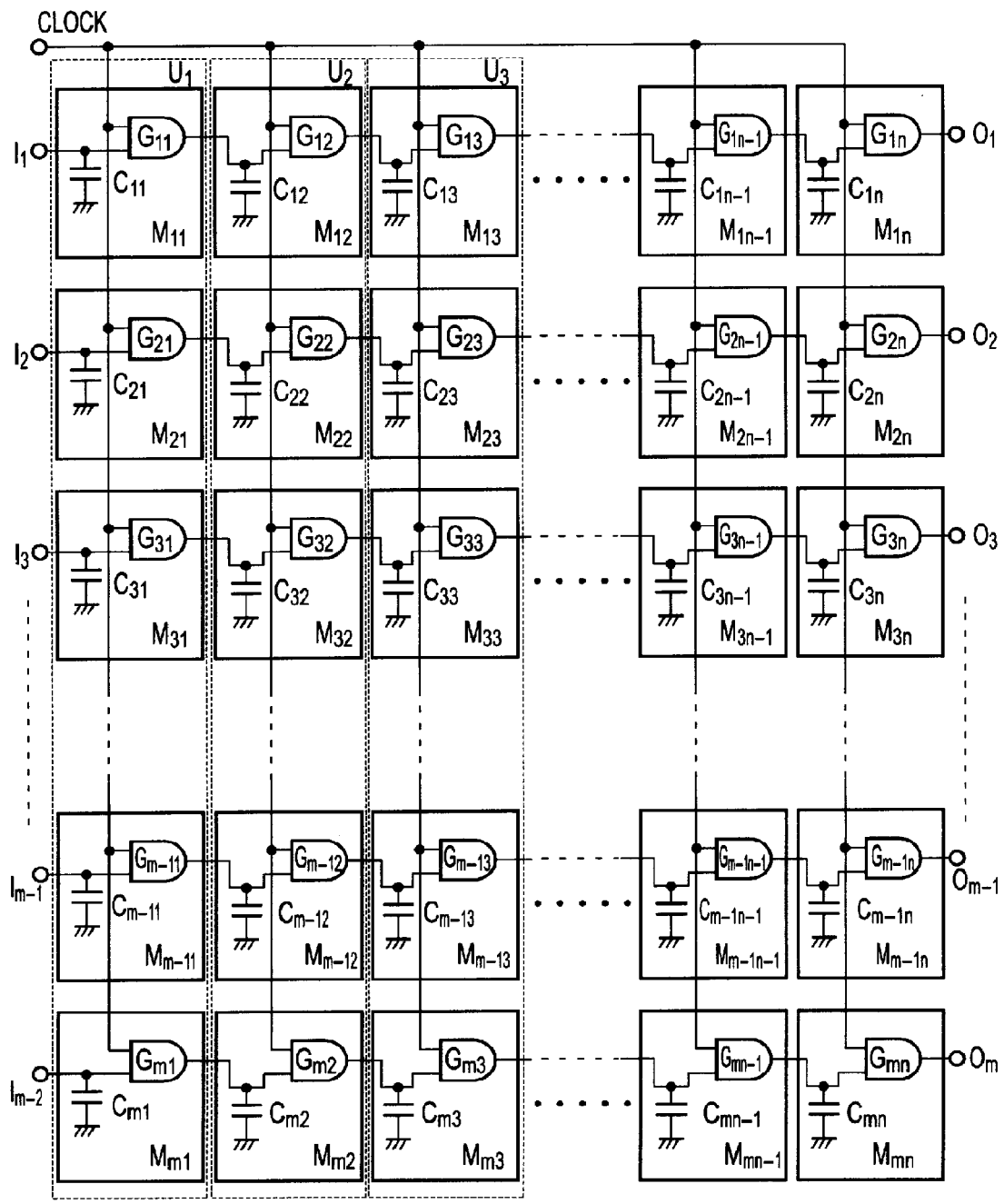
FIG. 4 illustrates a cell-level representation of the marching main memory used in the computer system pertaining to the first embodiment of the present invention.

FIG. 4 corresponds to a cell-level representation of marching main memory 31 shown in FIG. 3. In FIG. 4, the first column of the m*n matrix, which is implemented by a vertical array of cell $M_{11}, M_{21}, M_{31}, \ldots, M_{m-1,1}, M_{m1}$, represents the first memory unit $U_1$ shown in FIG. 3. Here, "m" is an integer determined by word size. Although the choice of a word size is of substantial importance, when computer architecture is designed, word sizes are naturally multiples of eight bits, with 16, 32, and 64 bits being commonly used. Similarly, the second column of the m*n matrix, which is implemented by a vertical array of cell $M_{12}, M_{22}, M_{32}, \ldots, M_{m-1,2}, M_{m2}$, represents the second memory unit $U_2$, the third column of the m*n matrix, which is implemented by a vertical array of cell $M_{13}, M_{23}, M_{33}, \ldots, M_{m-1,3}, M_{m3}$, represents the third memory unit $U_3, \ldots$, the (n−1)-th column of the m*n matrix, which is implemented by a vertical array of cell $M_{1,n-1}, M_{2,n-1}, M_{3,n-1}, \ldots, M_{m-1,n-1}, M_{m,n-1}$, represents the (n−1)-th memory unit and the n-th column of the m*n matrix, which is implemented by a vertical array of cell $M_{1,n}, M_{2,n}, M_{3,n}, \ldots, M_{m-1,n}, M_{m,n}$, represents the n-th memory unit $U_n$.

Figure 5:
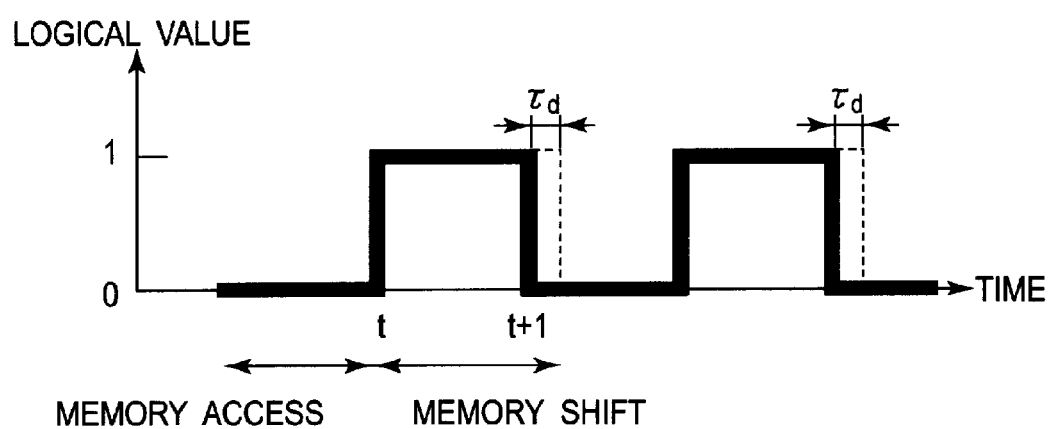
FIG. 5 illustrates an example of the waveform of a clock signal configured to be applied to the marching main memory used in the computer system pertaining to the first embodiment of the present invention.

In a cell-level representation of marching main memory 31 shown in FIG. 4, a first cell $M_{11}$ allocated at the leftmost side on a first row and connected to an input terminal $I_1$ encompasses a capacitor $C_{11}$ configured to store the information, and an AND gate $G_{11}$ having one input connected to the capacitor $C_{11}$, the other input configured to be supplied with the clock signal, and an output connected to one input of the next AND gate $G_{21}$ assigned to the adjacent second cell $M_{21}$ on the first row. An example of the waveform of the clock signal is shown in FIG. 5. When the logical values of "1" of the clock signal is fed to the other input of the AND gate $G_{11}$, the information stored in the capacitor $C_{11}$ is transferred to a capacitor $C_{12}$, assigned to the adjacent second cell $M_{12}$, and the capacitor $C_{12}$ stores the information. Namely, the second cell $M_{12}$ on the first row of the cell-level representation of marching main memory 31 encompasses the capacitor $C_{12}$ and an AND gate $G_{12}$, which has one input connected to the capacitor $C_{12}$, the other input configured to be supplied with the clock signal, and an output connected to one input of the next AND gate $G_{13}$ assigned to the adjacent third cell $M_{13}$ on the first row. Similarly the third cell $M_{13}$ on the first row of the cell-level representation of marching main memory 31 encompasses a capacitor $C_{13}$ configured to store the information, and an AND gate $G_{13}$ having one input connected to the capacitor $C_{13}$, the other input configured to be supplied with the clock signal, and an output connected to one input of the next AND gate assigned to the adjacent fourth cell, although the illustration of the fourth cell is omitted. Therefore, when the logical values of "1" is fed to the other input of the AND gate $G_{12}$, the information stored in the capacitor $C_{12}$ is transferred to the capacitor $C_{13}$, assigned to the third cell $M_{13}$, and the capacitor $C_{13}$ stores the information, and when the logical values of "1" is fed to the other input of the AND gate $G_{13}$, the information stored in the capacitor $C_{13}$ is transferred to the capacitor, assigned to the fourth cell. Furthermore, a (n−1)-th cell $M_{1,n-1}$ on the first row of the cell-level representation of marching main memory 31 encompasses a capacitor $C_{1,n-1}$ configured to store the information, and an AND gate $G_{1,n-1}$ having one input connected to the capacitor $C_{1,n-1}$, the other input configured to be supplied with the clock signal, and an output connected to one input of the next AND gate $G_{1n}$ assigned to the adjacent n-th cell $M_{1n}$, which is allocated at the rightmost side on the first row and connected to an output terminal $O_1$. Therefore, each of the cells $M_{11}$, $M_{12}$, $M_{13}$, ..., $M_{1,n-1}$, $M_{1n}$ stores the information, and transfers the information synchronously with the clock signal, step by step, toward the output terminals $O_1$, so as to provide the processor 11 with the stored information actively and sequentially so that the ALU 112 can execute the arithmetic and logic operations with the stored information.

Similarly, in a cell-level representation of marching main memory 31 shown in FIG. 4, a first cell $M_2$, allocated at the leftmost side on a second row and connected to an input terminal $I_2$ encompasses a capacitor $C_{21}$, and an AND gate $G_{2i}$ having one input connected to the capacitor $C_{21}$, the other input configured to be supplied with the clock signal, and an output connected to one input of the next AND gate $G_{21}$ assigned to the adjacent second cell $M_{21}$ on the second row. The second cell $M_{22}$ on the second row of the cell-level representation of marching main memory 31 encompasses the capacitor $C_{22}$ and an AND gate $G_{22}$, which has one input connected to the capacitor $C_{22}$, the other input configured to be supplied with the clock signal, and an output connected to one input of the next AND gate $G_{23}$ assigned to the adjacent third cell $M_{23}$ on the second row. Similarly the third cell $M_{23}$ on the second row of the cell-level representation of marching main memory 31 encompasses a capacitor $C_{23}$, and an AND gate $G_{23}$ having one input connected to the capacitor $C_{23}$, the other input configured to be supplied with the clock signal, and an output connected to one input of the next AND gate assigned to the adjacent fourth cell. Furthermore, a (n−1)-th cell $M_{2,n-1}$ on the second row of the cell-level representation of marching main memory 31 encompasses a capacitor and an AND gate $G_{2,n-1}$ having one input connected to the capacitor $C_{2,n-1}$, the other input configured to be supplied with the clock signal, and an output connected to one input of the next AND gate $G_{1n}$ assigned to the adjacent n-th cell $M_{1n}$, which is allocated at the rightmost side on the second row and connected to an output terminal $O_1$. Therefore, each of the cells $M_{21}$, $M_{22}$, $M_{23}$, ..., $M_{2,n-1}$, $M_{1n}$ on the second row stores the information, and transfers the information synchronously with the clock signal, step by step, toward the output terminals $O_1$, so as to provide the processor 11 with the stored information actively and sequentially so that the ALU 112 can execute the arithmetic and logic operations with the stored information.

On a third row, a first cell $M_{31}$ allocated at the leftmost side and connected to an input terminal $I_3$, a second cell $M_{32}$ adjacent to the first cell $M_{31}$, a third cell $M_{33}$ adjacent to the second cell $M_{32}$, ..., a (n−1)-th cell $M_{3,n-1}$, and an n-th cell $M_{3n}$, which is allocated at the rightmost side on the third row and connected to an output terminal $O_3$ are aligned. And, each of the cells $M_{31}$, $M_{32}$, $M_{33}$, ..., $M_{3,n-1}$, $M_{3n}$ on the third row stores the information, and transfers the information synchronously with the clock signal, step by step, toward the output terminals $O_3$, so as to provide the processor 11 with the stored information actively and sequentially so that the ALU 112 can execute the arithmetic and logic operations with the stored information.

On a (m−1)-th row, a first cell $M_{(m-1),1}$ allocated at the leftmost side and connected to an input terminal $I_{m-1}$, a second cell $M_{(m-1),2}$ adjacent to the first cell $M_{(m-1),1}$, a third cell $M_{(m-1),3}$ adjacent to the second cell $M_{(m-1),2}$, ..., a (n−1)-th cell $M_{(m-1),n-1}$, and an n-th cell $M_{(m-1),n}$, which is allocated at the rightmost side on the (m−1)-th row and connected to an output terminal $O_{m-1}$, are aligned. And, each of the cells $M_{(m-1),1}$, $M_{(m-1),2}$, $M_{(m-1),3}$, ..., $M_{(m-1),n-1}$, $M_{(m-1)n}$ on the (m−1)-th row stores the information, and transfers the information synchronously with the clock signal, step by step, toward the output terminals $O_{m-1}$, so as to provide the processor 11 with the stored information actively and sequentially so that the ALU 112 can execute the arithmetic and logic operations with the stored information.

On a m-th row, a first cell $M_{m1}$ allocated at the leftmost side and connected to an input terminal $I_{m-1}$, a second cell $M_{m2}$ adjacent to the first cell $M_{m1}$, a third cell $M_{m3}$ adjacent to the second cell $M_{m2}$, ..., a (n−1)-th cell $M_{m(n-1)}$, and an n-th cell $M_{mn}$, which is allocated at the rightmost side on the m-th row and connected to an output terminal $O_m$, are aligned. And, each of the cells $M_{m1}$, $M_{m2}$, $M_{m3}$, ..., $M_{m(n-1)}$, $M_{mn}$ on the m-th row stores the information, and transfers the information synchronously with the clock signal, step by step, toward the output terminals $O_m$, so as to provide the processor 11 with the stored information actively and sequentially so that the ALU 112 can execute the arithmetic and logic operations with the stored information.

Figure 6:
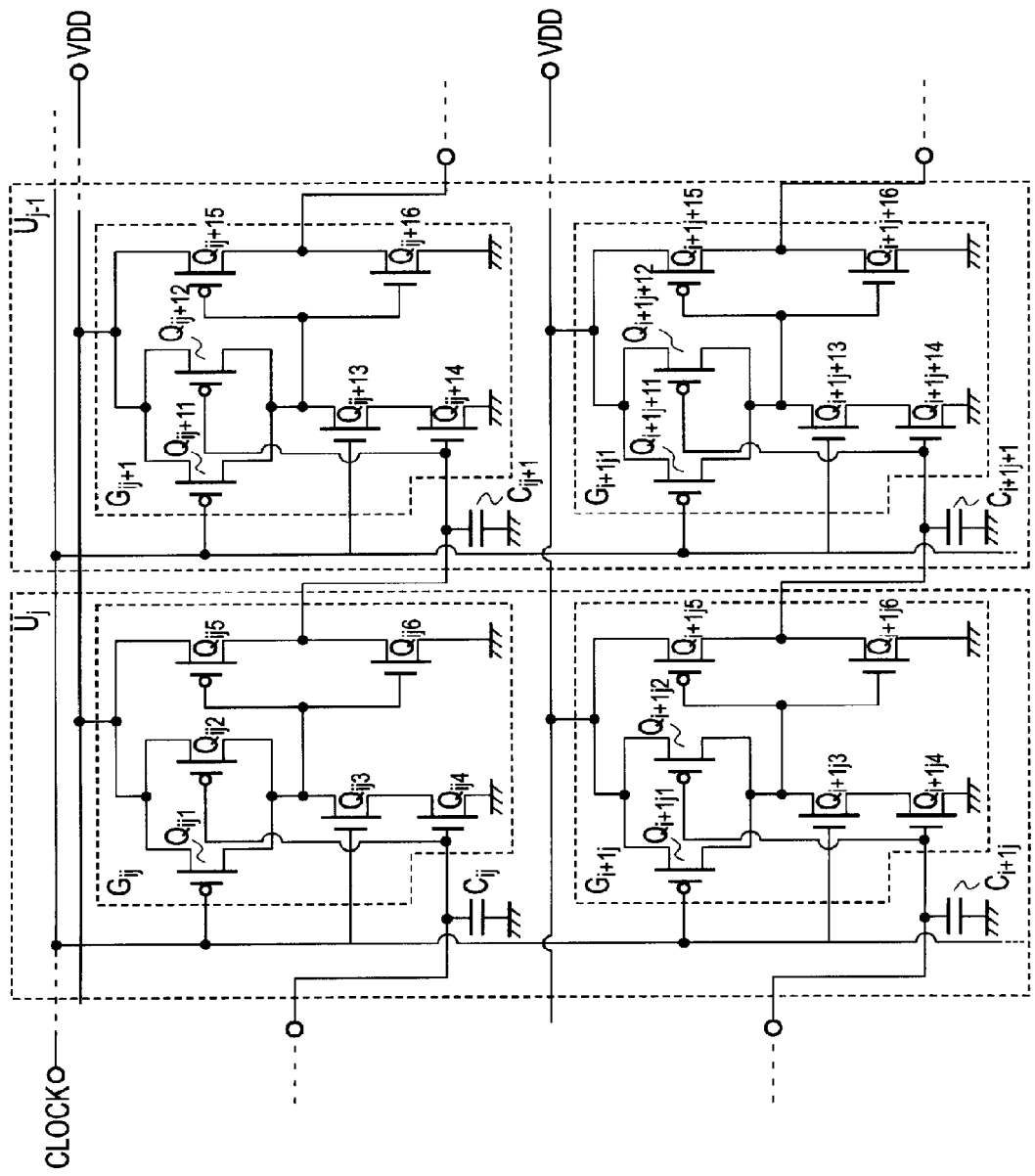
FIG. 6 illustrates an example of a circuit configuration of an AND gate in each of cells in the cell-level representation of the marching main memory used in the computer system pertaining to the first embodiment of the present invention.

Although there are various circuit configurations to implement the AND gate of the present invention, one of the examples of the circuit configurations of the AND gate $G_{ij}$, $G_{i,j+1}$, $G_{i+1,j}$, $G_{i+1,j+1}$, which can be used for the j-th cell $M_1$ on the i-th row, the (j+1)-th cell $M_{ij+1}$ on the i-th row, the j-th cell $M_{i+1,j+1}$ on the (i+1)-th row, the (j+1)-th cell $M_{i+1,j+1}$ on the (i+1)-th row in the cell-level representation of marching main memory 31 of the first embodiment, are illustrated in FIG. 6.

The j-th cell $M_{ij}$ on the i-th row encompasses an j-th capacitor $C_{ij}$ configured to store the information, and the j-th AND gate having one input connected to the j-th capacitor $C_{ij}$, the other input configured to be supplied with the clock signal, and an output connected to one input of the next (j+1)-th AND gate $G_{i,j+1}$ assigned to the adjacent (j+1)-th cell on the i-th row. The j-th AND gate $G_{i,j}$, includes a first pMOS transistor $Q_{ij1}$ having a source electrode connected to a power supply line VDD and a gate electrode connected to a clock signal supply line; a second pMOS transistor $Q_{ij2}$ connected in parallel with the first pMOS transistor $Q_{ij1}$, having a source electrode connected to the power supply line VDD and a gate electrode connected to both to one of the electrode of j-th capacitor $C_{ij}$ and an output of the preceding (j−1)-th AND gate $G_{i,j-1}$, a drain electrode connected to a drain electrode of the first pMOS transistor $Q_{ij1}$; a first nMOS transistor $Q_{ij3}$ having a source electrode connected to a common node jointing the drain electrodes of the first and second pMOS transistor $Q_{ij1}$, $Q_{ij2}$, and a gate electrode connected to a clock signal supply line; a second nMOS transistor $Q_{ij4}$ connected in series with the first nMOS transistor $Q_{ij3}$, having a source electrode connected to a drain electrode of the first nMOS transistor $Q_{ij3}$, a gate electrode connected to the gate electrode of the second pMOS transistor $Q_{ij2}$, one of the electrode of j-th capacitor $C_{ij}$ and the output of the preceding (j−1)-th AND gate $G_{i,j-1}$, a drain electrode connected to a ground potential; a third pMOS transistor $Q_{ij5}$ having a source electrode connected to the power supply line VDD and a gate electrode connected to the common node jointing the drain electrodes of the first and second pMOS transistor $Q_{ij1}$, $Q_{ij2}$; and a third nMOS transistor $Q_{ij6}$ connected in series with the third pMOS transistor $Q_{ij5}$, having a source electrode connected to a drain electrode of the third nMOS transistor $Q_{ij5}$, a gate electrode connected to the gate electrode of the third pMOS transistor $Q_{ij5}$ and the common node jointing the drain electrodes of the first and second pMOS transistor $Q_{ij1}$, $Q_{ij2}$, and a drain electrode connected to the ground potential. Here, the first pMOS transistor $Q_{ij1}$, the second pMOS transistor $Q_{ij2}$, the first nMOS transistor $Q_{ij3}$, and the second nMOS transistor $Q_{ij4}$ implement a NAND gate having one input connected to the j-th capacitor $C_{ij}$, the other input connected to the clock signal supply line. And the third pMOS transistor Q, and the third nMOS transistor $Q_{ij6}$ implement an inverter having an input connected to the output of the NAND gate of the j-th cell $M_{ij}$, and an output connected to one input of the next (j+1)-th AND gate $G_{i,j+1}$ assigned to the adjacent (j+1)-th cell $M_{i,j+1}$.

As shown in FIG. 6, the other circuit configurations of the AND gate $Gi,j_{+1}$, $Q_{i+1,j}$, $G_{i+1,j+1}$ are also implemented by six MOS transistors, respectively. Because the circuit configurations of the AND gate $Gi,j_{+1}$, $G_{i+1,j}$, $G_{i+1,j+1}$ are substantially similar to the configuration of AND gate $G_{ij}$, detailed descriptions of the circuit configurations of the AND gate $G_{i,j+1}$, $G_{i+1,j}$, $G_{i+1,j+1}$ are omitted so as to avoid overlapping or redundant description, although the AND gate $G_{ij}$, $G_{i,j+1}$, $G_{i+1,j}$, $G_{i+1,j+1}$ can be implemented by other circuit configurations such as resistor-transistor logics, or by various semiconductor elements, magnetic elements, superconductor elements, or single quantum elements, etc which has a function of AND logic.

As shown in FIG. 6, the cell-level representation of the marching main memory 31 is as simple as the cell-level configuration of DRAM, where each of memory cell consists of one capacitance and one AND gate. Each of the AND gate $G_{ij}$, $G_{i,j+1}$, $G_{i+1,j}$, $G_{i+1,j+1}$ shifts signals from left to right based on clocks as shown in FIG. 3. Especially, the time delay tau(Greek letter)$_d$ in each of AND gate $G_{ij}$, $G_{i,j+1}$, $G_{i+1,j}$, $G_{i+1,j+1}$ is significant to correctly perform the shift action in every memory unit in the marching main memory 31 successively.

(Reverse-Directional Marching Main Memory)

Figure 7:
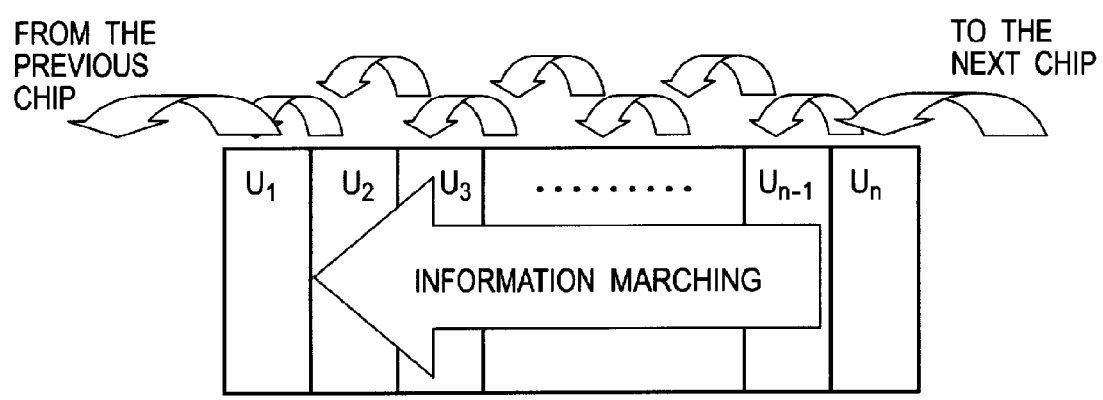
FIG. 7 illustrates an array of memory units implementing a reverse directional marching main memory used in the computer system pertaining to the first embodiment of the present invention, and a reverse directional transfer of information in the reverse directional marching main memory.

Although FIGS. 3-6 illustrate the marching main memory which stores the information in each of memory units $U_1$, $U_2$, $U_3$, ..., $U_{n-1}$, $U_n$ and transfers the information synchronously with the clock signal, step by step, from input terminal toward the output terminal, FIG. 7 illustrates another marching main memory.

In FIG. 7, each of the memory units $U_1$, $U_2$, $U_3$, ..., $U_{n-1}$, $U_n$ stores the information including word size of data or instructions, and transfers in the reverse direction the information synchronously with the clock signal, step by step, toward the output terminals, provided from the processor 11 with the resultant data executed in the ALU 112.

Figure 8A:
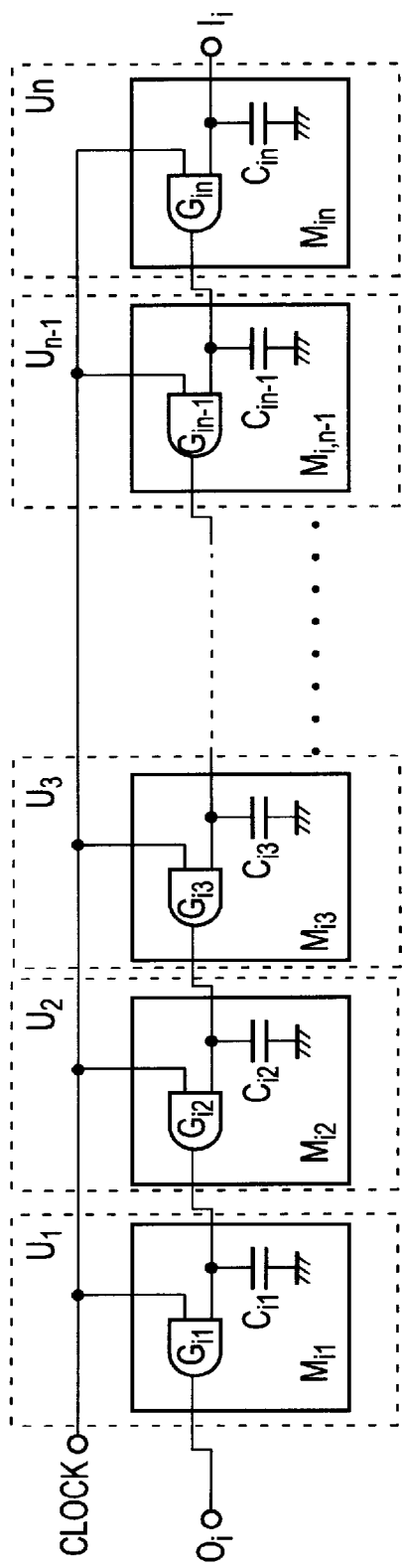
FIG. 8($a$) illustrates an example of a circuit configuration of an AND gate in each of cells on an array implementing i-th row in the cell-level representation of the reverse directional marching main memory shown in FIG. 7, and FIG. 8($b$) illustrates an example of the waveform of a clock signal configured to be applied to the reverse directional marching main memory shown in FIG. 7.

FIG. 8(a) illustrates an array of i-th row of the m*n matrix (here, "m" is an integer determined by word size) in a cell-level representation of the another marching main memory shown in FIG. 7, which stores the information of bit level in each of cells $M_{i1}$, $M_{i2}$, $M_{i3}$, ..., $M_{i,n-1}$, $M_{i,n}$ and transfers the information synchronously with the clock signal, step by step in the reverse direction to the marching main memory shown in FIGS. 3-6, namely from the output terminal OUT toward the input terminal IN.

Figure 8B:
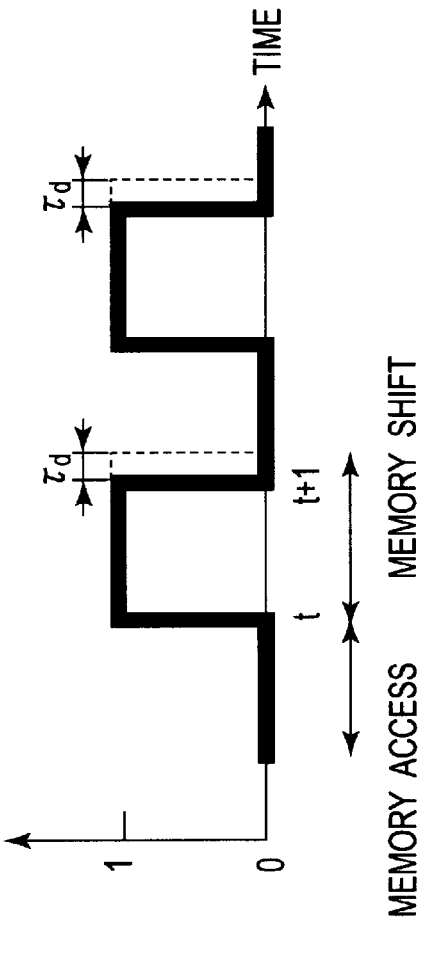

As shown in FIG. 8(a), in a reverse-directional marching main memory, an n-th cell $M_{i,n}$ allocated at the rightmost side on the i-th row and connected to an input terminal IN encompasses a capacitor $C_{in}$ configured to store the information, and an AND gate $G_{in}$ having one input connected to the capacitor $C_{in}$, the other input configured to be supplied with the clock signal, and an output connected to one input of the preceding AND gate $G_{in-1}$ assigned to the adjacent (n−1)-th cell $M_{i,n-1}$, on the i-th row. As shown in FIG. 8(b), the clock signal has logical values of "1" and "0", and the logical values of "1" is kept from time "t" to time "t+1". When the logical values of "1" is fed to the other input of the AND gate $G_n$, the information stored in the capacitor $C_{in}$ is transferred to a capacitor $C_{i,n-1}$, assigned to the adjacent (n−1)-th cell $M_{i,n-1}$ on the i-th row, and the capacitor $C_{i,n-1}$ stores the information. Namely, the (n−1)-th cell $M_{i,n-1}$ on the i-th row of the reverse-directional marching main memory encompasses the capacitor $C_{i,n-1}$ and an AND gate $G_{i,n-1}$, which has one input connected to the capacitor $C_{i,n-1}$, the other input configured to be supplied with the clock signal, and an output connected to one input of the preceding AND gate $G_{i,n-2}$ assigned to the adjacent third cell $M_{i,n-2}$ (illustration is omitted).

Similarly the third cell $M_{i3}$ on the i-th row of the reverse-directional marching main memory encompasses a capacitor $C_{i3}$ configured to store the information, and an AND gate $G_{i3}$ having one input connected to the capacitor $C_{i3}$, the other input configured to be supplied with the clock signal, and an output connected to one input of the preceding AND gate $G_{i2}$ assigned to the adjacent second cell $M_{i2}$. Therefore, when the logical values of "1" is fed to the other input of the AND gate $G_{i3}$, the information stored in the capacitor $C_{i3}$ is transferred to the capacitor $C_{i2}$, assigned to the second cell $M_{i2}$, and the capacitor $C_{i2}$ stores the information.

Furthermore, the second cell $M_{i2}$ on the i-th row of the reverse-directional marching main memory encompasses the capacitor $C_{i2}$ configured to store the information, and the AND gate $G_{i2}$ having one input connected to the capacitor $C_{i2}$, the other input configured to be supplied with the clock signal, and an output connected to one input of the preceding AND gate $G_{i1}$ assigned to the adjacent first cell $M_{i1}$, which is allocated at the leftmost side on the i-th row and connected to an output terminal OUT.

According to the reverse-directional one-dimensional marching main memory 31 of the first embodiment shown in FIGS. 7, 8(a) and 8(b), the memory units $U_1$, $U_2$, $U_3$, ..., $U_{n-1}$, $U_n$ are not required of the refreshment, because all of the memory units $U_1$, $U_2$, $U_3$, ..., $U_{n-1}$, $U_n$ are usually refreshed automatically due to the information-moving scheme (information-marching scheme). And then addressing to each of memory units $U_1$, $U_2$, $U_3$, ..., $U_{n-1}$, $U_n$ disappears and required information is heading for its destination unit connected to the edge of the memory. The mechanism of accessing the reverse-directional one-dimensional marching main memory 31 of the first embodiment is truly alternative to existing memory schemes that are starting from the addressing mode to read/write information. Therefore, according to the reverse-directional one-dimensional marching main memory 31 of the first embodiment, the memory-accessing without addressing mode is quite simpler than existing memory schemes.

Figure 9:
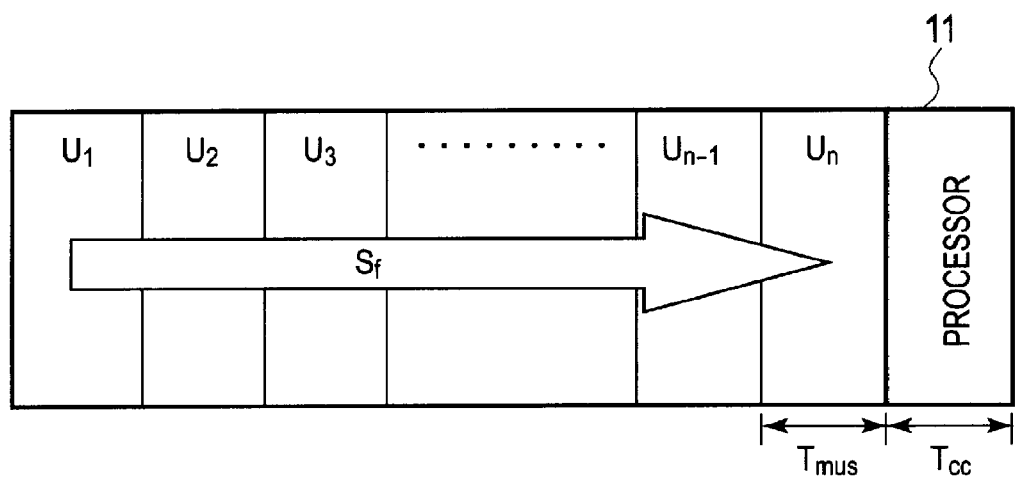
FIG. 9 illustrates a time-domain relationship between the memory unit streaming time in a marching main memory and the clock cycle in a processor (CPU) in the computer system pertaining to the first embodiment of the present invention.

The concept of marching main memory 31 used in the computer system pertaining to the first embodiment of the present invention is shown in FIG. 9, this is different from existing computer memory, because the marching main memory 31 is purposely designed with functionality of storage and conveyance of information/data through all of memory units $U_1, U_2, U_3, \ldots, U_{n-1}, U_n$ in the marching main memory 31. Marching memory supplies information/data to the processor (CPU) 11 at the same speed of the processor 11. As shown in the time-domain relationship of FIG. 9, the memory unit streaming time $T_{mus}$ required for transferring information/data through one memory units $U_1, U_2, U_3, \ldots, U_{n-1}, U_n$, in the marching main memory 31 is equal to the clock cycle T, in the processor 11. The marching main memory 31 stores information/data in each of the memory units $U_1, U_2, U_3, \ldots, U_{n-1}, U_n$, and transfers synchronously with the clock signal, step by step, toward the output terminals, so as to provide the processor 11 with the stored information/data so that the arithmetic logic unit 112 can execute the arithmetic and logic operations with the stored information/data.

Figure 10:
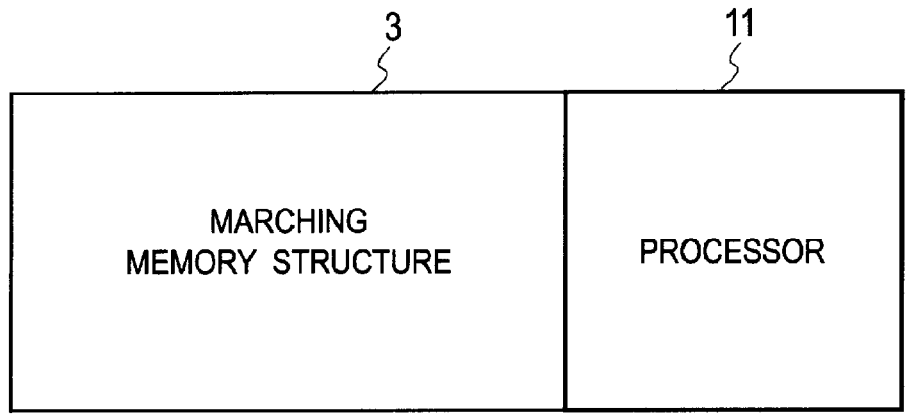
FIG. 10 illustrates schematically an organization of the computer system pertaining to the first embodiment of the present invention, in which the memory bottleneck is disappeared between the processor (CPU) and the marching memory structure including the marching main memory, in the computer system pertaining to the first embodiment of the present invention.

Therefore, as shown in FIG. 10, marching memory structure 3 includes the marching main memory 31 of the first embodiment of the present invention. The term of "the marching memory structure 3" means a generic concept of the memory structure including a marching-instruction register file (RF) 22a and a marching-data register file (RF) 22b connected to the ALU 112, which will be explained further in the following second embodiment, and a marching-instruction cache memory 21a and a marching-data cache memory 21b, which will be explained further in the following third embodiment, in addition to the marching main memory 31 used in the computer system pertaining to the first embodiment of the present invention.

FIG. 11(a) illustrates a forward data-stream $S_f$ flowing from the marching memory structure 3 to the processor 11 and backward data-stream (reverse data-stream) $S_b$ flowing from the processor 11 to the marching memory structure 3, and FIG. 11(a) illustrates bandwidths established between the marching memory structure 3 and the processor 11 assuming that the memory unit streaming time $T_{mus}$ in the marching memory structure 3 is equal to the clock cycle $T_{cc}$ of the processor 11.

(Bi-Directional Marching Main Memory)

Figure 12A:
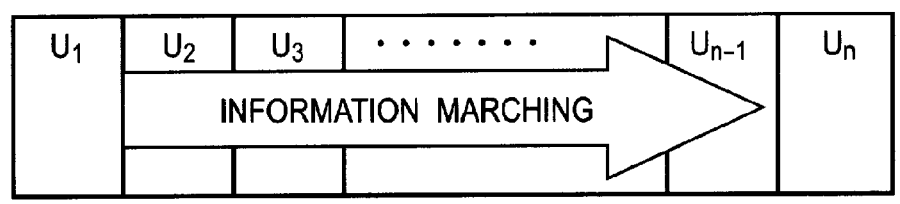
FIG. 12 ($a$) illustrates a concrete image of a marching behavior of information (a forward marching behavior), in which information marches (shifts) toward right-hand direction in a one-dimensional marching main memory, FIG. 12 ($b$) illustrates a staying state of the one-dimensional marching main memory, and FIG. 12 ($c$) illustrates a concrete image of a reverse-marching behavior of information (a backward marching behavior), in which information marches (shifts) toward left-hand direction in the one-dimensional marching main memory in the computer system pertaining to the first embodiment of the present invention.
Figure 12B:
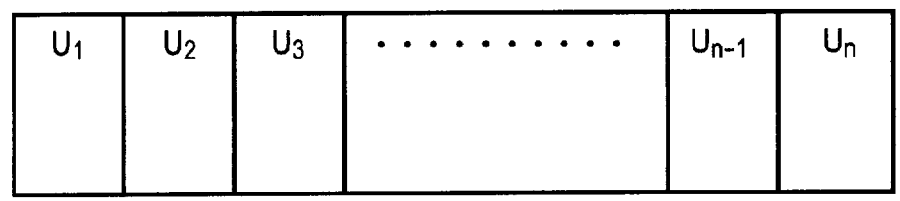
Figure 12C:
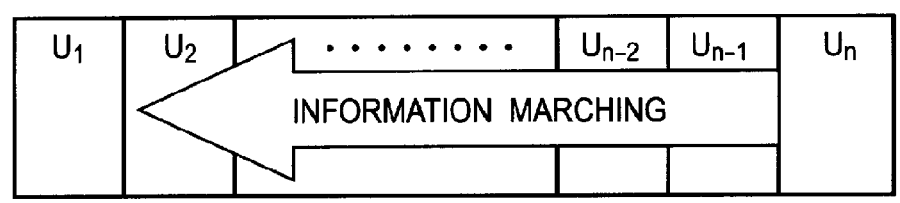

As shown in FIGS. 12 (a)-(c), the marching main memory 31 of the first embodiment of the present invention, can achieve bi-directional transferring of information/data. That is, FIG. 12 (a) illustrates a forward marching behavior of information/data, in which information/data marches (shifts) toward right-hand direction (forward direction) in a one-dimensional marching main memory 31, FIG. 12 (b) illustrates a staying state of the one-dimensional marching main memory 31, and FIG. 12 (c) illustrates a reverse-marching behavior of information/data (a backward marching behavior), in which information/data marches (shifts) toward left-hand direction (reverse direction) in the one-dimensional marching main memory 31.

Figure 13:
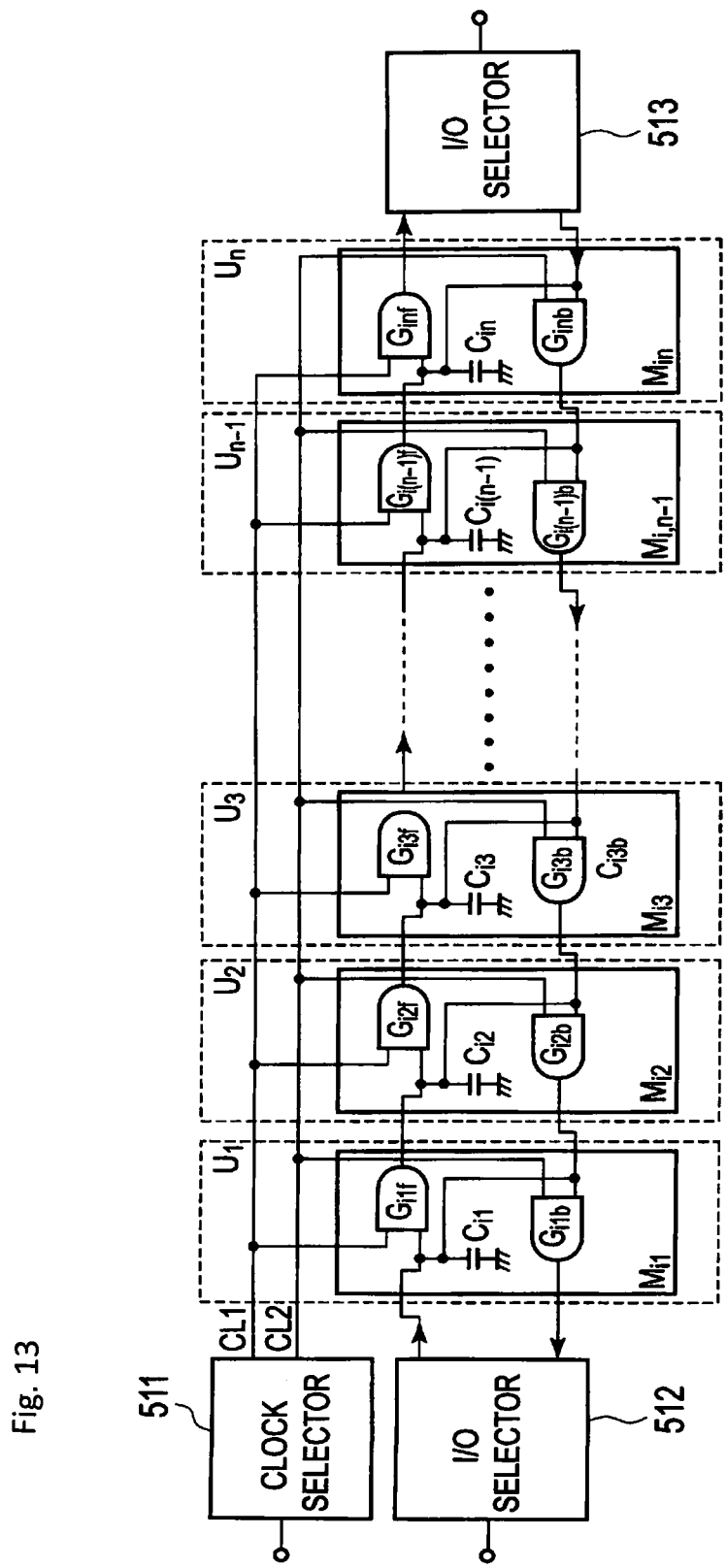
FIG. 13 illustrates an example of a circuit configuration of the one-dimensional marching main memory, which can achieve the bi-directional transferring behavior shown in FIGS. 12 ($a$)-($c$), configured to store and transfer bi-directionally instructions or scalar data in the computer system pertaining to the first embodiment of the present invention.

FIG. 13 illustrates an array of i-th row of the m*n matrix (here, "m" is an integer determined by word size) in a cell-level representation of the bi-directional marching main memory 31, which can achieve the bi-directional behavior shown in FIGS. 12 (a)-(c).

As shown in FIG. 13, two kinds of AND gates are assigned to each of the cells $M_{i1}, M_{i2}, M_{i3}, \ldots, M_{i,(n-1)}, M_{i,n}$ on the i-th row so as to establish a bi-directional transfer of information/data. The bi-directional marching main memory 31 stores the information/data of bit level in each of cells $M_{i1}, M_{i2}, M_{i3}, \ldots, M_{i,n-1}, M_{i,n}$ and transfers bi-directionally the information/data synchronously with the clock signal, step by step in the forward direction and/or reverse direction (backward direction) between a first I/O selector 512 and a second I/O selector 513.

In a cell-level representation of marching main memory 31 shown in FIG. 13, a first cell $M_{i1}$ allocated at the leftmost side on i-th row and connected to first I/O selector 512 encompasses a capacitor $C_{i1}$ configured to store the information/data, and a forward AND gate $G_{i1f}$ having one input connected to the capacitor $C_{i1}$, the other input supplied with the first clock signal CL1, and an output connected to one input of the next forward AND gate $G_{(i+1)1f}$ assigned to the adjacent second cell $M_{(i+1)1}$ on the i-th row, and a backward AND gate $G_{i1b}$ having one input connected to the capacitor $C_{i1}$, the other input supplied with the second clock signal CL2, and an output connected to the first I/O selector 512.

The first clock signal CL1, configured to drive the forward data-stream, and the second clock signal CL2, configured to drive the backward data-stream, are respectively selected by a clock selector 511, and each of the first clock signal CL1 and the second clock signal CL2 has logical values of "1" and "0", and the logical values of "1" is kept from time "t" to time "t+1". When the logical values of "1" of the first clock signal CL1 is fed to the other input of the forward AND gate $G_{n-1}$, the information/data stored in the capacitor $C_{i1}$ is transferred to a capacitor $C_{i2}$, assigned to the adjacent second cell $M_{i2}$, and the capacitor $C_{i2}$ stores the information/data.

The second cell $M_{i2}$ on the i-th row of the bi-directional marching main memory 31 encompasses the capacitor $C_{i1}$ configured to store the information/data, a forward AND gate $G_{i2f}$, which has one input connected to the capacitor $C_{i2}$, the other input supplied with the first clock signal CL1, and an output connected to one input of the next forward AND gate $G_{i3}$ assigned to the adjacent third cell $M_{i3}$ on the i-th row, and the backward AND gate $G_{i2b}$ having one input connected to the capacitor $C_{i2}$, the other input supplied with the second clock signal CL2, and an output connected to one input of the preceding backward AND gate $G_{i1}$.

Similarly the third cell $M_{i3}$ on the i-th row encompasses a capacitor $C_{i3}$ configured to store the information/data, a forward AND gate $G_{i3f}$ having one input connected to the capacitor $C_{i3}$, the other input supplied with the first clock signal CL1, and an output connected to one input of the next forward AND gate assigned to the adjacent fourth cell, although the illustration of the fourth cell is omitted, and an backward AND gate $G_{i3b}$ having one input connected to the capacitor $C_{i3}$, the other input supplied with the second clock signal CL2, and an output connected to one input of the preceding backward AND gate $G_{i2b}$ assigned to the adjacent second cell $M_{i2}$. Therefore, when the logical values of "1" of the first clock signal CL1 is fed to the other input of the forward AND gate $G_{i2f}$, the information/data stored in the capacitor $C_{i2}$ is transferred to the capacitor $C_{i3}$, assigned to the third cell $M_{i3}$, and the capacitor $C_{i3}$ stores the information/data, and when the logical values of "1" of the first clock signal CL1 is fed to the other input of the forward AND gate $G_{i3f}$, the information/data stored in the capacitor $C_{i3}$ is transferred to the capacitor, assigned to the fourth cell.

Furthermore, an (n-1)-th cell $M_{i,(n-1)}$ on the i-th row encompasses a capacitor $C_{i,(n-1)}$, configured to store the information/data, and a forward AND gate $G_{i,(n-1)f}$ having one input connected to the capacitor $C_{i,(n-1)}$, the other input supplied with the first clock signal CL1, and an output connected to one input of the next forward AND gate $G_{i,nf}$ assigned to the adjacent n-th cell $M_{i,n}$, which is allocated at the rightmost side on the i-th row and connected to the second I/O selector 513, and an backward AND gate $G_{i,(n-1)b}$, which has one input connected to the capacitor $C_{i,(n-1)}$, the other input supplied with the second clock signal CL2, and an output connected to one input of the preceding backward AND gate $G_{i,(n-2)b}$ assigned to the adjacent third cell $M_{i,(n-2)b}$ (illustration is omitted).

Finally, an n-th cell $M_{i,n}$ allocated at the rightmost side on the i-th row and connected to the second I/O selector 513 encompasses a capacitor $C_{i,n}$ configured to store the information/data, a backward AND gate $G_{inb}$ having one input connected to the capacitor the other input configured to be supplied with the second clock signal CL2, and an output connected to one input of the preceding backward AND gate $G_{i,(n-1)b}$ assigned to the adjacent (n-1)-th cell $M_{i,n-1}$ on the i-th row, and a forward AND gate $G_{i,nf}$ having one input connected to the capacitor $C_{i,n}$, the other input configured to be supplied with the first clock signal CL1, and an output connected to the second I/O selector 513.

When the logical values of "1" of the second clock signal CL2 is fed to the other input of the backward AND gate $G_{inb}$, the information/data stored in the capacitor $C_{in}$ is transferred to a capacitor $C_{i,(n-1)}$, assigned to the adjacent (n-1)-th cell $M_{i,(n-1)}$ on the i-th row, and the capacitor $C_{i,(n-1)}$ stores the information/data. Then, when the logical values of "1" of the second clock signal CL2 is fed to the other input of the backward AND gate $G_{i3b}$, the information/data stored in the capacitor $C_{i3}$ is transferred to the capacitor $C_{i2}$, assigned to the second cell $M_{i1}$, and the capacitor $C_{i2}$ stores the information/data. Furthermore, when the logical values of "1" of the second clock signal CL2 is fed to the other input of the backward AND gate $G_{i2b}$, the information/data stored in the capacitor $C_{i2}$ is transferred to the capacitor $C_{i1}$, assigned to the second cell $M_{i1}$, and the capacitor $C_{i1}$ stores the information/data, and when the logical values of "1" of the second clock signal CL2 is fed to the other input of the backward AND gate $G_{i1b}$, the information/data stored in the capacitor $C_{i1}$ is transferred to the first I/O selector 512.

Therefore, each of the cells $M_{i1}$, $M_{i2}$, $M_{i3}$, . . . , $M_{i,(n-1)}$, $M_{i,n}$ on the i-th row of the bi-directional marching main memory stores the information/data, and transfers bi-directionally the information/data, synchronously with the first clock signal CL1 and the second clock signal CL2, step by step, between the first I/O selector 512 and the second I/O selector 513, so as to provide the processor 11 with the stored information/data actively and sequentially so that the ALU 112 can execute the arithmetic and logic operations with the stored information/data.

(Position Pointing Strategy)

Figure 14A:
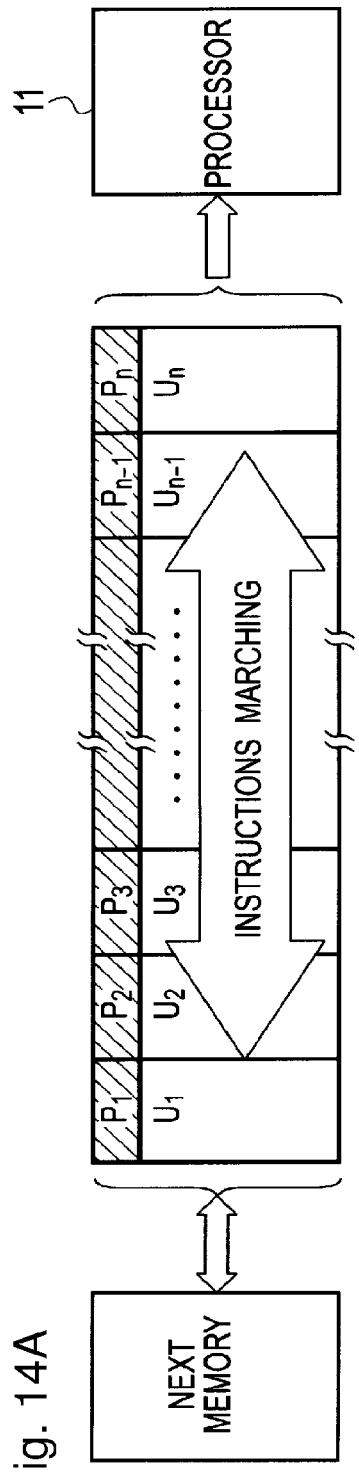
FIG. 14($a$) illustrates a bi-directional transferring mode of instructions in a one-dimensional marching main memory adjacent to a processor, the instructions moves toward the processor, and moves from/to the next memory arranged at left-hand side, FIG. 14($b$) illustrates a bi-directional transferring mode of scalar data in a one-dimensional marching main memory adjacent to an ALU, the scalar data moves toward the ALU and moves from/to the next memory, and FIG. 14($c$) illustrates a uni-directional transferring mode of vector/streaming data in a one-dimensional marching main memory adjacent to a pipeline, the vector/streaming data moves toward the pipeline, and moves from the next memory.
Figure 14B:
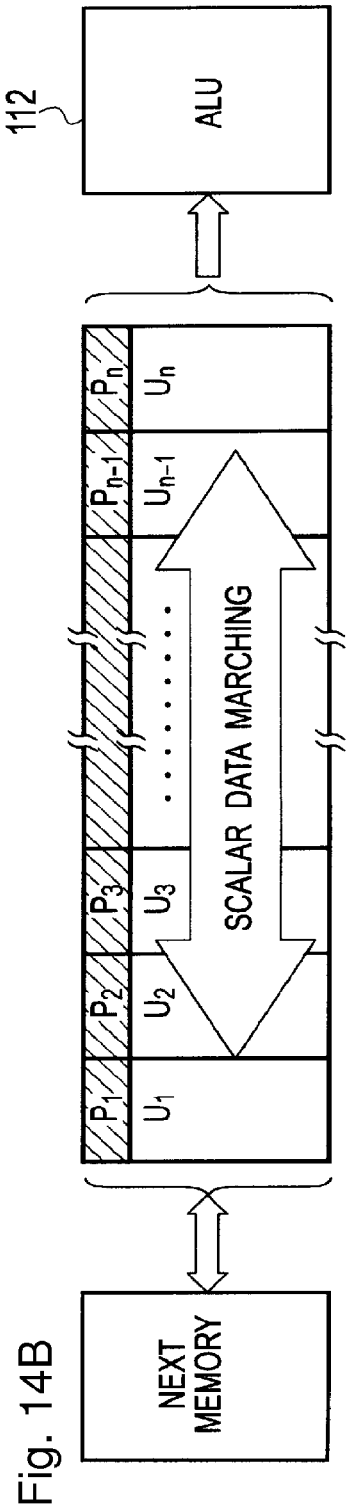
Figure 14C:
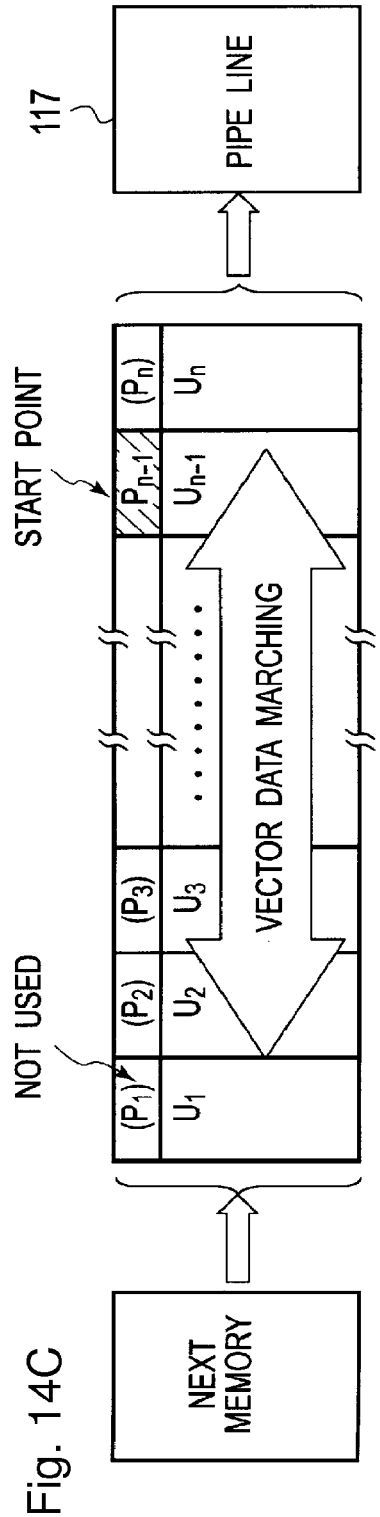

FIG. 14(a) illustrates a bi-directional transferring mode of instructions in a one-dimensional marching main memory adjacent to a processor, where the instructions moves toward the processor, and moves from/to the next memory. FIG. 14(b) illustrates a bi-directional transferring mode of scalar data in a one-dimensional marching main memory adjacent to an ALU 112, the scalar data moves toward the ALU and moves from/to the next memory. FIG. 14(c) illustrates a unidirectional transferring mode of vector/streaming data in a one-dimensional marching main memory adjacent to a pipeline 117, which will be explained in the following third embodiment, the vector/streaming data moves toward the pipeline 117, and moves from the next memory.

Figures 15A, 15B:
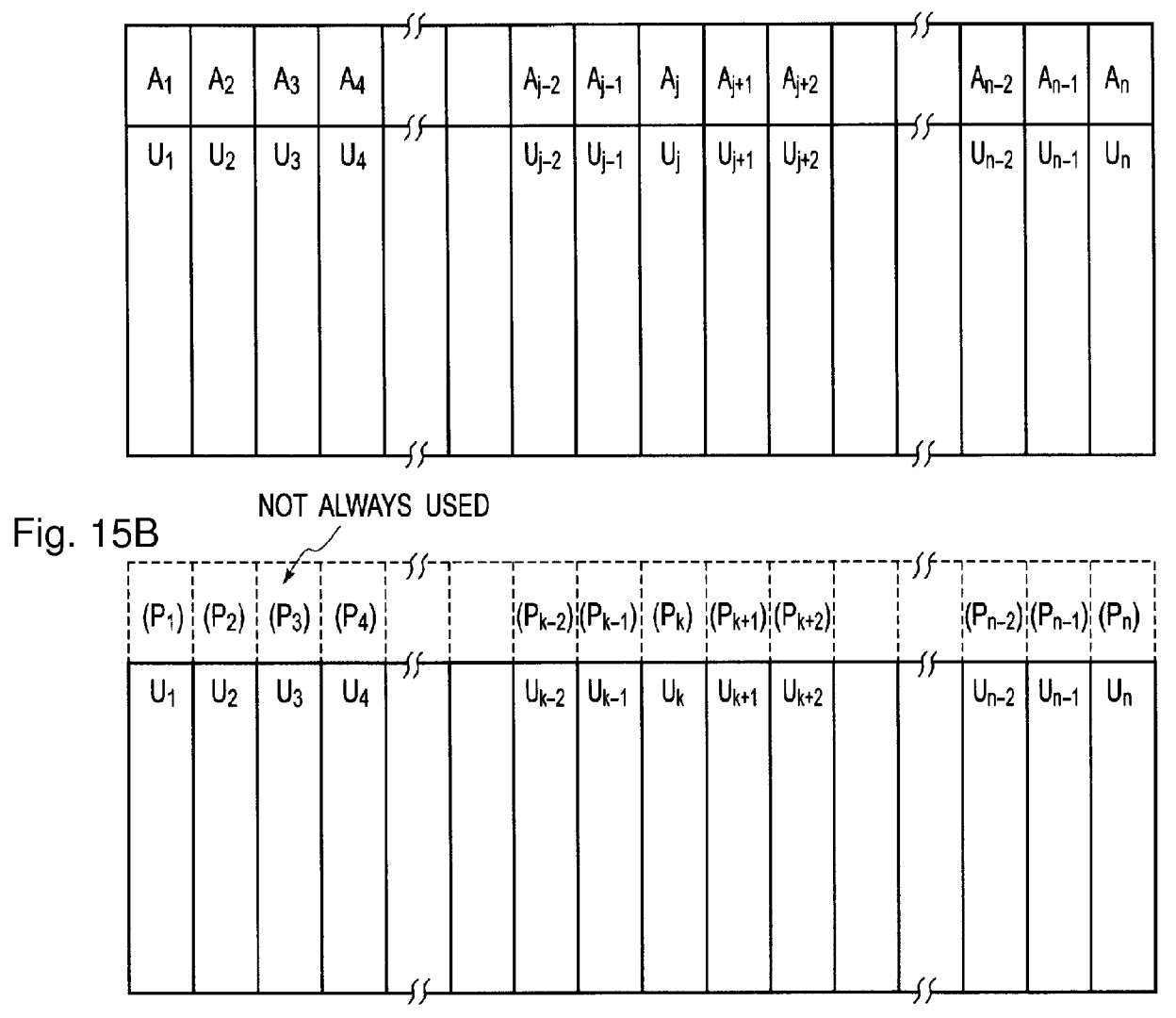

The marching main memory 31 used in the computer system pertaining to the first embodiment uses positioning to identify the starting point and ending point of a set of successive memory units $U_1$, $U_2$, $U_3$, . . . , $U_{n-1}$, $U_n$ in vector/streaming data. On the other hand, for programs and scalar data, each item must have a position index similar to conventional address. FIG. 15(a) illustrates a configuration of conventional main memory, in which every memory units $U_1$, $U_2$, $U_3$, . . . , $U_{n-1}$, $U_n$ in are labeled by addresses $A_1$, $A_2$, $A_3$, . . . , $A_{n-1}$, $A_n$, FIG. 15(b) illustrates a configuration of one-dimensional marching main memory, in which the positioning of individual memory unit $U_1$, $U_2$, $U_3$, . . . , $U_{n-1}$, $U_n$ is not always necessary, but the positioning of individual memory unit $U_1$, $U_2$, $U_3$, . . . , $U_{n-1}$, $U_n$ is at least necessary to identify the starting point and ending point of a set of successive memory units in vector/streaming data.

Figure 16A:
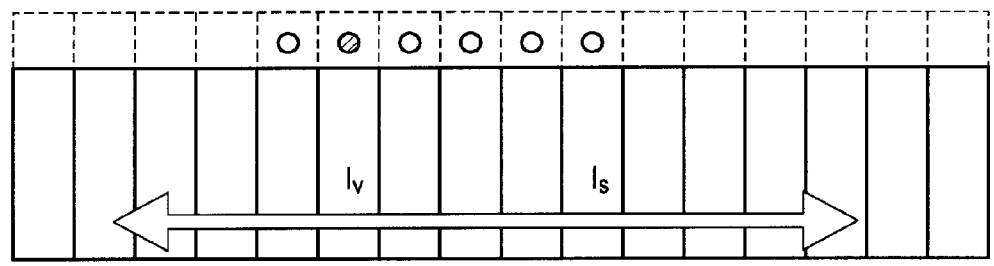
FIG. 16($a$) illustrates an inner configuration of present one-dimensional marching main memory, in which the positioning of individual memory unit is at least necessary to identify the starting point and ending point of a set of successive memory units in vector instruction, FIG. 16($b$) illustrates an inner configuration of present one-dimensional marching main memory for scalar data.
Figure 16B:
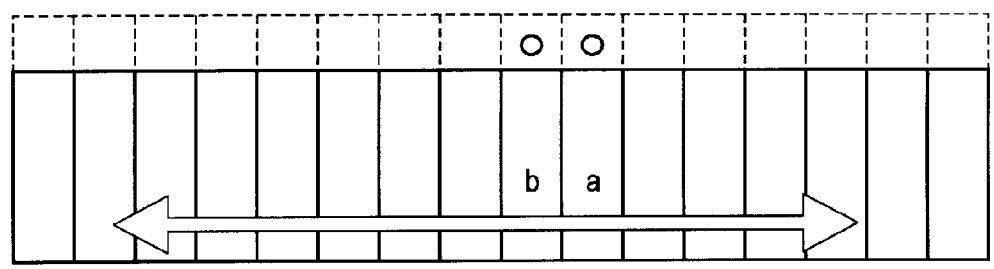
Figure 16C:
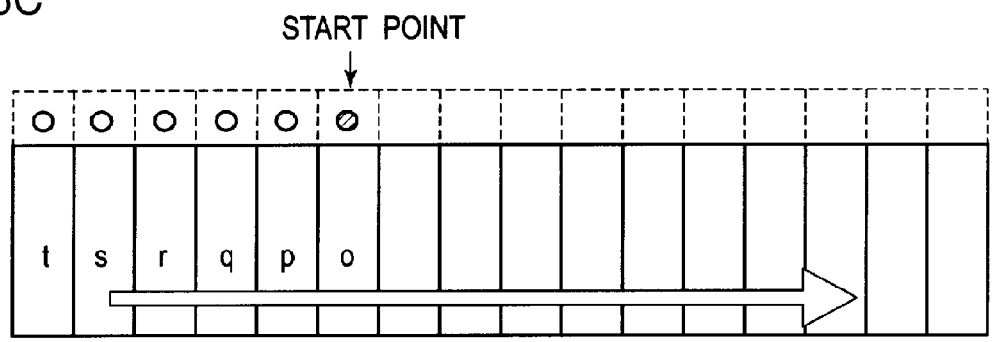

FIG. 16(a) illustrates an inner configuration of present one-dimensional marching main memory, in which the position indexes like existing addresses are not necessary for scalar instruction $I_s$, but the positioning of individual memory unit is at least necessary to identify the starting point and ending point of a set of successive memory units in vector instruction $I_v$, as indicated by hatched circle. FIG. 16(b) illustrates an inner configuration of present one-dimensional marching main memory, in which the position indexes are not necessary for scalar data "b" and "a". However, as shown in FIG. 16(c), position indexes are at least necessary to identify the starting point and ending point of a set of successive memory units in vector/streaming data "o", "p", "q", "r", "s", "t", as indicated by hatched circle.

In a marching memory family, which includes a marching-instruction register file 22a and a marching-data register file 22b connected to the ALU 112, which will be explained in the following second embodiment, and a marching-instruction cache memory 21a and a marching-data cache memory 21b, which will be explained in the following third embodiment, in addition to the marching main memory 31 used in the computer system pertaining to the first embodiment of the present invention, the relation between the main memory, the register file and cache memory has their own position pointing strategy based on the property of locality of reference.

Figure 17A:
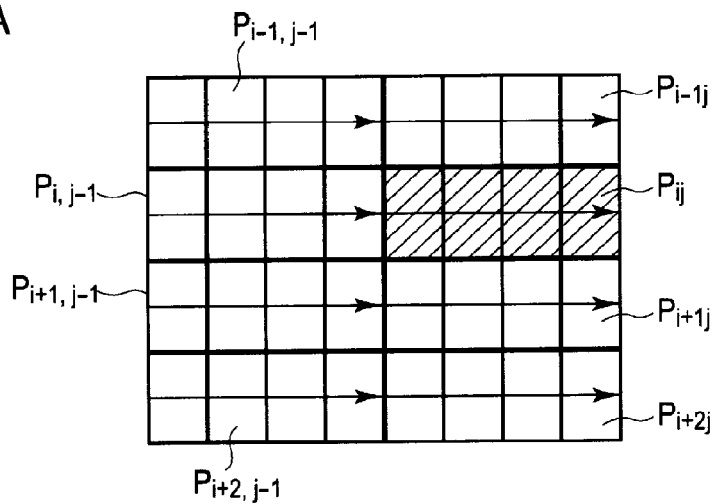
FIG. 17($a$) illustrates schematically an example of an overall configuration of present marching main memory implemented by a plurality of pages for vector/streaming data case, FIG. 17($b$) illustrates schematically an example of a configuration of one of the pages, each of the page is implemented by a plurality of files for vector/streaming data case, and FIG. 17($c$) illustrates schematically an example of a configuration of one of the files, each of the file is implemented by a plurality of memory units for vector/streaming data case, in the computer system pertaining to the first embodiment of the present invention.
Figure 17B:
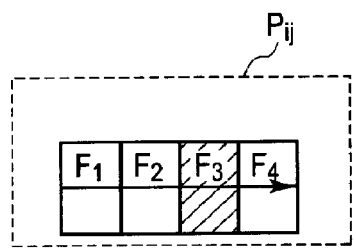
Figure 17C:
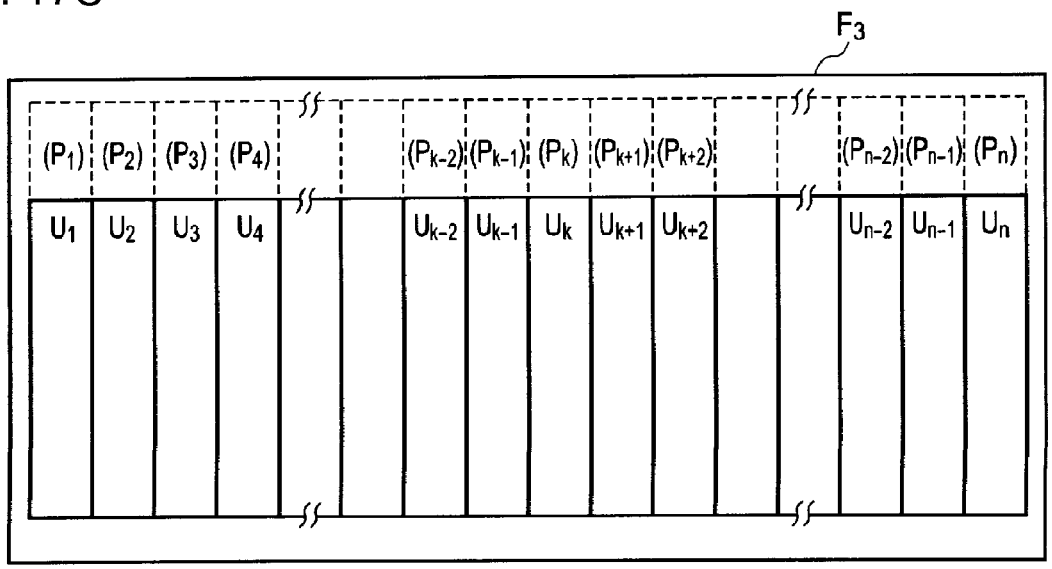

FIG. 17(a) illustrates schematically an example of an overall configuration of present marching main memory implemented by a plurality of pages $P_{i-1,j-1}$, $P_{i,j-1}$, $P_{i+1,j-1}$, $P_{i+2,j-1}$, $P_{i-1,j}$, $P_{i,j}$, $P_{i+1,j}$, $P_{i+2,j}$ for vector/streaming data case. FIG. 17(b) illustrates schematically an example of a configuration of the hatched page $P_{i,j}$, which is implemented by a plurality of files $F_1$, $F_2$, $F_3$, $F_4$ for vector/streaming data case, and each of the pages $P_{i-1,j-1}$, $P_{i,j-1}$, $P_{i+1,j-1}$, $P_{i+2,j-1}$, $P_{i-1,j}$, $P_{i,j}$, $P_{i+1,j}$, $P_{i+2,j}$ can be used for marching cache memories 21a and 21b in the third embodiment. FIG. 17(c) illustrates schematically an example of a configuration of the hatched file $F_3$, each of the files $F_1$, $F_2$, $F_3$, $F_4$ is implemented by a plurality of memory units $U_1$, $U_2$, $U_3$, . . . , $U_{n-1}$, $U_n$ for vector/streaming data case, and each of the file files $F_1$, $F_2$, $F_3$, $F_4$ can be used for marching register files 22a and 22b in the second embodiment.

Figure 18A:
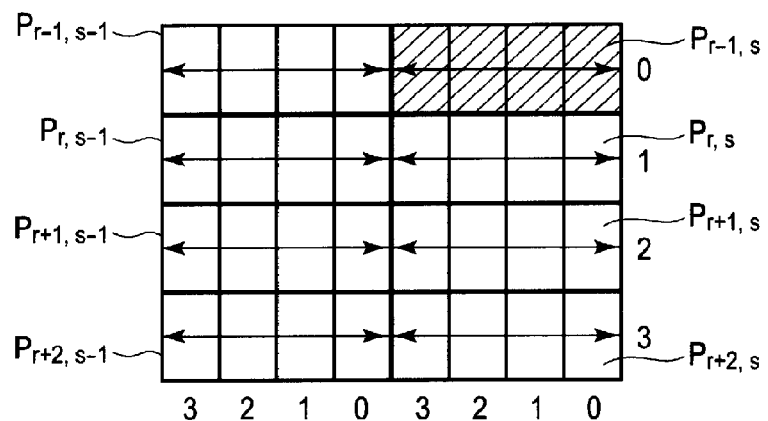
FIG. 18($a$) illustrates schematically an example of an overall configuration of present marching main memory implemented by a plurality of pages for programs/scalar data case, where each pages has its own position index as address, FIG. 18($b$) illustrates schematically an example of a configuration of one of the pages and the driving positions of the page, using digits in the binary system, each of the page is implemented by a plurality of files for programs/scalar data case, and each file has its own position index as address, and FIG. 18($c$) illustrates schematically an example of a configuration of one of the files and the driving positions of the file, using digits in the binary system, each of the file is implemented by a plurality of memory units for programs/scalar data case, where each memory units has its own position index as address, in the computer system pertaining to the first embodiment of the present invention.
Figure 18B:
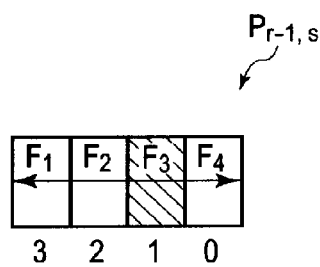
Figure 18C:
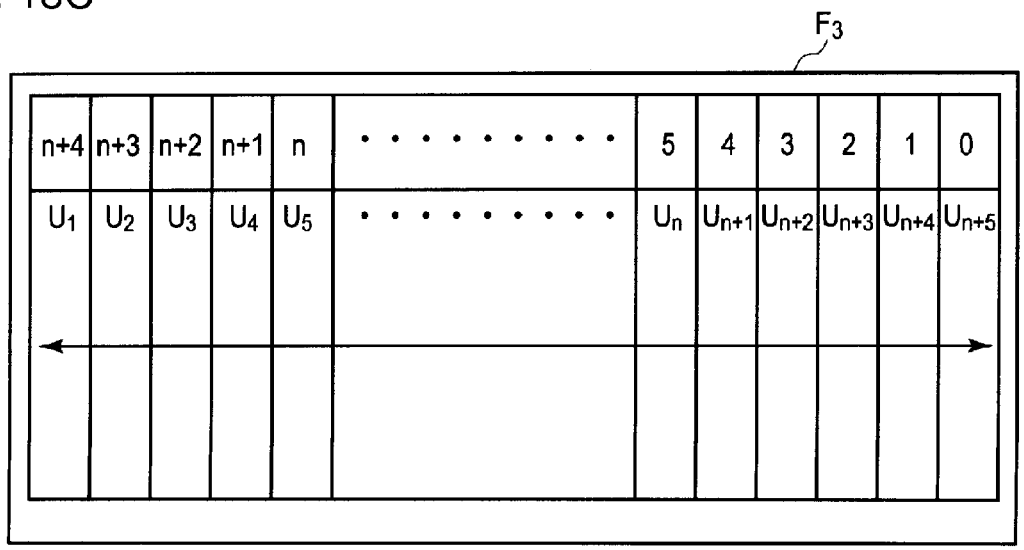

Similarly, FIG. 18(a) illustrates schematically an example of an overall configuration of present marching main memory implemented by a plurality of pages $P_{r-1,s-1}$, $P_{r,s-1}$, $P_{r+1,s-1}$, $P_{r+2,s-1}$, $P_{r-1,s}$, $P_{r,s}$, $P_{r+1,s}$, $P_{r+2,s}$ for programs/scalar data case, where each pages has its own position index as an address. FIG. 18(b) illustrates schematically an example of a configuration of the hatched page $P_{r-1,s}$ and the driving positions of the page $P_{r-1,s}$, using digits in the binary system, each of the page $P_{r-1,s-1}$, $P_{r,s-1}$, $P_{r+1,s-1}$, $P_{r+2,s-1}$, $P_{r-1,s}$, $P_{r,s}$, $P_{r+1,s}$, $P_{r+2,s}$ is implemented by a plurality of files $F_1$, $F_2$, $F_3$, $F_4$ for programs/scalar data case. Each of the page can be used for $P_{r-1,s-1}$, $P_{r,s-1}$, $P_{r+1,s-1}$, $P_{r+2,s-1}$, $P_{r-1,s}$, $P_{r,s}$, $P_{r+1,s}$, $P_{r+2,s}$ can be used for marching cache memories 21a and 21b in the third embodiment, where each of the files $F_1$, $F_2$, $F_3$, $F_4$ has its own position index as address. FIG. 18(c) illustrates schematically an example of a configuration of the hatched file $F_3$ and the driving positions of the file $F_3$, using digits 0, 1, 2, 3 in the binary system, each of the files $F_1$, $F_2$, $F_3$, $F_4$ is implemented by a plurality of memory units $U_1$, $U_2$, $U_3$, . . . , $U_n$, $U_{n+1}$, $U_{n+2}$, $U_{n+3}$, $U_{n+4}$, $U_{n+5}$ for programs/scalar data case. Each of the files $F_1$, $F_2$, $F_3$, $F_4$ can be used for a marching register files 22a and 22b in the second embodiment, where each memory units $U_1$, $U_2$, $U_3$, . . . , $U_n$, $U_{n+1}$, $U_{n+2}$, $U_{n+3}$, $U_{n+4}$, $U_{n+5}$ has its own position index n+4, n+3, n+2, . . . , 5, 4, 3, 2, 1, 0 as address. FIG. 18(c) represents position pointing strategy for all of the cases by digits in the binary system.

As shown in FIG. 18(c), the n binary digits identify a single memory unit among $2^n$ memory units, respectively, in a memory structure having an equivalent size corresponding to the size of a marching register file. And, as shown in FIG. 18(b), the structure of one page has an equivalent size corresponding to the size of a marching cache memory, which is represented by two digits which identify four files $F_1$, $F_2$, $F_3$, $F_4$, while the structure of one marching main memory is represented by three digits which identify eight pages $P_{r-1,s-1}$, $P_{r,s-1}$, $P_{r+1,s-1}$, $P_{r+2,s-1}$, $P_{r-1,s}$, $P_{r,s}$, $P_{r+1,s}$, $P_{r+2,s}$ in the marching main memory as shown in FIG. 18(a).

(Speed/Capability)

Figure 19A:
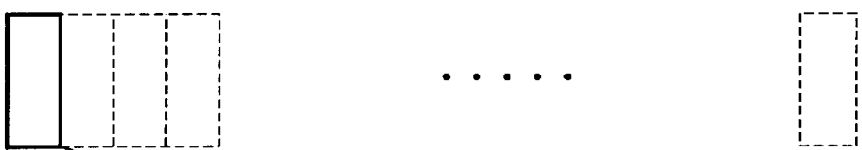
FIG. 19(a) illustrates schematically the speed/capability of the existing memory compared with that of the marching main memory used in the computer system pertaining to the first embodiment of the present invention.
Figure 19B:
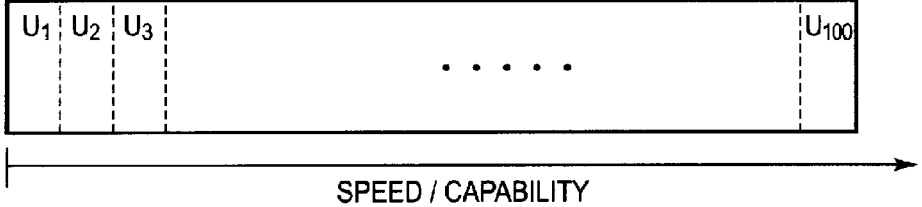
FIG. 19(b) illustrates schematically the speed/capability of the marching main memory compared with that of the existing memory shown in FIG. 19(a)

The speed gap between memory access time and the CPU cycle time in a conventional computer system is, for example, 1:100. However, the speed of the marching memory access time is equal to the CPU cycle time in the computer system of the first embodiment. FIG. 19 compares the speed/capability of the conventional computer system without cache with that of the marching main memory 31, configured to be used in the computer system pertaining to the first embodiment of the present invention. That is, FIG. 19(b) illustrates schematically the speed/capability of the marching main memory 31, implemented by one hundred of memory units $U_1$, $U_2$, $U_3$, . . . , $U_{100}$, and compares with the speed/capability of the existing memory shown in FIG. 19(a). We can also support 99 additional simultaneous memory units of the marching main memory 31, in the condition that we have necessary processing units to use the data from the marching main memory 31. Therefore, one memory unit time $T_{mue}$ in the conventional computer system is estimated to be equal to one hundred of the memory unit streaming time $T_{mus}$ of the marching main memory 31 pertaining to the first embodiment of the present invention.

Figure 20A:
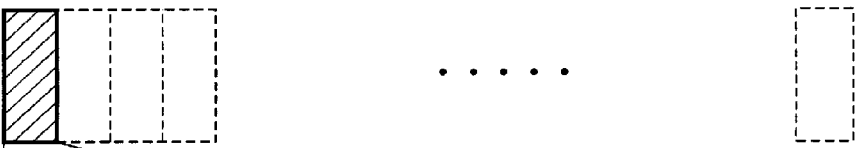
FIG. 20(a) illustrates schematically the speed/capability of the worst case of the existing memory for scalar instructions compared with that of the marching main memory used in the computer system pertaining to the first embodiment of the present invention.
Figure 20B:
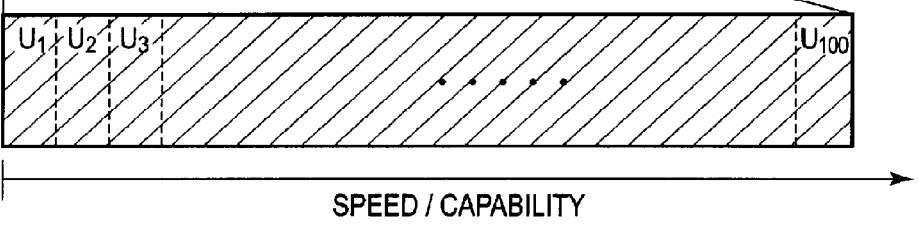
FIG. 20(b) illustrates schematically the speed/capability of the marching main memory compared with that of the worst case of the existing memory shown in FIG. 20(a)

And, FIG. 20 compares the speed/capability of the worst case of the existing memory for scalar data or program instructions with that of the marching main memory 31, configured to be used in the computer system pertaining to the first embodiment of the present invention. That is, the hatched portion of FIG. 20(b) illustrates schematically the speed/capability of the marching main memory 31, implemented by one hundred of memory units $U_1$, $U_2$, $U_3$, . . . , $U_{100}$, and compares with the speed/capability of the worst case of the existing memory shown in FIG. 20(a). In the worst case, we can read out 99 memory units of the marching main memory 31, but they are not available due to a scalar program's requirement.

Figure 21A:
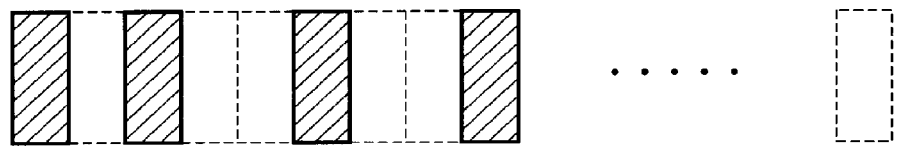
FIG. 21(a) illustrates schematically the speed/capability of the moderate case of the existing memory for scalar instructions compared with that of the marching main memory used in the computer system pertaining to the first embodiment of the present invention.
Figure 21B:
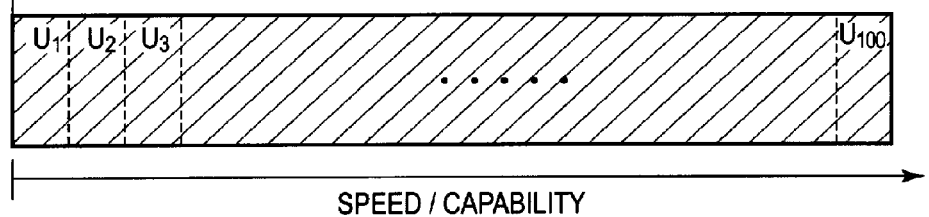
FIG. 21(b) illustrates schematically the speed/capability of the marching main memory compared with that of the moderate case of the existing memory shown in FIG. 21(a)

Further, FIG. 21 compares the speed/capability of the moderate case of the existing memory for scalar data or program instructions with that of the marching main memory 31, configured to be used in the computer system pertaining to the first embodiment of the present invention. That is, FIG. 21(b) illustrates schematically the speed/capability of the marching main memory 31, implemented by one hundred of memory units $U_1$, $U_2$, $U_3$, . . . , $U_{100}$, and compares with the speed/capability of the existing memory shown in FIG. 21(a). In the moderate case, we can read out 99 memory units but only several memory units are available, as shown by hatched memory units in the existing memory, by speculative data preparation in a scalar program.

Figure 22A:
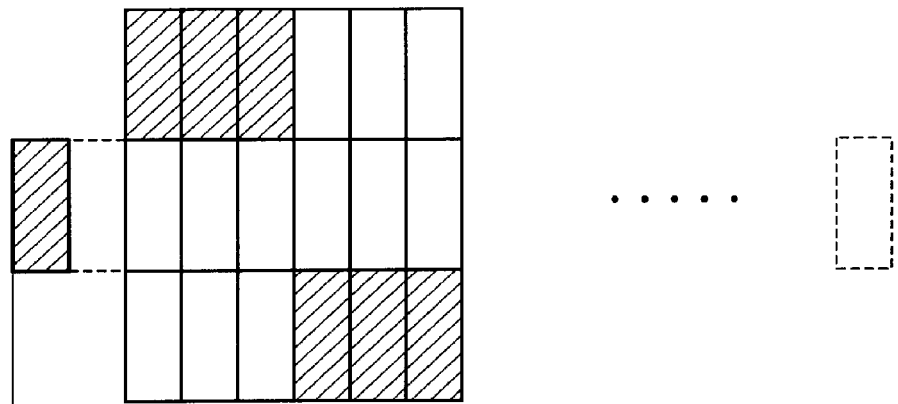
FIG. 22(a) illustrates schematically the speed/capability of the moderate case of the existing memory for scalar data case compared with that of the marching main memory used in the computer system pertaining to the first embodiment of the present invention.
Figure 22B:
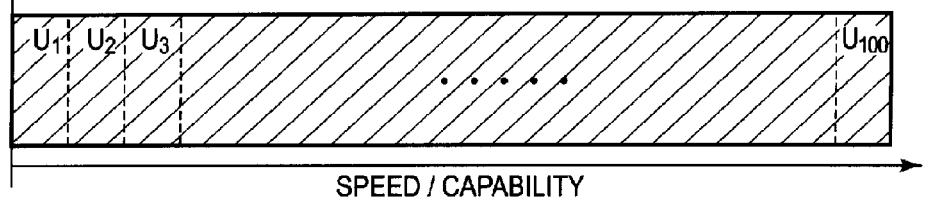
FIG. 22(b) illustrates schematically the speed/capability of the marching main memory compared with that of the existing memory shown in FIG. 22(a)

FIG. 22 compares the speed/capability of the moderate case of the existing memory for scalar data case with that of the marching main memory 31, configured to be used in the computer system pertaining to the first embodiment of the present invention. That is, FIG. 22(b) illustrates schematically the speed/capability of the marching main memory 31, implemented by one hundred of memory units $U_1$, $U_2$, $U_3$, . . . , $U_{100}$, and compares with the speed/capability of the existing memory shown in FIG. 22(a). Similar to the case shown in FIGS. 21(a)-(b), in the moderate case, we can read out 99 memory units but only several memory units are available, as shown by hatched memory units in the existing memory, by speculative data preparation in a scalar data or program instructions in multi-thread parallel processing.

Figure 23A:
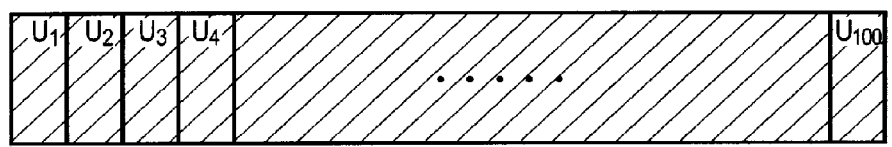
FIG. 23(a) illustrates schematically the speed/capability of the best case of the existing memory for streaming data and data parallel case compared with that of the marching main memory used in the computer system pertaining to the first embodiment of the present invention.
Figure 23B:
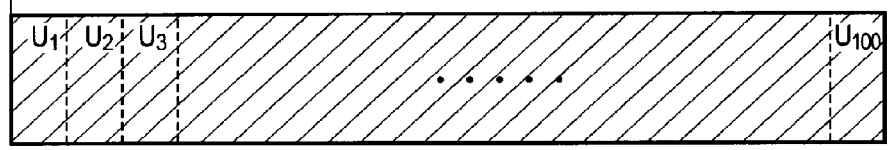
FIG. 23(b) illustrates schematically the speed/capability of the marching main memory compared with that of the best case of the existing memory shown in FIG. 23(a)
Figure 24:
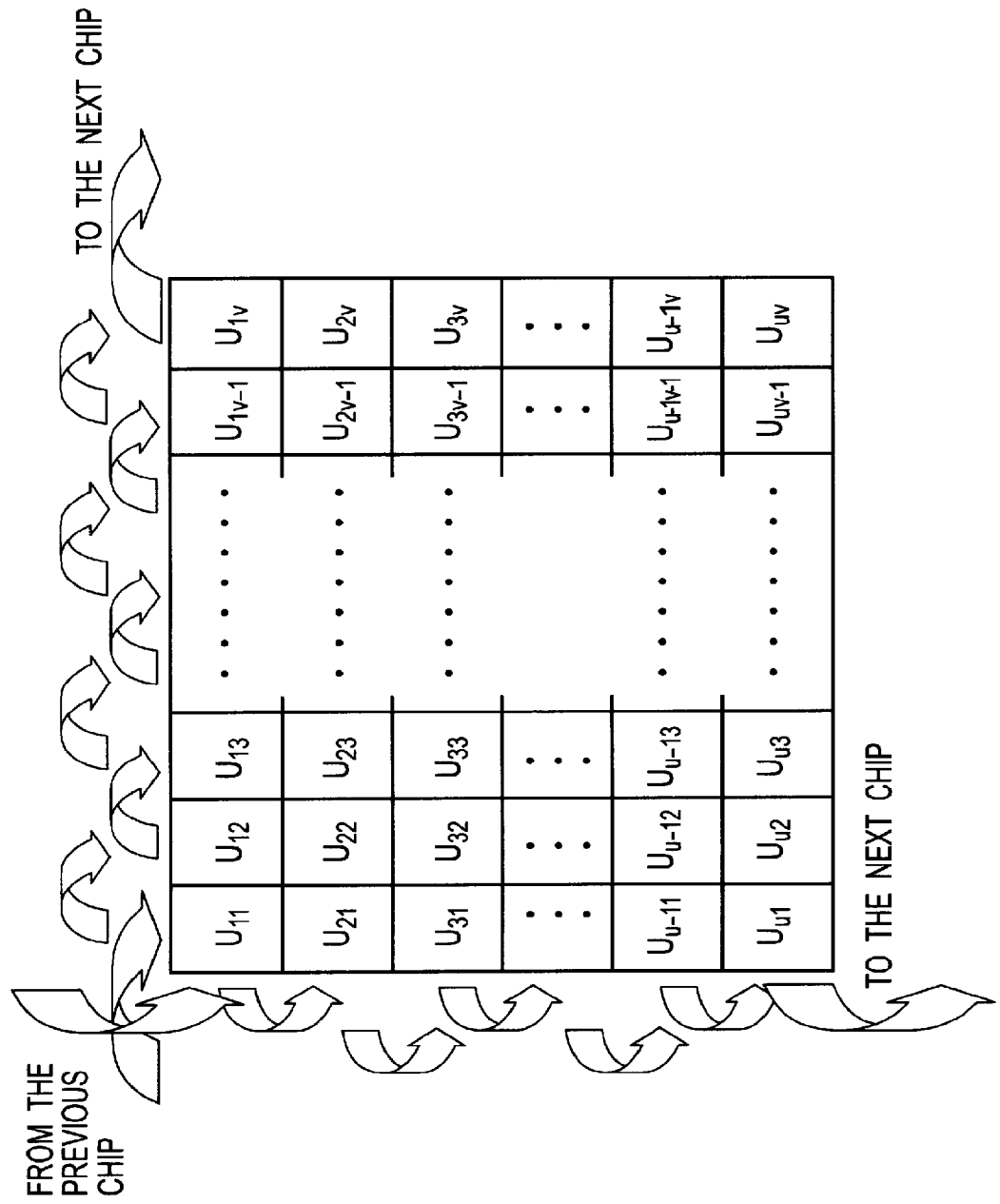
FIG. 24 illustrates an example of the array of two-dimensional memory units, each of the memory units storing and transferring data or instructions, implementing a marching main memory used in the computer system pertaining to the first embodiment of the present invention.
Figure 25:
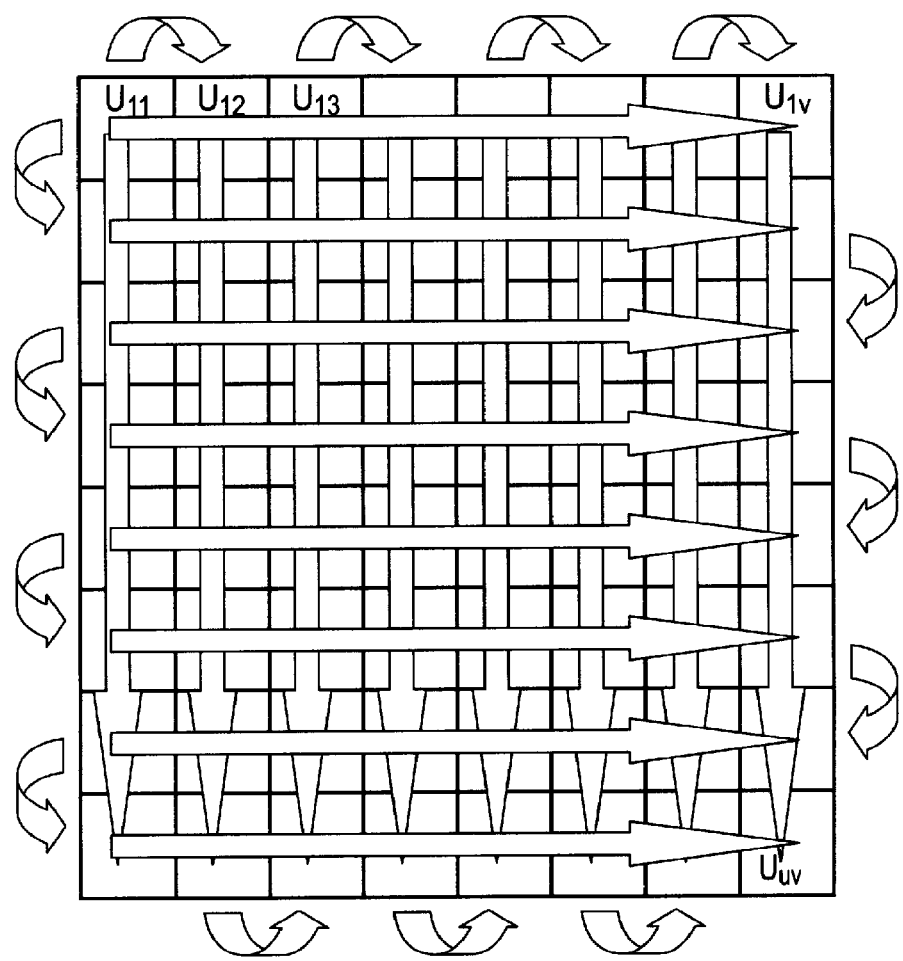
FIG. 25 illustrates another example of the array of two-dimensional memory units, each of the memory units storing and transferring data or instructions, implementing a marching main memory used in the computer system pertaining to the first embodiment of the present invention.
Figure 26:
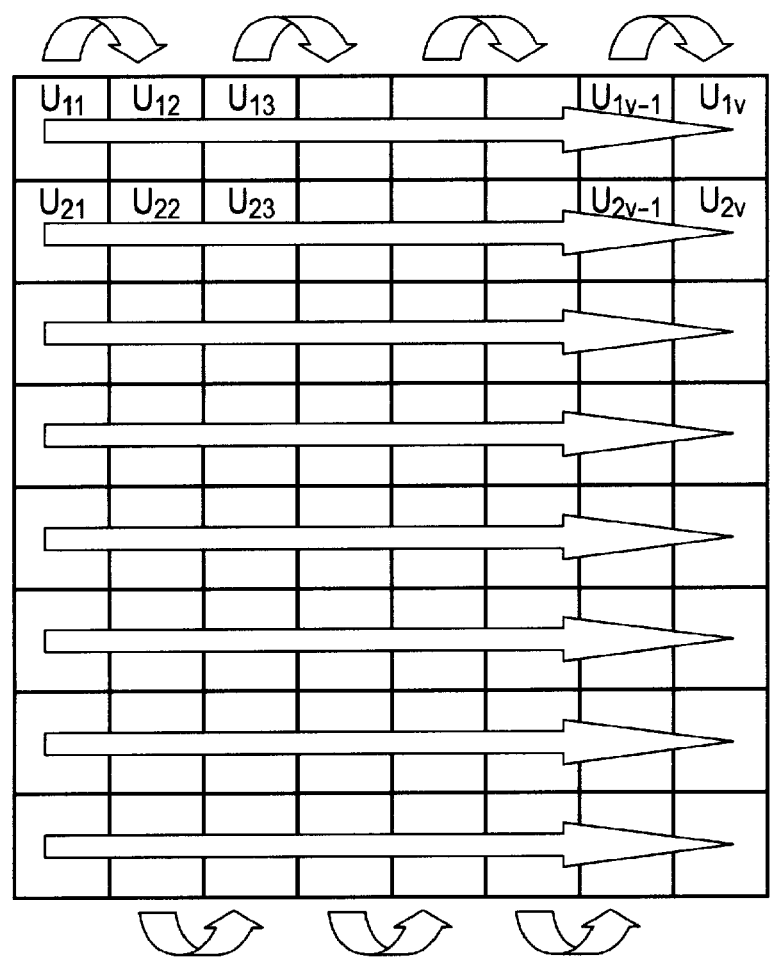
FIG. 26 illustrates a still another example of the array of two-dimensional memory units, each of the memory units storing and transferring data or instructions, implementing a marching main memory used in the computer system pertaining to the first embodiment of the present invention.
Figure 27:
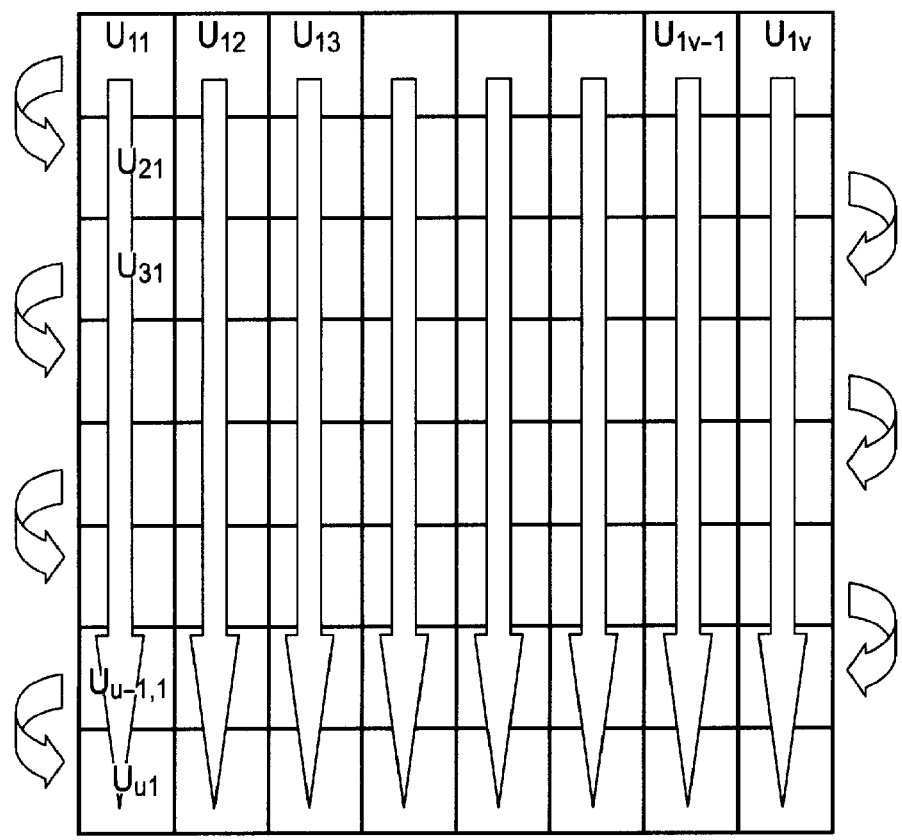
FIG. 27 illustrates a yet still another example of the array of two-dimensional memory units, each of the memory units storing and transferring data or instructions, implementing a marching main memory used in the computer system pertaining to the first embodiment of the present invention.
Figure 28:
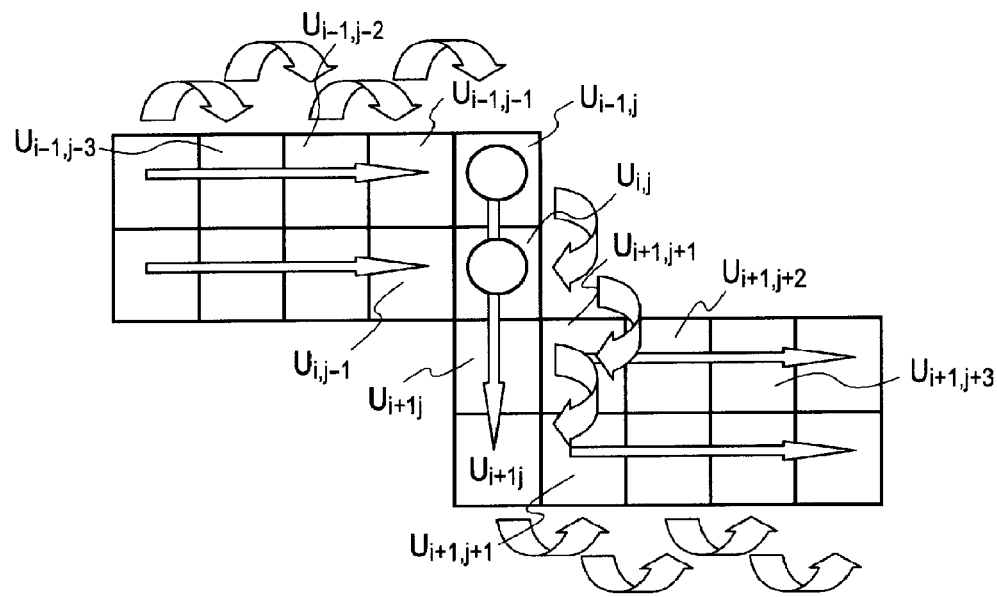
FIG. 28 illustrates a further another example of the array of two-dimensional memory units, each of the memory units storing and transferring data or instructions, implementing a marching main memory used in the computer system pertaining to the first embodiment of the present invention.
Figure 29:
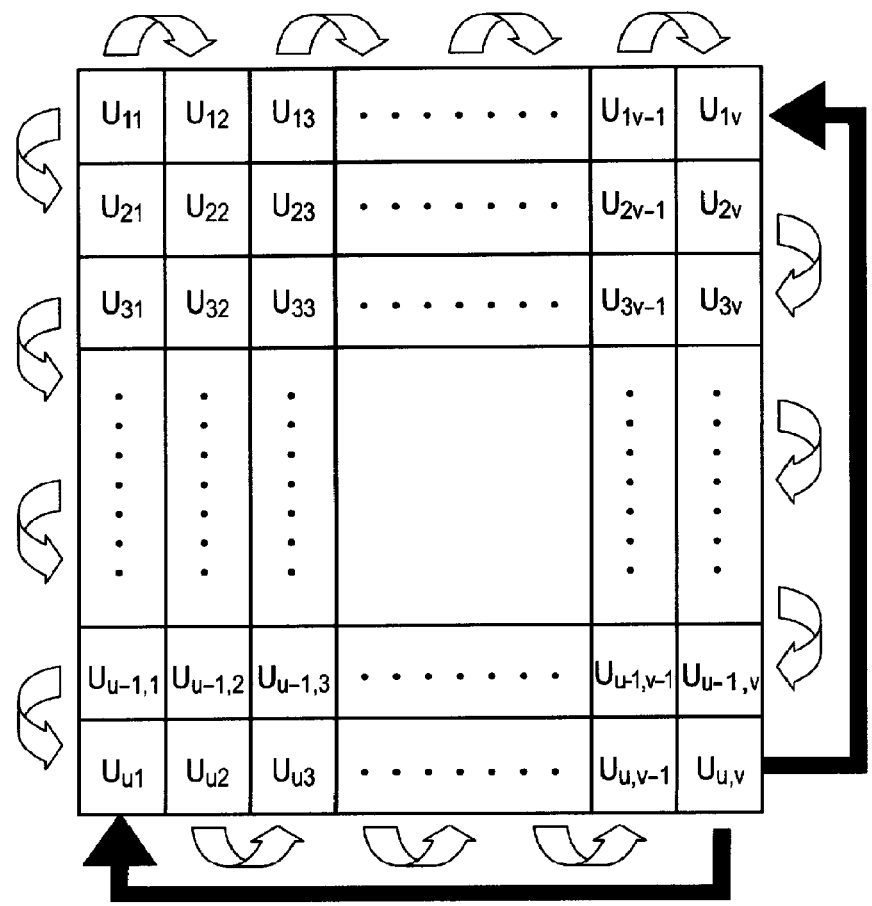
FIG. 29 illustrates a further another example of the array of two-dimensional memory units, each of the memory units storing and transferring data or instructions, implementing a marching main memory used in the computer system pertaining to the first embodiment of the present invention.

FIG. 23 compares the speed/capability of the best case of the existing memory for streaming data, vector data or program instructions case with that of the marching main memory 31, configured to be used in the computer system pertaining to the first embodiment of the present invention. That is, FIG. 23(b) illustrates schematically the speed/capability of the marching main memory 31, implemented by one hundred of memory units $U_1$, $U_2$, $U_3$, . . . , $U_{100}$, and compares with the speed/capability of the best case of the existing memory shown in FIG. 23(a). In the best case, we can understand that one hundred memory units of the marching main memory 31 are usable for streaming data and data parallel.

(Two-Dimensional Marching Main Memory)

The memory units can be arranged two-dimensionally on a chip as shown in FIGS. 24-30 so that various mode of operation can be achieved without a switch/network. According to the two-dimensional marching main memory 31 of the first embodiment shown in FIGS. 24-30, the memory units $U_{11}$, $U_{12}$, $U_{13}$, . . . , $U_{1,v-1}$, $U_{1v}$; $U_{22}$, $U_{22}$, $U_{23}$, . . . , $U_{2,v-2}$, $U_{2,v}$; . . . ; $U_{u1}$, $U_{u2}$, $U_{u3}$, . . . , $U_{u,v-1}$, $U_{uv}$ are not required of the refreshment, because all of the memory units $U_{11}$, $U_{12}$, $U_{13}$, . . . , $U_{1,v-1}$, $U_{1v}$; $U_{22}$, $U_{22}$, $U_{23}$, . . . , $U_{2,v-2}$, $U_{2,v}$; . . . ; $U_{u1}$, $U_{u2}$, $U_{u3}$, . . . , $U_{u,v-1}$, $U_{uv}$ are usually refreshed automatically due to the information-moving scheme (information-marching scheme). And then addressing to each of memory units $U_{11}$, $U_{12}$, $U_{13}$, . . . , $U_{1,v-1}$, $U_{1v}$; $U_{22}$, $U_{22}$, $U_{23}$, . . . , $U_{2,v-2}$, $U_{2,v}$; . . . ; $U_{u1}$, $U_{u2}$, $U_{u3}$, . . . , $U_{u,v-1}$, $U_{uv}$, disappears and required information is heading for its destination unit connected to the edge of the memory. The mechanism of accessing the two-dimensional marching main memory 31 of the first embodiment is truly alternative to existing memory schemes that are starting from the addressing mode to read/write information in the conventional computer system. Therefore, according to the two-dimensional marching main memory 31 of the first embodiment, the memory-accessing process without addressing mode in the computer system of the first embodiment is quite simpler than existing memory schemes of the conventional computer system.

(Energy Consumption)

To clarify the improvement of architecture, design and implementation of the computer system pertaining to the first embodiment of the present invention, the improvement in energy consumption will be explained. FIG. 31(a) shows that the energy consumption in microprocessors can be decomposed into static power consumption and dynamic power consumption. In the dynamic power consumption shown in FIG. 31(a), net and overhead of the power consumption are outstandingly shown in FIG. 31(b). As shown in FIG. 31(c), only the net energy portions are practically necessary to operate a given job in a computer system, so that these pure energy parts make least energy consumption to perform the computer system. This means the shortest processing time is achieved by the net energy consumed shown in FIG. 31(c).

Even though some efforts are introduced into architecting, designing and implementing processors, there are bottlenecks in the conventional architecture as shown in FIG. 1. In the conventional architecture, there are various issues in the von Neumann computer, as follows:

1) Programs are stored like data in memory;
2) All processing is basically sequential in a uni-processor;
3) The operation of programs is the sequential execution of instructions;
4) Vector data is sequentially processed by the CPU with vector instructions;
5) Streaming data is sequentially processed with threads;
6) Programs then threads are arranged sequentially;
7) Data parallel consists of an arrangement of data as a vector; and
8) Streaming data is a flow of data From the properties of a conventional computer, we conclude that storage of programs and data is in a fashion of basically sequentially arranged ones. This fact means the regular arrangement of instructions exists in a program and the corresponding data.

In the computer system pertaining to the first embodiment of the present invention shown in FIG. 2, the access of instructions in the marching main memory 31 is not necessary, because instructions are actively accessed by themselves to processor 11. Similarly, the access of data in the marching main memory 31 is not necessary, because data are actively accessed by themselves to processor 11.

FIG. 32 shows an actual energy consumption distribution over a processor including registers and caches in the conventional architecture, estimated by William J. Dally, et al., in "Efficient Embedded Computing", Computer, vol. 41, no. 7, 2008, pp. 27-32. In FIG. 32, an estimation of the power consumption distribution on only the whole chip, except for wires between chips is disclosed. By Dally, et al, the instruction supply power consumption is estimated to be 42%, the data supply power consumption is estimated to be 28%, the clock and control logic power consumption is estimated to be 24%, and the arithmetic power consumption is estimated to be 6%. Therefore, we can understand that instruction supply and data supply power consumptions are relatively larger than of the clock/control logic power consumption and the arithmetic power consumption, which is ascribable to the inefficiency of cache/register accessing with lots of wires and some software overhead due to access ways of these caches and registers in addition to non-refreshment of all the memories, caches and registers.

Because the ratio of the instruction supply power consumption to the data supply power consumption is 3:2, and the ratio of the clock and control logic power consumption to the arithmetic power consumption is 4:1, in accordance with the computer system pertaining to the first embodiment of the present invention shown in FIG. 2, we can reduce easily the data supply power consumption to 20% by using the marching main memory 31 at least partly so that the instruction supply power consumption becomes 30%, while we can increase the arithmetic power consumption to 10% so that the clock and control logic power consumption become 40%, which means that the sum of the instruction supply power consumption and the data supply power consumption can be made 50%, and the sum of the clock and control logic power consumption and the arithmetic power consumption can be made 50%.

If we reduce the data supply power consumption to 10%, the instruction supply power consumption becomes 15%, and if we increase the arithmetic power consumption to 15%, the clock and control logic power consumption will become 60%, which means that the sum of the instruction supply power consumption and the data supply power consumption can be made 35%, while the sum of the clock and control logic power consumption and the arithmetic power consumption can be made 75%.

Figure 33A:
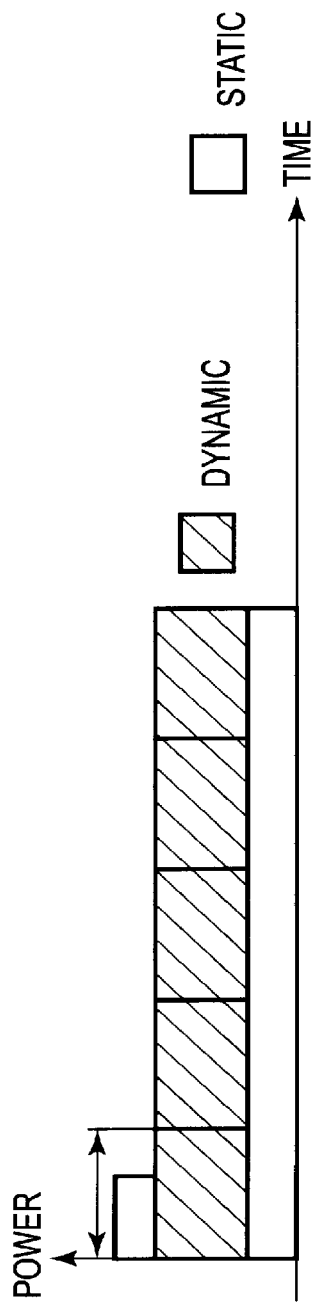
FIG. 33(a) illustrates energy consumption in the conventional cache-based architecture, decomposing the energy consumption in the cache memory into static and dynamic energy consumptions.
Figure 33B:
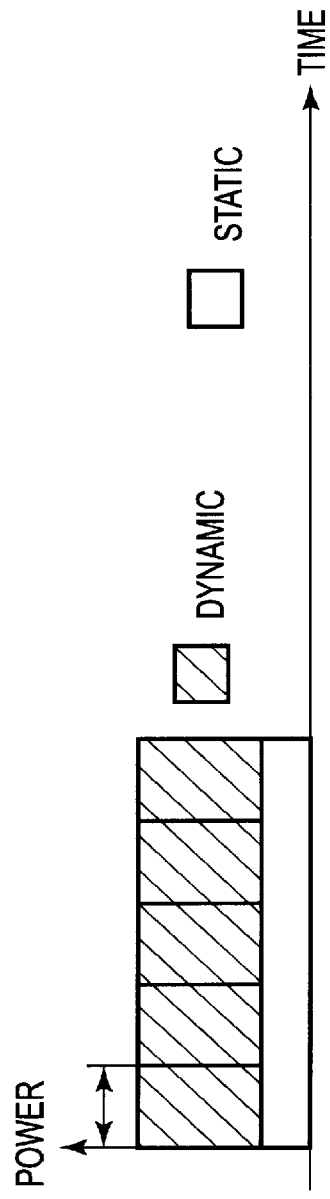
FIG. 33(b) illustrates energy consumption in the computer system according to a third embodiment of the present invention, decomposing the energy consumption in the marching cache memory into static and dynamic energy consumption.

The conventional computer system dissipates energy as shown in the FIG. 33(a) with a relatively large average active time for addressing and read/writing memory units, accompanied by wire delay time, while the present computer system dissipates smaller energy as shown in the FIG. 33(b), because the present computer system has a shorter average active smooth time through marching memory, and we could process the same data faster than the conventional computer system with less energy.

Second Embodiment

Figure 34:
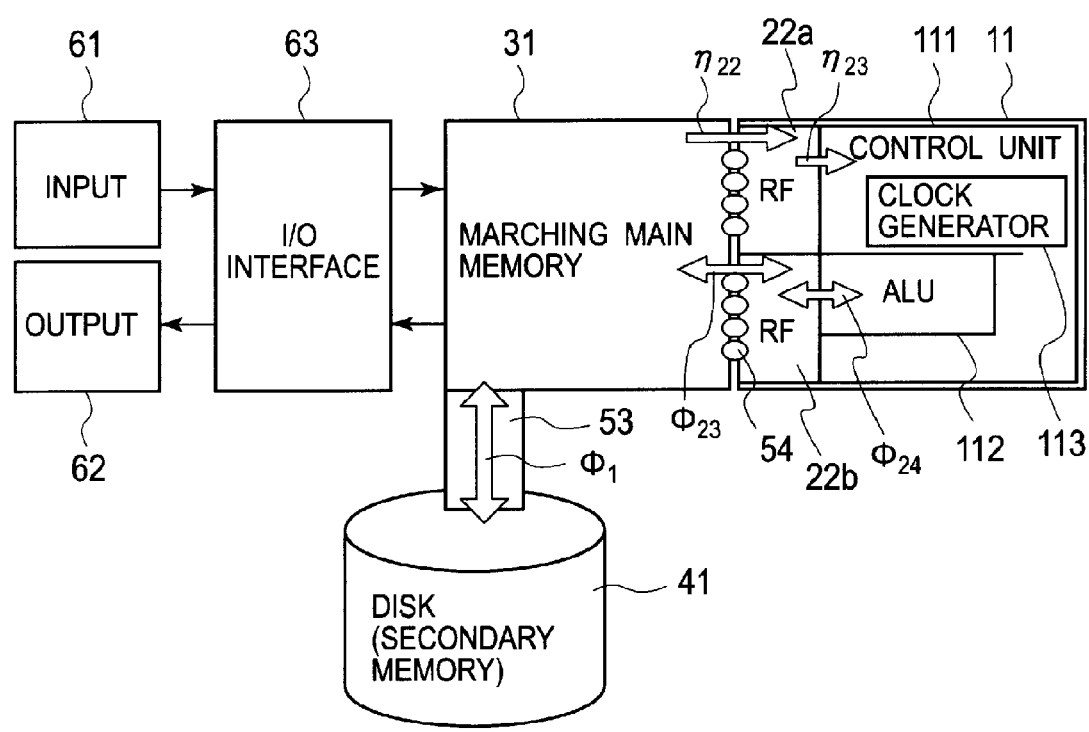
FIG. 34 illustrates a schematic block diagram showing an organization of a computer system pertaining to a second embodiment of the present invention.

As shown in FIG. 34, a computer system pertaining to a second embodiment of the present invention encompasses a processor 11 and a marching main memory 31. The processor 11 includes a control unit 111 having a clock generator 113 configured to generate a clock signal, an arithmetic logic unit (ALU) 112 configured to execute arithmetic and logic operations synchronized with the clock signal, a marching-instruction register file (RF) 22a connected to the control unit 111 and a marching-data register file (RF) 22b connected to the ALU 112.

Although the illustration is omitted, very similar to the marching main memory 31 shown in FIGS. 3-7, 8(a), 8(b) and 24-30, the marching-instruction register file 22a has an array of instruction register units, instruction-register input terminals of the third array configured to receive the stored instruction from the marching main memory 31, and instruction-register output terminals of the third array, configured to store instruction in each of instruction register units and to transfer successively and periodically the stored instruction in each of instruction register units to an adjacent instruction register unit being synchronized with the clock signal from the instruction register units adjacent to the instruction-register input terminals toward the instruction register units adjacent to the instruction-register output terminals, so as to provide actively and sequentially instruction implemented by the stored instruction to the control unit 111 through the instruction-register output terminals so that the control unit 111 can execute operations with the instruction.

Further similar to the marching main memory 31 shown in FIGS. 3-7, 8(a), 8(b) and 24-30, the marching-data register file 22b has an array of data register units, data-register input terminals of the fourth array configured to receive the stored data from the marching main memory 31, and data-register output terminals of the fourth array, configured to store data in each of data register units and to transfer successively and periodically the stored data in each of data register units to an adjacent data register unit being synchronized with the clock signal from the data register units adjacent to the data-register input terminals toward the data register units adjacent to the data-register output terminals, so as to provide actively and sequentially the data to the ALU 112 through the data-register output terminals so that the ALU 112 can execute operations with the data, although the detailed illustration of, the marching-data register file 22b is omitted.

As shown in FIG. 34, a portion of the marching main memory 31 and the marching-instruction register file 22a are electrically connected by a plurality of joint members 54, and remaining portion of the marching main memory 31 and the marching-data register file 22b are electrically connected by another plurality of joint members 54.

The resultant data of the processing in the ALU 112 are sent out to the marching-data register file 22b. Therefore, as represented by bi-directional arrow PHI(Greek-letter)$_{24}$, data are transferred bi-directionally between the marching-data register file 22b and the ALU 112. Furthermore, the data stored in the marching-data register file 22b are sent out to the marching main memory 31 through the joint members 54. Therefore, as represented by bi-directional arrow PHI(Greek-letter)$_{23}$, data are transferred bi-directionally between the marching main memory 31 and the marching-data register file 22b through the joint members 54.

On the contrary, as represented by uni-directional arrows eta(Greek-letter)$_{22}$ and eta(Greek-letter)$_{23}$, as to the instructions movement, there is only one way of instruction-flow from the marching main memory 31 to the marching-instruction register file 22a, and from the marching-instruction register file 22a to the control unit 111.

In the computer system of the second embodiment shown in FIG. 34, there are no buses consisting of the data bus and address bus because the whole computer system has no wires even in any data exchange between the marching main memory 31 and the marching-instruction register file 22a, between the marching main memory 31 and the marching-data register file 22b, between the marching-instruction register file 22a and the control unit 111 and between the marching-data register file 22b and the ALU 112, while the wires or the buses implement the bottleneck in the conventional computer system. As there are no global wires, which generate time delay and stray capacitances between these wires, the computer system of the second embodiment can achieve much higher processing speed and lower power consumption.

Since other functions, configurations, and ways of operation of the computer system pertaining to the second embodiment are substantially similar to the functions, configurations, way of operation already explained in the first embodiment, overlapping or redundant description may be omitted.

Third Embodiment

Figure 35:
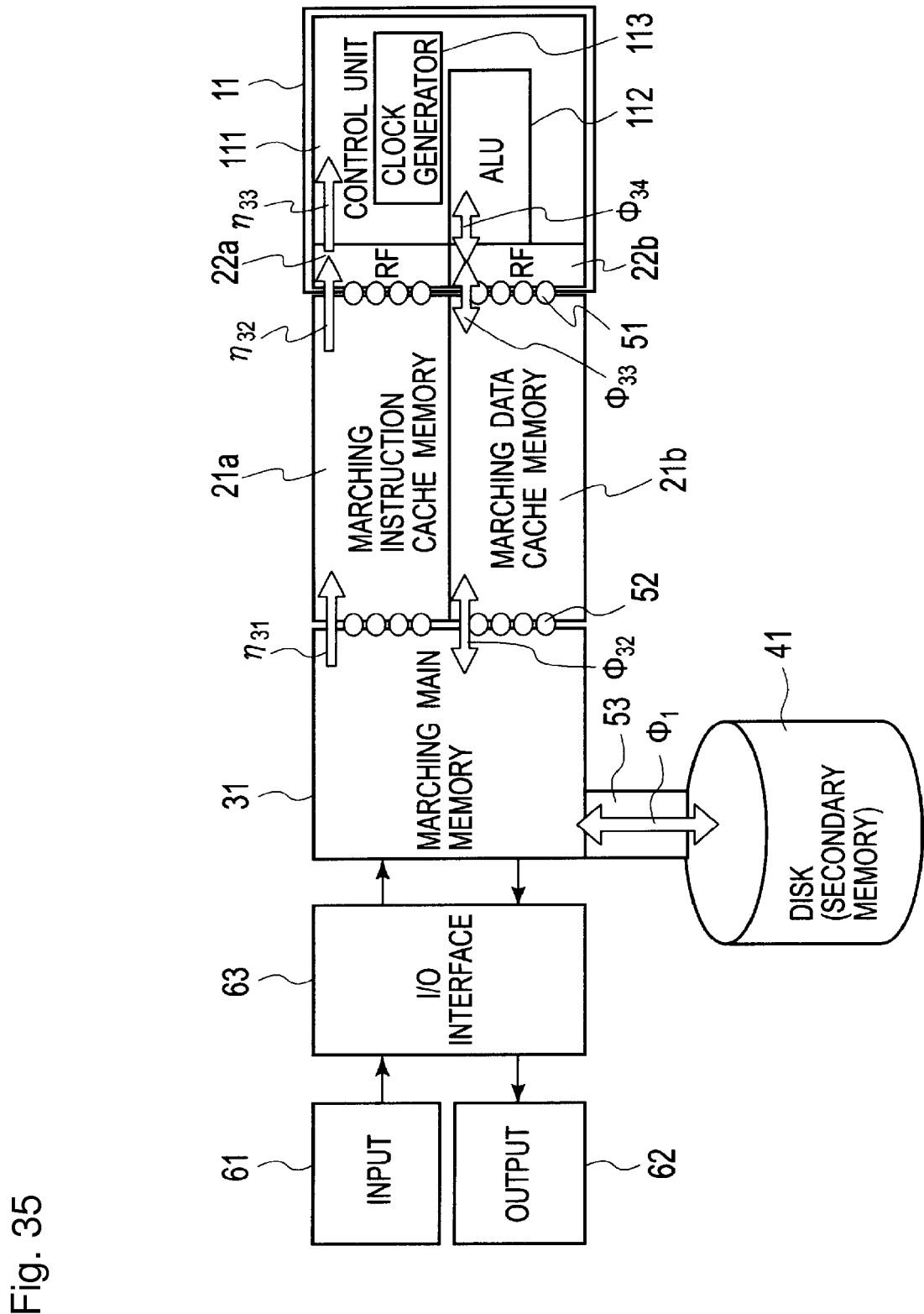
FIG. 35 illustrates a schematic block diagram showing an organization of a computer system pertaining to a third embodiment of the present invention.

As shown in FIG. 35, a computer system pertaining to a third embodiment of the present invention encompasses a processor 11, a marching-cache memory (21a, 21b) and a marching main memory 31. Similar to the second embodiment, the processor 11 includes a control unit 111 having a clock generator 113 configured to generate a clock signal, an arithmetic logic unit (ALU) 112 configured to execute arithmetic and logic operations synchronized with the clock signal, a marching-instruction register file (RF) 22a connected to the control unit 111 and a marching-data register file (RF) 22b connected to the ALU 112.

The marching-cache memory (21a, 21b) embraces a marching-instruction cache memory 21a and a marching-data cache memory 21b. Although the illustration is omitted, very similar to the marching main memory 31 shown in FIGS. 3-7, 8(a), 8(b) and 24-30, each of the marching-instruction cache memory 21a and the marching-data cache memory 21b has an array of cache memory units at locations corresponding to a unit of information, cache input terminals of the array configured to receive the stored information from the marching main memory 31, and cache output terminals of the array, configured to store information in each of cache memory units and to transfer, synchronously with the clock signal, step by step, the information each to an adjacent cache memory unit, so as to provide actively and sequentially the stored information to the processor 11 so that the ALU 112 can execute the arithmetic and logic operations with the stored information.

As shown in FIG. 35, a portion of the marching main memory 31 and the marching-instruction cache memory 21a are electrically connected by a plurality of joint members 52, and remaining portion of the marching main memory 31 and the marching-data cache memory 21b are electrically connected by another plurality of joint members 52. Furthermore, the marching-instruction cache memory 21a and the marching-instruction register file 22a are electrically connected by a plurality of joint members 51, and the marching-data cache memory 21b and the marching-data register file 22b are electrically connected by another plurality of joint members 51.

The resultant data of the processing in the ALU 112 are sent out to the marching-data register file 22b, and, as represented by bi-directional arrow PHI(Greek-letter)$_{34}$, data are transferred bi-directionally between the marching-data register file 22b and the ALU 112. Furthermore, the data stored in the marching-data register file 22b are sent out to the marching-data cache memory 21b through the joint members 51, and, as represented by bi-directional arrow PHI(Greek-letter)$_{33}$, data are transferred bi-directionally between the marching-data cache memory 21b and the marching-data register file 22b through the joint members 51. Furthermore, the data stored in the marching-data cache memory 21b are sent out to the marching main memory 31 through the joint members 52, and, as represented by bi-directional arrow PHI(Greek-letter)$_{32}$, data are transferred bi-directionally between the marching main memory 31 and the marching-data cache memory 21b through the joint members 52.

On the contrary, as represented by uni-directional arrows eta(Greek-letter)$_{31}$, eta$_{32}$ and eta$_{33}$, as to the instructions movement, there is only one way of instruction-flow from the marching main memory 31 to the marching-instruction cache memory 21a, from the marching-instruction cache memory 21a to the marching-instruction register file 22a, and from the marching-instruction register file 22a to the control unit 111.

In the computer system of the third embodiment shown in FIG. 35, there are no buses consisting of the data bus and address bus because the whole computer system has no global wires even in any data exchange between the marching main memory 31 and the marching-instruction cache memory 21a, between the marching-instruction cache memory 21a and the marching-instruction register file 22a, between the marching main memory 31 and the marching-data cache memory 21b, between the marching-data cache memory 21b and the marching-data register file 22b, between the marching-instruction register tile 22a and the control unit 111 and between the marching-data register file 22b and the ALU 112, while the wires or the buses implement the bottleneck in the conventional computer system. As there are no global wires, which generate time delay and stray capacitances between these wires, the computer system of the third embodiment can achieve much higher processing speed and lower power consumption.

Since other functions, configurations, way of operation of the computer system pertaining to the third embodiment are substantially similar to the functions, configurations, way of operation already explained in the first and second embodiments, overlapping or redundant description may be omitted.

Figure 36B:
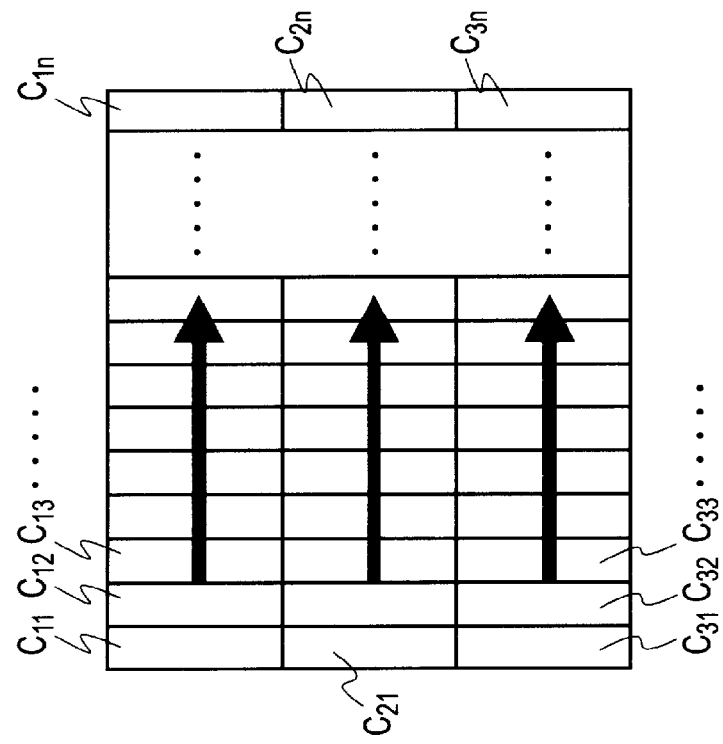
FIG. 36(b) illustrates an array of marching cache units in the computer system pertaining to the third embodiment of the present invention.
Figure 36A:
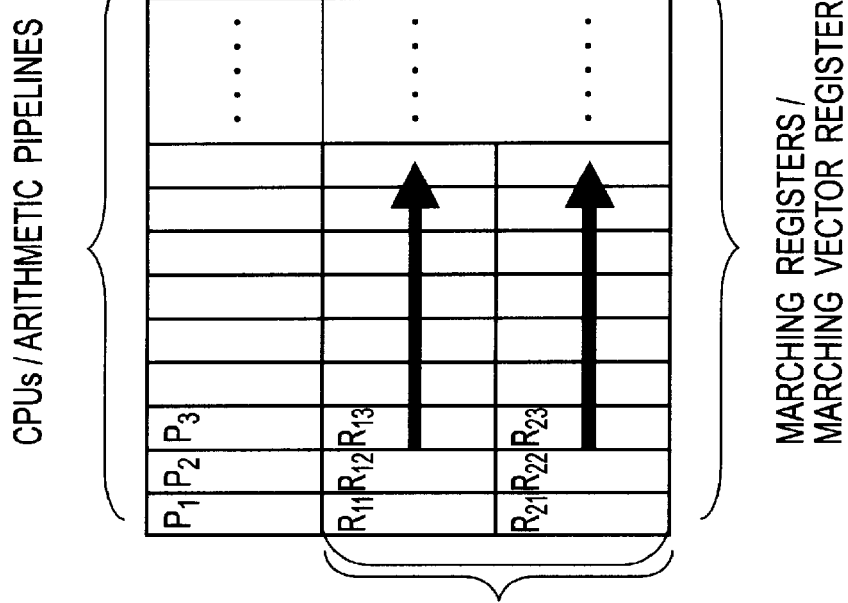
FIG. 36(a) illustrates a combination of arithmetic pipelines and marching register units in the computer system pertaining to the third embodiment of the present invention.

As shown in FIG. 36(a), the ALU 112 in the computer system of the third embodiment may includes a plurality of arithmetic pipelines $P_1, P_2, P_3, \ldots, P_n$ configured to receive the stored information through marching register units $R_{11}, R_{12}, R_{13}, \ldots, R_{1n}; R_{22}, R_{22}, R_{23}, \ldots, R_{2n}$, in which data move in parallel with the alignment direction of the arithmetic pipelines $P_1, P_2, P_3, \ldots, P_n$. In case that vector data are stored, marching-vector register units $R_{11}, R_{12}, R_{13}, \ldots, R_{1n}; R_{22}, R_{22}, R_{23}, \ldots, R_{2n}$ can be used.

Furthermore, as shown in FIG. 36(b), a plurality of marching cache units $C_{11}, C_{12}, C_{13}, \ldots, C_{1n}; C_{21}, C_{22}, C_{23}, \ldots, C_{2n}; C_{31}, C_{32}, C_{33}, \ldots, C_{3n}$ can be aligned in parallel.

Figure 37:
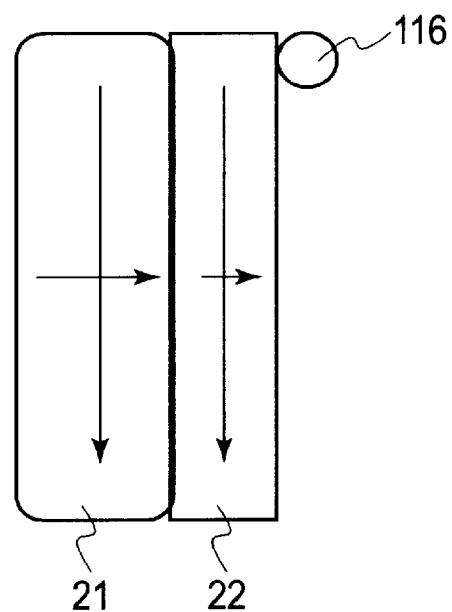
FIG. 37 illustrates a schematic block diagram of an organization of a computer system implemented by a combination of a single processor core, a marching-cache memory and a marching-register file in accordance with a modification of the third embodiment of the present invention.

As shown in FIG. 37, the ALU 112 in the computer system of the third embodiment may include a single processor core 116, and as represented by cross-directional arrows, the information can moves from the marching-cache memory 21 to the marching-register file 22, and from the marching-register file 22 to the processor core 116. The resultant data of the processing in the processor core 116 are sent out to the marching-register file 22 so that data are transferred bi-directionally between the marching-register file 22 and the processor core 116. Furthermore, the data stored in the marching-register file 22 are sent out to the marching-cache memory 21 so that data are transferred bi-directionally between the marching-cache memory 21 and the marching-register file 22. In case of instructions movement, there is no flow along the opposite direction of the information to be processed.

Figure 38:
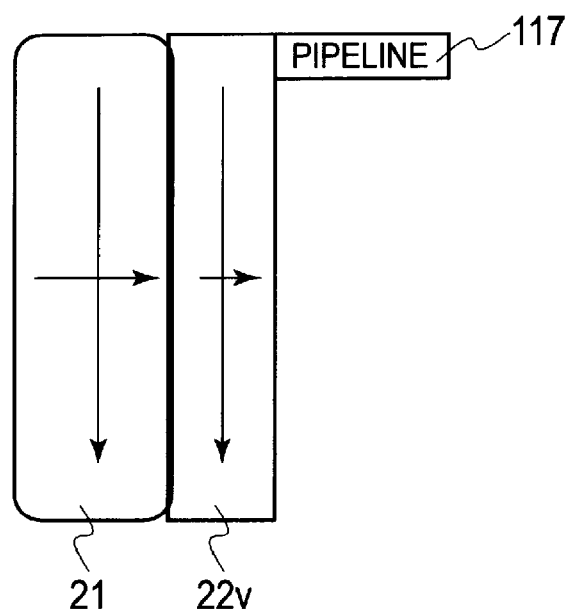
FIG. 38 illustrates a schematic block diagram of an organization of a computer system implemented by a combination of a single arithmetic pipeline, a marching-cache memory and a marching-vector register file in accordance with another modification of the third embodiment of the present invention.

As shown in FIG. 38, the ALU 112 in the computer system of the third embodiment may include a single arithmetic pipeline 117, and as represented by cross-directional arrows, the information can moves from the marching-cache memory 21 to the marching-vector register file 22v, and from the marching-vector register file 22v to the arithmetic pipeline 117. The resultant data of the processing in the arithmetic pipeline 117 are sent out to the marching-vector register file 22v so that data are transferred bi-directionally between the marching-vector register file 22v and the arithmetic pipeline 117. Furthermore, the data stored in the marching-vector register file 22v are sent out to the marching-cache memory 21 so that data are transferred bi-directionally between the marching-cache memory 21 and the marching-vector register file 22v. In case of instructions movement, there is no flow along the opposite direction of the information to be processed.

Figure 39:
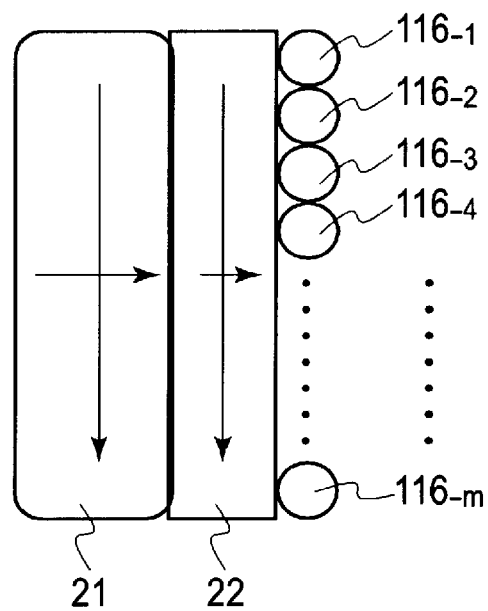
FIG. 39 illustrates a schematic block diagram of an organization of a computer system implemented by a combination of a plurality of processor cores, a marching-cache memory and a marching-register file in accordance with a still another modification of the third embodiment of the present invention.

As shown in FIG. 39, the ALU 112 in the computer system of the third embodiment may include a plurality of processor cores $116_{-1}, 116_{-2}, 116_{-3}, 116_{-4}, \ldots, 116_{-m}$, and as represented by cross-directional arrows, the information can moves from the marching-cache memory 21 to the marching-register file 22, and from the marching-register file 22 to the processor cores $116_{-1}, 116_{-2}, 116_{-3}, 116_{-4}, \ldots, 116_{-m}$. The resultant data of the processing in the processor cores $116_{-1}, 116_{-2}, 116_{-3}, 116_{-4}, \ldots, 116_{-m}$ are sent out to the marching-register file 22 so that data are transferred bi-directionally between the marching-register file 22 and the processor cores $116_{-1}, 116_{-2}, 116_{-3}, 116_{-4}, \ldots, 116_{-m}$. Furthermore, the data stored in the marching-register file 22 are sent out to the marching-cache memory 21 so that data are transferred bi-directionally between the marching-cache memory 21 and the marching-register file 22. In case of instructions movement, there is no flow along the opposite direction of the information to be processed.

Figure 40:
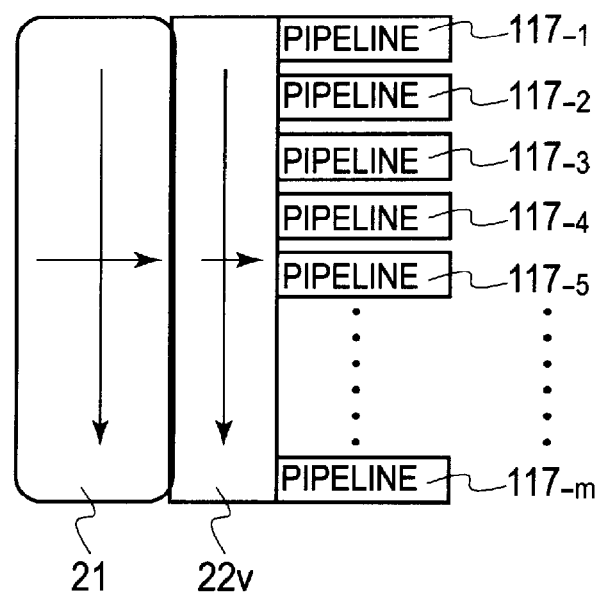
FIG. 40 illustrates a schematic block diagram of an organization of a computer system implemented by a combination of a plurality of arithmetic pipelines, a marching-cache memory and a marching-vector register file in accordance with a yet still another modification of the third embodiment of the present invention.

As shown in FIG. 40, the ALU 112 in the computer system of the third embodiment may include a plurality of arithmetic pipelines $117_{-1}, 117_{-2}, 117_{-3}, 117_{-4}, \ldots, 117_{-m}$, and as represented by cross-directional arrows, the information can moves from the marching-cache memory 21 to the marching-vector register file 22v, and from the marching-vector register file 22v to the arithmetic pipelines $117_{-1}, 117_{-2}, 117_{-3}, 117_{-4}, \ldots, 117_{-m}$. The resultant data of the processing in the arithmetic pipelines $117_{-1}, 117_{-2}, 117_{-3}, 117_{-4}, \ldots, 117_{-m}$ are sent out to the marching-vector register file 22v so that data are transferred bi-directionally between the marching-vector register file 22v and the arithmetic pipelines $117_{-1}, 117_{-2}, 117_{-3}, 117_{-4}, \ldots, 117_{-m}$. Furthermore, the data stored in the marching-vector register file 22v are sent out to the marching-cache memory 21 so that data are transferred bi-directionally between the marching-cache memory 21 and the marching-vector register file 22v. In case of instructions movement, there is no flow along the opposite direction of the information to be processed.

Figure 41A:
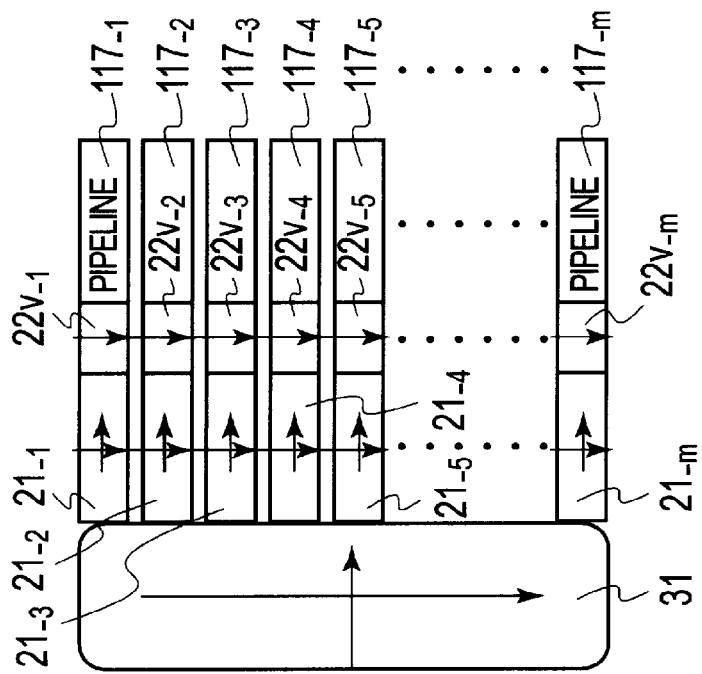
FIG. 41(a) illustrates a schematic block diagram of an organization of a conventional computer system implemented by a combination of a plurality of arithmetic pipelines, a plurality of conventional cache memories, a plurality of conventional-vector register files (RFs) and a conventional main memory, in which bottleneck is established between the conventional cache memories and the conventional main memory.
Figure 41B:
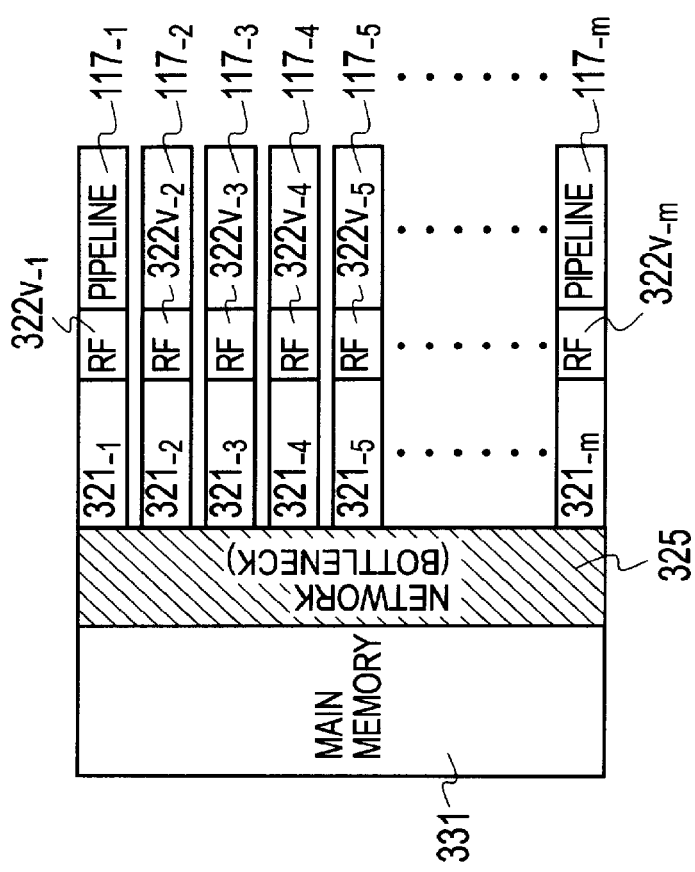
FIG. 41(b) illustrates a schematic block diagram of an organization of a computer system implemented by a combination of a plurality of arithmetic pipelines, a plurality of marching cache memories, a plurality of marching-vector register files and a marching main memory, in which no bottleneck is established, in accordance with a yet still another modification of the third embodiment of the present invention.

As shown in FIG. 41(b), the ALU 112 in the computer system of the third embodiment may include a plurality of arithmetic pipelines $117_{-1}, 117_{-2}, 117_{-3}, 117_{-4}, \ldots, 117_{-m}$, and a plurality of marching cache memories $21_{-1}, 21_{-2}, 21_{-3}, 21_{-4}, \ldots, 21_{-m}$ are electrically connected to the marching main memory 31. Here, a first marching-vector register file $22v_{-4}$ is connected to the first marching-cache memory $21_{-1}$, and a first arithmetic pipeline $117_{-1}$ is connected to the first marching-vector register file $22v_{-1}$. And, a second marching-vector register file $22v_{-2}$ is connected to the second marching-cache memory $21_{-2}$, and a second arithmetic pipelines $117_{-2}$ is connected to the second marching-vector register file $22v_{-2}$; a third marching-vector register file $22v_{-3}$ is connected to the third marching-cache memory $21_{-3}$, and a third arithmetic pipelines $117_{-3}$ is connected to the third marching-vector register file $22v_{-3}$; ...; and a m-th marching-vector register file $22v_{-m}$ is connected to the m-th marching-cache memory $21_{-m}$, and a m-th arithmetic pipelines $117_{-m}$ is connected to the m-th marching-vector register file $22v_{-m}$.

The information moves from the marching main memory 31 to the marching cache memories $21_{-1}, 21_{-2}, 21_{-3}, 21_{-4}, \ldots, 21_{-m}$ in parallel, from marching cache memories $21_{-1}, 21_{-2}, 21_{-3}, 21_{-4}, \ldots, 21_{-m}$ to the marching-vector register files $22v_{-1}, 22v_{-2}, 22v_{-3}, 22v_{-4}, \ldots, 22v_{-m}$ in parallel, and from the marching-vector register files $22v_{-1}, 22v_{-2}, 22v_{-3}, 22v_{-4}, \ldots, 22v_{-m}$ to the arithmetic pipelines $117_{-1}, 117_{-2}, 117_{-3}, 117_{-4}, \ldots, 117_{-m}$ in parallel. The resultant data of the processing in the arithmetic pipelines $117_{-1}, 117_{-2}, 117_{-3}, 117_{-4}, \ldots, 117_{-m}$ are sent out to the marching-vector register files $22v_{-1}, 22v_{-2}, 22v_{-3}, 22v_{-4}, \ldots, 22v_{-m}$ so that data are transferred bi-directionally between the marching-vector register files $22v_{-1}, 22v_{-2}, 22v_{-3}, 22v_{-4}, \ldots, 22v_{-m}$ and the arithmetic pipelines $117_{-1}, 117_{-2}, 117_{-3}, 117_{-4}, \ldots, 117_{-m}$. Furthermore, the data stored in the marching-vector register files $22v_{-1}, 22v_{-2}, 22v_{-3}, 22v_{-4}, \ldots, 22v_{-m}$ are sent out to the marching cache memories $21_{-1}, 21_{-2}, 21_{-3}, 21_{-4}, \ldots, 21_{-m}$ so that data are transferred bi-directionally between the marching cache memories $21_{-1}, 21_{-2}, 21_{-3}, 21_{-4}, \ldots, 21_{-m}$ and the marching-vector register files $22v_{-1}, 22v_{-2}, 22v_{-3}, 22v_{-4}, \ldots, 22v_{-m}$ and the data stored in the marching cache memories $21_{-1}, 21_{-2}, 21_{-3}, 21_{-4}, \ldots, 21_{-m}$ are sent out to the marching main memory 31 so that data are transferred bi-directionally between the marching main memory 31 and the marching cache memories $21_{-1}, 21_{-2}, 21_{-3}, 21_{-4}, \ldots, 21_{-m}$. In case of instructions movement, there is no flow along the opposite direction of the information to be processed.

On the contrary, as shown FIG. 41(a), in the ALU 112 of the conventional computer system including a plurality of arithmetic pipelines $117_{-1}, 117_{-2}, 117_{-3}, 117_{-4}, \ldots, 117_{-m}$, a plurality of conventional cache memories $321_{-1}, 321_{-2}, 321_{-3}, 321_{-4}, \ldots, 321_{-m}$ are electrically connected to the conventional main memory 331 through wires and/or buses which implement von Neumann bottleneck 325. Then, information moves from the conventional main memory 331 to the conventional cache memories $321_{-1}$, $321_{-2}$, $321_{-3}$, $321_{-4}$, ..., $321_{-m}$ in parallel through von Neumann bottleneck 325, from conventional cache memories $321_{-1}$, $321_{-2}$, $321_{-3}$, $321_{-4}$, ..., $321_{-m}$ to the conventional-vector register files (RFs) $322v_{-1}$, $322v_{-2}$, $322v_{-3}$, $322v_{-4}$, ..., $322v_{-m}$ in parallel, and from the conventional-vector register files $322v_{-1}$, $322v_{-2}$, $322v_{-3}$, $322v_{-4}$, ..., $322v_{-m}$ to the arithmetic pipelines $117_{-1}$, $117_{-2}$, $117_{-3}$, $117_{-4}$, ..., $117_{-m}$ in parallel.

In the computer system of the third embodiment shown in FIG. 41(b), there are no buses consisting of the data bus and address bus because the whole system has no global wires even in any data exchange between the arithmetic pipelines $117_{-1}$, $117_{-2}$, $117_{-3}$, $117_{-4}$, ..., $117_{-m}$ and the marching main memory 31, while the wires or the buses implement the bottleneck in the conventional computer system as shown in FIG. 41(a). As there are no global wires, which generate time delay and stray capacitances between these wires, the computer system shown in FIG. 41(b) can achieve much higher processing speed and lower power consumption.

Fourth Embodiment

Figure 42:
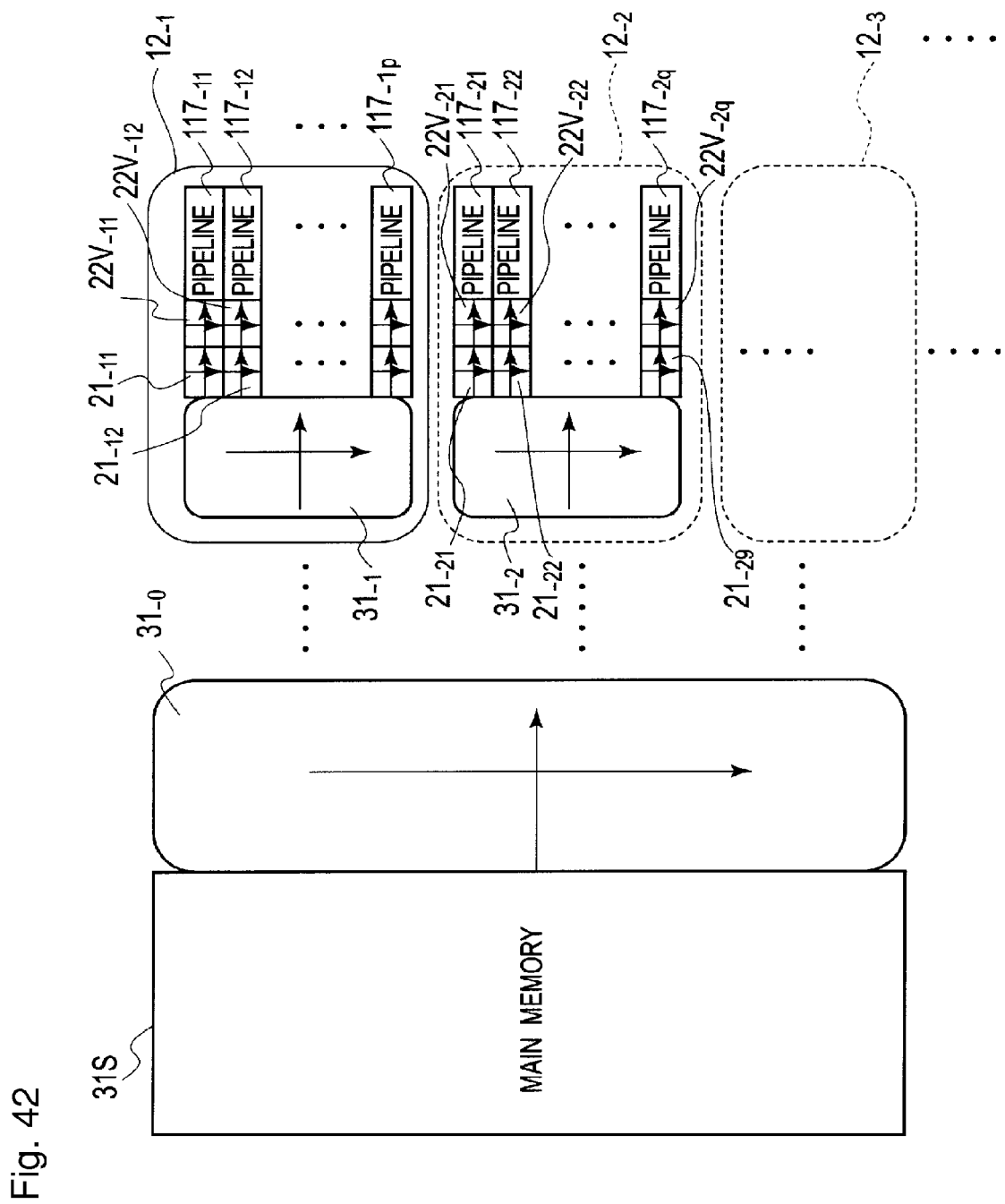
FIG. 42 illustrates a schematic block diagram showing an organization of a high performance computing (HPC) system pertaining to a fourth embodiment of the present invention.

As shown in FIG. 42, a computer system of a fourth embodiment encompasses a conventional main memory 31s, a mother marching main memory $31_{-0}$ connected to the conventional main memory 31s, and a plurality of processing units $12_{-1}$, $12_{-2}$, $12_{-3}$, ..., configured to communicate with mother marching main memory $31_{-0}$ so as to implement a high performance computing (HPC) system, which can be used for graphics processing unit (GPU)-based general-purpose computing. Although the illustration is omitted, the HPC system of the fourth embodiment further includes a control unit 111 having a clock generator 113 configured to generate a clock signal, and a field programmable gate array (FPGA) configured to switch-control operations of the plurality of processing units $12_{-1}$, $12_{-2}$, $12_{-3}$, ..., optimizing the flow of crunching calculations by running parallel, constructing to help manage and organize bandwidth consumption. FPGA is, in essence, a computer chip that can rewire itself for a given task. FPGA can be programmed with hardware description languages such as VHDL or Verilog.

The first processing unit $12_{-1}$ encompasses a first branched-marching main memory $31_{-1}$, a plurality of first marching cache memories $21_{-11}$, $21_{-12}$, ..., $21_{-1p}$ electrically connected respectively to the first branched-marching main memory $31_{-1}$, a plurality of first marching-vector register files $22v_{-11}$, $22v_{-12}$, ..., $22v_{-11}$ electrically connected respectively to the first marching cache memories $21_{-11}$, $21_{-12}$, ..., $21_{-1p}$, a plurality of first arithmetic pipelines $117_{-11}$, $117_{-12}$, ..., $117_{-1p}$ electrically connected respectively to the first marching-vector register files $22v_{-11}$, $22v_{-12}$, ..., $22v_{-1p}$.

Similar to the configurations shown in FIGS. 3-7, 8(a), 8(b) and 24-30 etc., because each of the mother marching main memory $31_{-0}$, the first branched-marching main memory $31_{-1}$, the first marching cache memories $21_{-11}$, $21_{-12}$, ..., $21_{-1p}$, and the first marching-vector register files $22v_{-11}$, $22v_{-12}$, ..., $22v_{-1p}$ encompasses an array of memory units, input terminals of the array and output terminals of the array, configured to store information in each of memory units and to transfer synchronously with the clock signal, step by step, from a side of input terminals toward the output terminals.

Because the operations of the mother marching main memory $31_{-0}$, the first branched-marching main memory $31_{-1}$, the first marching cache memories $21_{-11}$, $21_{-12}$, ..., $21_{-1p}$, and the first marching-vector register files $22v_{-11}$, $22v_{-12}$, ..., $22v_{-1p}$ are controlled by FPGA, the information moves from the mother marching main memory $31_{-0}$ to the first branched-marching main memory $31_{-1}$, from the first branched-marching main memory $31_{-1}$ to the first marching cache memories $21_{-11}$, $21_{-12}$, ..., $21_{-1p}$, in parallel, from first marching cache memories $21_{-11}$, $21_{-12}$, ..., $21_{-1p}$, to the first marching-vector register files $22v_{-11}$, $22v_{-12}$, ..., $22v_{-1p}$ in parallel, and from the first marching-vector register files $22v_{-11}$, $22v_{-12}$, ..., $22v_{-1p}$ to the first arithmetic pipelines $117_{-11}$, $117_{-12}$, ..., $117_{-1}$, in parallel. The resultant data of the processing in the first arithmetic pipelines $117_{-11}$, $117_{-12}$, ..., $117_{-1p}$ are sent out to the first marching-vector register files $22v_{-11}$, $22v_{-12}$, ..., $22v_{-1}$, so that data are transferred bi-directionally between the first marching, vector register files $22v_{-11}$, $22v_{-12}$, ..., $22v_{-1p}$ and the first arithmetic pipelines $117_{-11}$, $117_{-12}$, ..., $117_{-1p}$. Furthermore, the data stored in the first marching-vector register files $22v_{-11}$, $22v_{-12}$, ..., $22v_{-1p}$ are sent out to the first marching cache memories $21_{-11}$, $21_{-12}$, ..., $21_{-1}$, so that data are transferred bi-directionally between the first marching cache memories $21_{-11}$, $21_{-12}$, ..., $21_{-1p}$ and the first marching-vector register files $22v_{-11}$, $22v_{-12}$, ..., $22v_{-1p}$, and the data stored in the first marching cache memories $21_{-11}$, $21_{-12}$, ..., $21_{-1p}$, are sent out to the first branched-marching main memory $31_{-1}$ so that data are transferred bi-directionally between the first branched-marching main memory $31_{-1}$ and the first marching cache memories $21_{-11}$, $21_{-12}$, ..., $21_{-1}$. However, the FPGA controls the movement of instructions such that there is no flow along the opposite direction of the information to be processed in the first processing unit $12_{-1}$.

The second processing unit $12_{-2}$ encompasses a second branched-marching main memory $31_{-2}$, a plurality of second marching cache memories $21_{-21}$, $21_{-22}$, ..., $21_{-2p}$ electrically connected respectively to the second branched-marching main memory $31_{-2}$, a plurality of second marching-vector register files $22v_{-21}$, $22v_{-22}$, ..., $22v_{-2q}$, electrically connected respectively to the second marching cache memories $22_{-21}$, $21_{-22}$, ..., $21_{-2p}$, a plurality of second arithmetic pipelines $117_{-21}$, $117_{-22}$, ..., $117_{-2}$, electrically connected respectively to the second marching-vector register files $22v_{-21}$, $22v_{-22}$, ..., $22v_{-2}$. Similar to the first processing unit $12_{-1}$, each of the mother marching main memory $31_{-0}$, the second branched-marching main memory $31_{-2}$, the second marching cache memories $21_{-21}$, $21_{-22}$, ..., $21_{-2p}$, and the second marching-vector register files $22v_{-21}$, $22v_{-22}$, ..., $22v_{-2p}$ encompasses an array of memory units, input terminals of the array and output terminals of the array, configured to store information in each of memory units and to transfer synchronously with the clock signal, step by step, from a side of input terminals toward the output terminals. Because the operations of the mother marching main memory $31_{-0}$, the second branched-marching main memory $31_{-2}$, the second marching cache memories $21_{-21}$, $21_{-22}$, ..., $21_{-2p}$, and the second marching-vector register files $22v_{-21}$, $22v_{-22}$, ..., $22v_{-2p}$ are controlled by the FPGA, the information moves from the mother marching main memory $31_{-0}$ to the second branched-marching main memory $31_{-2}$, from the second branched-marching main memory $31_{-2}$ to the second marching cache memories $21_{-21}$, $21_{-22}$, ..., $21_{-2q}$ in parallel, from second marching cache memories $21_{-21}$, $21_{-22}$, ..., $21_{-2q}$ to the second marching-vector register files $22v_{-21}$, $22v_{-22}$, ..., $22v_{-2q}$ in parallel, and from the second marching-vector register files $22v_{-21}$, $22v_{-22}$, ..., $22v_{-2q}$ to the second arithmetic pipelines $117_{-21}$, $117_{-22}$, ..., $117_{-2q}$ in parallel. The resultant data of the processing in the second arithmetic pipelines $117_{-21}, 117_{-22}, \ldots, 117_{-2}$ are sent out to the second marching-vector register files $22v_{-21}, 22v_{-22}, \ldots, 22v_{-2q}$ so that data are transferred bi-directionally between the second marching-vector register files $22v_{-21}, 22v_{-22}, \ldots, 22v_{-2q}$ and the second arithmetic pipelines $117_{-21}, 117_{-22}, 117_{-2}$. Furthermore, the data stored in the second marching-vector register files $22v_{-21}, 22v_{-22}, \ldots, 22v_{-2q}$ are sent out to the second marching cache memories $21_{-21}, 21_{-22}, \ldots, 21_{-2q}$ so that data are transferred bi-directionally between the second marching cache memories $21_{-21}, 21_{-22}, \ldots, 21_{-2}$, and the second marching-vector register files $22v_{-21}, 22v_{-22}, \ldots, 22v_{-2q}$, and the data stored in the second marching cache memories $21_{-21}, 21_{-22}, \ldots, 21_{-2q}$ are sent out to the second branched-marching main memory $31_{-2}$ so that data are transferred bi-directionally between the second branched-marching main memory $31_{-2}$ and the second marching cache memories $21_{-21}, 21_{-22}, \ldots, 21_{-2q}$. However, the FPGA controls the movement of instructions such that there is no flow along the opposite direction of the information to be processed in the second processing unit $12_{-2}$.

For example, vector instructions generated from loops in a source program are transferred from the mother marching main memory 31 to the first processing unit $12_{-1}$, the second processing unit $12_{-2}$, the third processing unit $12_{-3}$, ... in parallel, so that parallel processing of these vector instructions can be executed by arithmetic pipelines $117_{-11}, 117_{-12}, \ldots, 117_{-1p}, 117_{-21}, 117_{-22}, \ldots, 117_{-2q}, \ldots$ in each of the first processing unit $12_{-1}$, the second processing unit $12_{-2}$, the third processing unit $12_{-3}, \ldots$ Although the current FPGA-controlled HPC system requires a large amount of wiring resources, which generate time delay and stray capacitances between these wires, contributing the bottleneck, in the HPC system of the fourth embodiment shown in FIG. 42, because there are no buses such as data bus and address bus for any data exchange between the first marching-vector register files $22v_{-11}, 22v_{-12}, \ldots, 22v_{-1p}$ and the first arithmetic pipelines $117_{-11}, 117_{-12}, \ldots, 117_{-1p}$, between the first marching cache memories $21_{-11}, 21_{-12}, \ldots, 21_{-1p}$ and the first marching-vector register files $22v_{-11}, 22v_{-12}, \ldots, 22v_{-1p}$, between the first branched-marching main memory $31_{-1}$ and the first marching cache memories $21_{-11}, 21_{-12}, \ldots, 21_{-1p}$, between the second marching-vector register files $22v_{-21}, 22v_{-22}, \ldots, 22v_{-2q}$, and the second arithmetic pipelines $117_{-21}, 117_{-22}, \ldots, 117_{-2q}$, between the second marching cache memories $21_{-21}, 21_{-22}, \ldots, 21_{-2q}$ and the second marching-vector register files $22v_{-21}, 22v_{-22}, \ldots, 22v_{-2q}$, between the second branched-marching main memory $31_{-2}$ and the second marching cache memories $21_{-21}, 21_{-22}, \ldots, 21_{-2q}$ between the mother marching main memory $31_{-0}$ and the first branched-marching main memory $31_{-1}$, and between the mother marching main memory $31_{-0}$ and the second branched-marching main memory $31_{-2}$, the FPGA-controlled HPC system shown in FIG. 42 can achieve much higher processing speed and lower power consumption than the current FPGA-controlled HPC system. By increasing the number of processing units $12_{-1}, 12_{-2}, 12_{-3}, \ldots$, the FPGA-controlled HPC system pertaining to the fourth embodiment can execute, for example, thousands of threads or more simultaneously at very high speed, enabling high computational throughput across large amounts of data.

Fifth Embodiment

Figure 43:
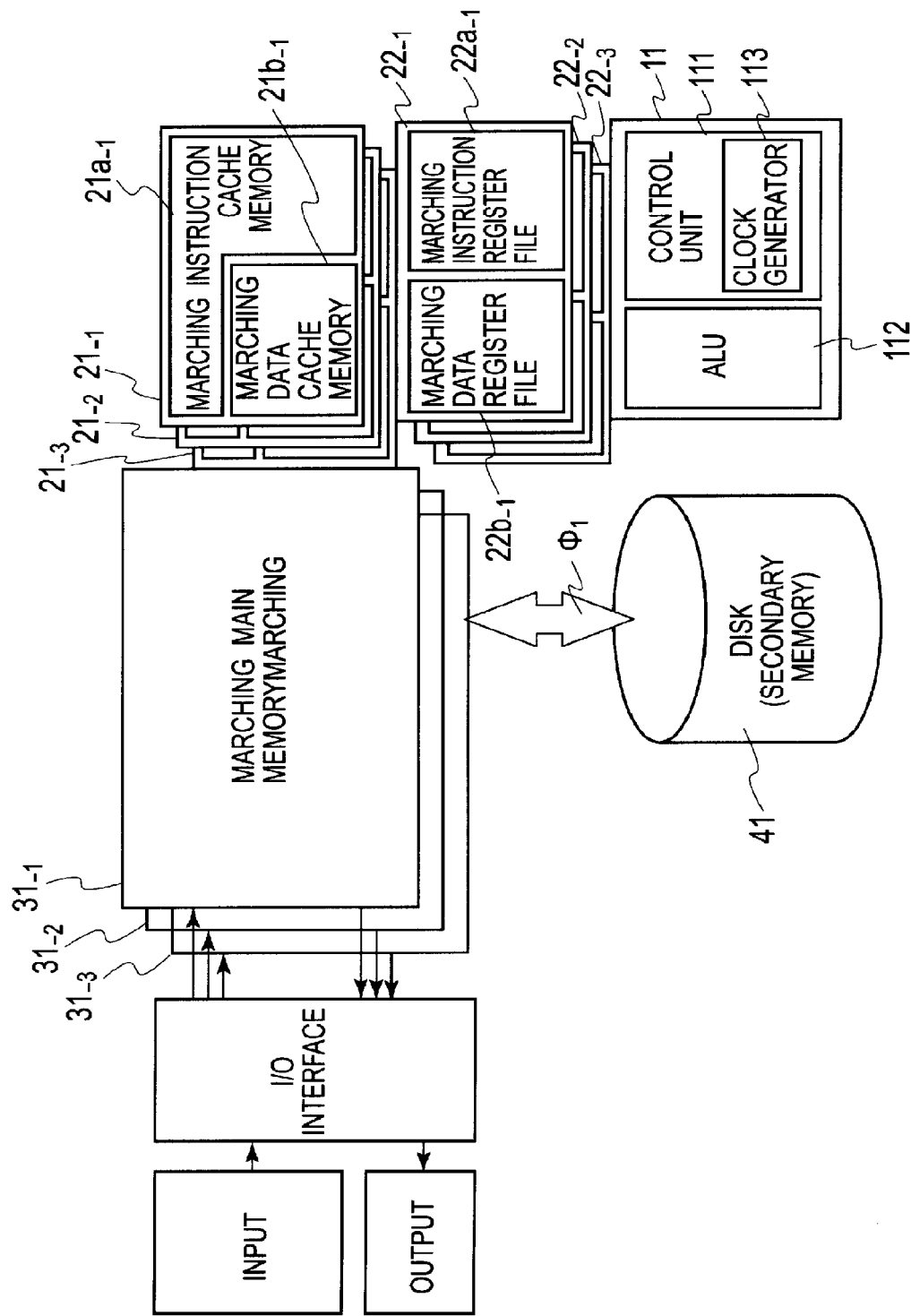
FIG. 43 illustrates a schematic block diagram showing an organization of a computer system pertaining to a fifth embodiment of the present invention.
Figure 44A:
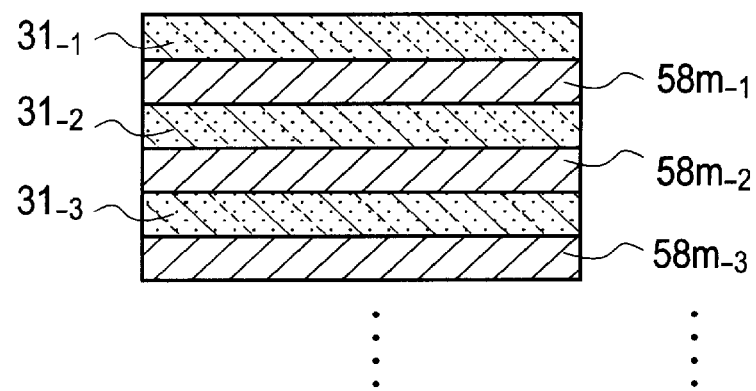
FIG. 44(a) illustrates a cross-sectional view of a three-dimensional marching main memory used in the computer system pertaining to the fifth embodiment of the present invention.
Figure 44B:
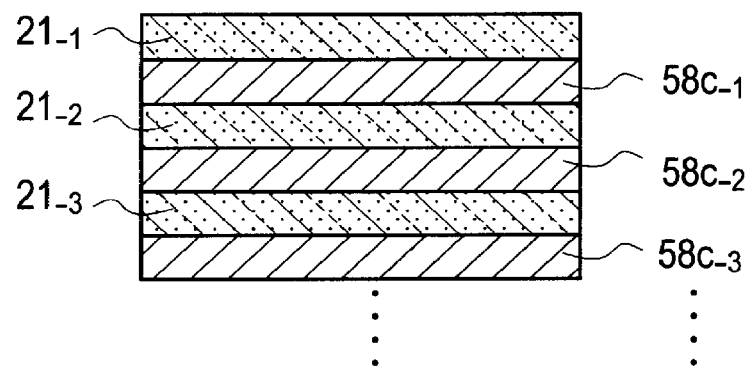
FIG. 44(b) illustrates a cross-sectional view of a three-dimensional marching-cache used in the computer system pertaining to the fifth embodiment of the present invention.
Figure 44C:
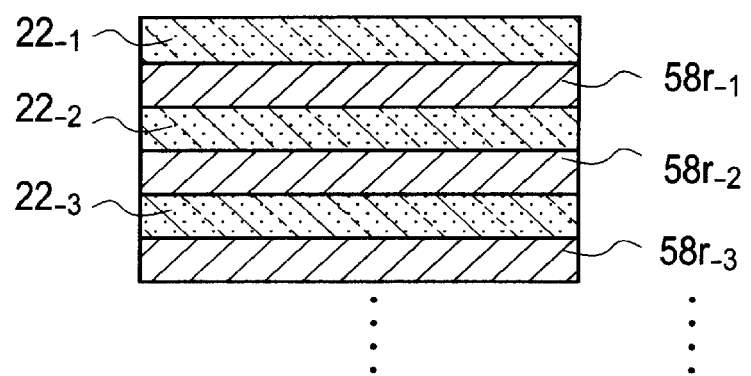
FIG. 44(c) illustrates a cross-sectional view of a three-dimensional marching-register file used in the computer system pertaining to the fifth embodiment of the present invention.

As shown in FIG. 43, a computer system pertaining to a fifth embodiment of the present invention encompasses a processor 11, a stack of marching-register files $22_{-1}, 22_{-2}, 22_{-3}, \ldots$, implementing a three-dimensional marching-register file connected to the processor 11, a stack of marching-cache memories $21_{-1}, 21_{-2}, 21_{-3}, \ldots$, implementing a three-dimensional marching-cache memory connected to the three-dimensional marching-register file $(22_{-1}, 22_{-2}, 22_{-3}, \ldots)$, and a stack of marching main memories $31_{-1}, 31_{-2}, 31_{-3}, \ldots$, implementing a three-dimensional marching main memory connected to the three-dimensional marching-cache $(21_{-1}, 21_{-2}, 21_{-3}, \ldots)$ The processor 11 includes a control unit 111 having a clock generator 113 configured to generate a clock signal, an arithmetic logic unit (ALU) 112 configured to execute arithmetic and logic operations synchronized with the clock signal.

In the three-dimensional marching-register file $(22_{-1}, 22_{-2}, 22_{-3}, \ldots)$, a first marching-register file $22_{-1}$ includes a first marching-instruction register file $22a_{-1}$ connected to the control unit 111 and a first marching-data register file $22b_{-1}$ connected to the ALU 112, a second marching-register file $22_{-2}$ includes a second marching-instruction register file connected to the control unit 111 and a second marching-data register file connected to the ALU 112, a third marching-register file $22_{-3}$ includes a third marching-instruction register file connected to the control unit 111 and a third marching-data register file connected to the ALU 112, and, .... In the three-dimensional marching-cache $(21_{-1}, 21_{-2}, 21_{-3}, \ldots)$, the first marching-cache memory $21_{-1}$ includes a first marching-instruction cache memory $21a_{-1}$ and a first marching-data cache memory $21b_{-1}$, the second marching-cache memory $21_{-2}$ includes a second marching-instruction cache memory and a second marching-data cache memory, the third marching-cache memory $21_{-3}$ includes a third marching-instruction cache memory and a third marching-data cache memory, and ....

Although the illustration is omitted, very similar to the marching main memory 31 shown in FIGS. 24-30, each of the marching main memories $21_{-1}, 21_{-2}, 21_{-3}, \ldots$, has a two-dimensional array of memory units each having a unit of information, input terminals of the main memory array and output terminals of the main memory array, each of the marching main memories $21_{-1}, 21_{-2}, 21_{-3}, \ldots$, stores the information in each of memory units and to transfer synchronously with the clock signal, step by step, toward the output terminals of the main memory array, so as to provide the three-dimensional marching-cache $(21_{-1}, 21_{-2}, 21_{-3}, \ldots)$ with the stored information actively and sequentially, each of the marching-cache memories $21_{-1p}, 21_{-2}, 21_{-3}, \ldots$, has a two-dimensional array of cache memory units, cache input terminals of the marching-cache array configured to receive the stored information from the three-dimensional marching main memory $(31_{-1}, 31_{-2}, 31_{-3}, \ldots)$, and cache output terminals of the marching-cache array, each of the marching-cache memories $21_{-1}, 21_{-2}, 21_{-3}$, stores the information in each of cache memory units and to transfer, synchronously with the clock signal, step by step, the information to an adjacent cache memory unit, so as to provide actively and sequentially the stored information to the three-dimensional marching-register file $(22_{-1}, 22_{-2}, 22_{-3}, \ldots)$, and each of the marching-register files $22_{-1}, 22_{-2}, 22_{-3}, \ldots$, has a two-dimensional array of register units each having a unit of information, input terminals of the register array configured to receive the stored information from the three-dimensional marching-cache $(21_{-1}, 21_{-2}, 21_{-3}, \ldots)$, and output terminals of the register array, each of the marching-register files $22_{-1}, 22_{-2}, 22_{-3}, \ldots$, stores the information in each of register units and to transfer synchronously with the clock signal, step by step, toward the output terminals of the register array, so as to provide the processor 11 with the stored information actively and sequentially so that the processor 11 can execute the arithmetic and logic operations with the stored information.

Each of the marching main memories $31_{-1}$, $31_{-2}$, $31_{-3}$, . . . , is implemented by the two-dimensional array of memory units delineated at a surface of a semiconductor chip, and a plurality of the semiconductor chips are stacked vertically as shown in 27A, sandwiching heat dissipating plates $58m_{-1}$, $58m_{-2}$, $58m_{-3}$, between the plurality of the semiconductor chips so as to implement the three-dimensional marching main memory ($31_{-1}$, $31_{-2}$, $31_{-3}$, . . . ). It is preferable that the heat dissipating plates $58m_{-1}$, $58m_{-2}$, $58m_{-3}$, . . . , are made of materials having high thermal conductivity such as diamond. Similarly, each of the marching-cache memories $21_{-1}$, $21_{-2}$, $21_{-3}$, . . . , is implemented by the two-dimensional array of memory units delineated at a surface of a semiconductor chip, and a plurality of the semiconductor chips are stacked vertically as shown in 27B, sandwiching heat dissipating plates $58c_{-1}$, $58c_{-2}$, $58c_{-3}$, . . . , between the plurality of the semiconductor chips so as to implement the three-dimensional marching-cache ($21_{-1}$, $21_{-2}$, $21_{-3}$, . . . ), and each of the marching-register files $22_{-1}$, $22_{-2}$, $22_{-3}$, . . . , is implemented by the two-dimensional array of memory units delineated at a surface of a semiconductor chip, and a plurality of the semiconductor chips are stacked vertically as shown in 27C, sandwiching heat dissipating plates $58r_{-1}$, $58r_{-2}$, $58r_{-3}$, . . . , between the plurality of the semiconductor chips so as to implement the three-dimensional marching-register file ($22_{-1}$, $22_{-2}$, $22_{-3}$, . . . ). It is preferable that the heat dissipating plates $58c_{-4}$, $58c_{-2}$, $58c_{-3}$, . . . , $58r_{-1}$, $58r_{-2}$, $58r_{-3}$, . . . , are made of materials having high thermal conductivity such as diamond. Because there are no interconnects inside the surfaces of the semiconductor chips in the three-dimensional configuration shown in FIGS. 44(a)-45(c), it is easy to insert the heat dissipating plates $58c_{-1}$, $58c_{-2}$, $58c_{-3}$, . . . , $58c_{-1}$, $58c_{-2}$, $58c_{-3}$, . . . , $58r_{-1}$, $58r_{-2}$, $58r_{-3}$, . . . , between the semiconductor chips, the configuration shown in FIGS. 44(a)-45(c) is expandable to stacking structures with any number of the semiconductor chips. In the conventional architecture, basically there is a limit of the number of stacked semiconductor chips in terms of thermal issues when the conventional semiconductor chips are directly stacked. In the computer system of the fifth embodiment, the sandwich structure shown in FIGS. 44(a)-45(c) is suitable for establishing the thermal flow from active computing semiconductor chips through the heat dissipating plates $58c_{-4}$, $58c_{-2}$, $58c_{-3}$, . . . , $58c_{-4}$, $58c_{-2}$, $58c_{-3}$, . . . , $58r_{-1}$, $58r_{-2}$, $58r_{-3}$, . . . , to outside the system more effectively. Therefore, in the computer system of the fifth embodiment, these semiconductor chips can be stacked proportionally to the scale of the system, and as shown in FIGS. 44(a)-45(c), because a plurality of the semiconductor chips merging the marching main memories $31_{-1}$, $31_{-2}$, $31_{-3}$, . . . , the marching-cache memories $21_{-1}$, $21_{-2}$, $21_{-3}$, . . . , and the marching-register files $22_{-1}$, $22_{-2}$, $22_{-3}$, . . . , could easily be stacked to implement the three-dimensional configuration, a scalable computer systems can be easily organized, thereby keeping the temperature of the system cooler.

Although the illustration is omitted, the three-dimensional marching main memory ($31_{-1}$, $31_{-2}$, $31_{-3}$, . . . ) and the three-dimensional marching-cache ($21_{-1}$, $21_{-2}$, $21_{-3}$, . . . ) are electrically connected by a plurality of joint members, the three-dimensional marching-cache ($21_{-1}$, $21_{-2}$, $21_{-3}$, . . . ) and the three-dimensional marching-register file ($22_{-1}$, $22_{-2}$, $22_{-3}$, . . . ) are electrically connected by a plurality of joint members, and the three-dimensional marching-register file ($22_{-1}$, $22_{-2}$, $22_{-3}$, . . . ) and processor 11 are electrically connected by another plurality of joint members.

The resultant data of the processing in the ALU 112 are sent out to the three-dimensional marching-register file ($22_{-1}$, $22_{-2}$, $22_{-3}$, . . . ) through the joint members so that data are transferred bi-directionally between the three-dimensional marching-register file ($22_{-1}$, $22_{-2}$, $22_{-3}$, . . . ) and the ALU 112. Furthermore, the data stored in the three-dimensional marching-register file ($22_{-1}$, $22_{-2}$, $22_{-3}$, . . . ) are sent out to the three-dimensional marching-cache ($21_{-1}$, $21_{-2}$, $21_{-3}$, . . . ) through the joint members so that data are transferred bi-directionally between the three-dimensional marching-cache ($21_{-1}$, $21_{-2}$, $21_{-3}$, . . . ) and the three-dimensional marching-register file ($22_{-1}$, $22_{-2}$, $22_{-3}$, . . . ). Furthermore, the data stored in the three-dimensional marching-cache ($21_{-1}$, $21_{-2}$, $21_{-3}$, . . . ) are sent out to the three-dimensional marching main memory ($31_{-1}$, $31_{-2}$, $31_{-3}$, . . . ) through the joint members so that data are transferred bi-directionally between the three-dimensional marching main memory ($31_{-1}$, $31_{-2}$, $31_{-3}$, . . . ) and the three-dimensional marching-cache ($21_{-1}$, $21_{-2}$, $21_{-3}$, . . . ).

On the contrary, there is only one way of instruction-flow from the three-dimensional marching main memory ($31_{-1}$, $31_{-2}$, $31_{-3}$, . . . ) to the three-dimensional marching-cache ($21_{-1}$, $21_{-2}$, $21_{-3}$, . . . ), from the three-dimensional marching-cache ($21_{-1}$, $21_{-2}$, $21_{-3}$, . . . ) to the three-dimensional marching-register file ($22_{-1}$, $22_{-2}$, $22_{-3}$, . . . ), and from the three-dimensional marching-register file ($22_{-1}$, $22_{-2}$, $22_{-3}$, . . . ) to the control unit 111. For example, vector instructions generated from loops in a source program are transferred from the three-dimensional marching main memory ($31_{-1}$, $31_{-2}$, $31_{-3}$, . . . ) to the control unit 111 through the three-dimensional marching-cache ($21_{-1}$, $21_{-2}$, $21_{-3}$, . . . ) through the three-dimensional marching-cache ($21_{-1}$, $21_{-2}$, $21_{-3}$, . . . ) and the three-dimensional marching-register file ($22_{-1}$, $22_{-2}$, $22_{-3}$, . . . ) so that each of these vector instructions can be executed by arithmetic pipelines in the control unit 111.

In the computer system of the fifth embodiment shown in FIG. 43, there are no buses such as the data bus and address bus in any data exchange between the three-dimensional marching main memory ($31_{-1}$, $31_{-2}$, $31_{-3}$, . . . ) and the three-dimensional marching-cache ($21_{-1}$, $21_{-2}$, $21_{-3}$, . . . ), between the three-dimensional marching-cache ($21_{-1}$, $21_{-2}$, $21_{-3}$, . . . ) and the three-dimensional marching-register file ($22_{-1}$, $22_{-2}$, $22_{-3}$, . . . ), and between the three-dimensional marching-register file ($22_{-1}$, $22_{-2}$, $22_{-3}$, and the processor 11, while the wires or the buses implement the bottleneck in the conventional computer system. As there are no global wires, which generate time delay and stray capacitances between these wires, the computer system of the fifth embodiment can achieve much higher processing speed and lower power consumption than the conventional computer system, keeping the temperature of the computer system at lower temperature than the conventional computer system so as to establish "a cool computer", by employing the heat dissipating plates $58c_{-1}$, $58c_{-2}$, $58c_{-3}$, $58c_{-1}$, $58c_{-2}$, $58c_{-3}$, . . . , $58r_{-1}$, $58r_{-2}$, $58r_{-3}$, . . . , which are made of materials having high thermal conductivity such as diamond and disposed between the semiconductor chips. The cool computer pertaining to the fifth embodiment is different from existing computers because the cool computer is purposely architected and designed with an average of 30% less energy consumption and 10000% less size to obtain 100 times higher speed, for example.

Since other functions, configurations, way of operation of the computer system pertaining to the fifth embodiment are substantially similar to the functions, configurations, way of operation already explained in the first to third embodiments, overlapping or redundant description may be omitted.

(Miscellaneous Three-Dimensional Configurations)

The three-dimensional configurations shown in FIGS. 43, 44(a), 44(b) and 44(c) are mere examples, and there are various ways and combinations how to implement three-dimensional configurations so as to facilitate the organization of a scalable computer system.

Figure 45:
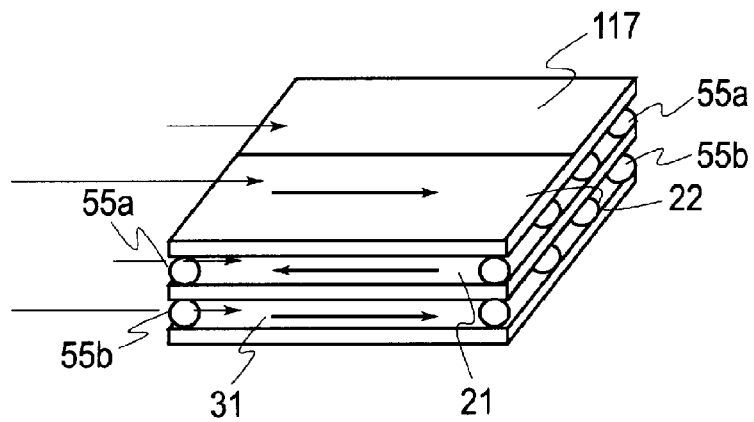
FIG. 45 illustrates a perspective view of a three-dimensional configuration used in the computer system pertaining to the fifth embodiment of the present invention.

For example, as shown in FIG. 45, a first chip (top chip) merging a plurality of arithmetic pipelines 117 and a plurality of marching-register files 22, a second chip (middle chip) merging a marching-cache memory 21 and a third chip (bottom chip) merging a marching main memory 31 can be stacked vertically. Each of the arithmetic pipelines 117 may include a vector-processing unit, and each of the marching-register files 22 may include marching-vector registers. Between the first and second chips, a plurality of joint members 55a are inserted, and between the second and third chips, a plurality of joint members 55b are inserted. For example, each of joint members 55a and 55b may be implemented by an electrical conductive bump such as a solder ball, a gold (Au) bump, a silver (Ag) bump, a copper (Cu) bump, a nickel-gold (Ni—Au) alloy bump or a nickel-gold-indium (Ni—Au—In) alloy bump. Although the illustration is omitted, heat-dissipating plates can be inserted between the first and second chips and between the second and third chips so as to achieve "cool chips", similar to the configuration shown in FIGS. 44(a)-45(c).

Figure 46:
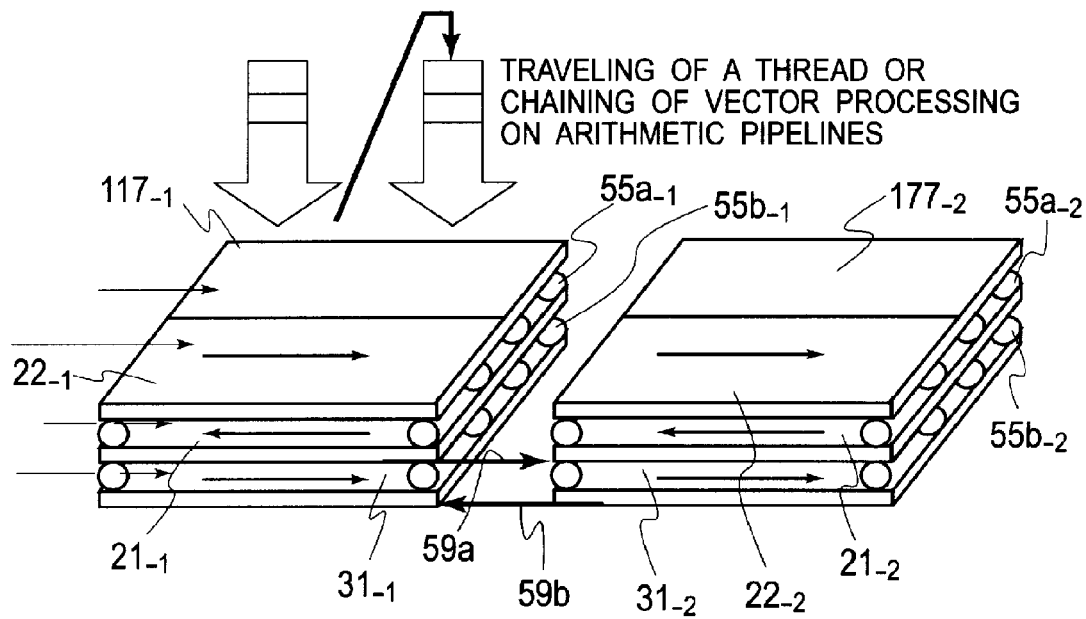
FIG. 46 illustrates a perspective view of another three-dimensional configuration used in the computer system pertaining to the fifth embodiment of the present invention.
Figure 47:
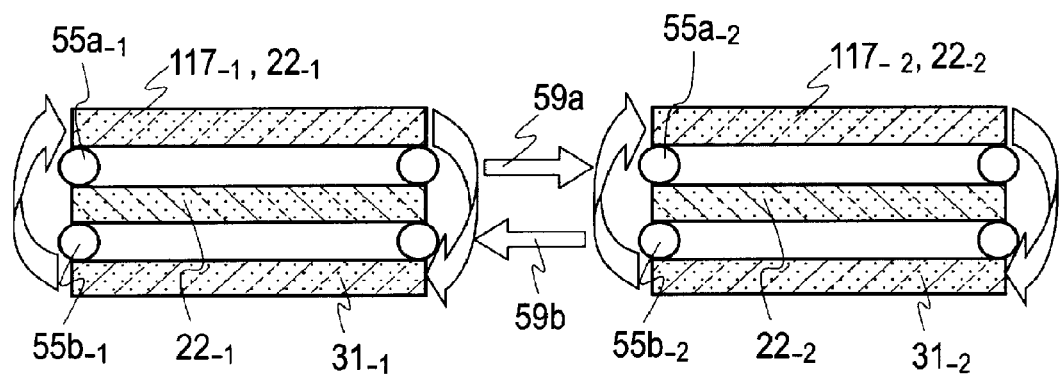
FIG. 47 illustrates a cross-sectional view of the three-dimensional configuration shown in FIG. 46.

Alternatively, as shown in FIGS. 46 and 47, a first three-dimensional (3D)-stack embracing a first top chip, a first middle chip and first bottom chip and a second 3D-stack embracing a second top chip, a second middle chip and second bottom chip may be disposed two dimensionally on a same substrate or a same circuit board so as to implement a parallel computing with multiple processors, in which the first 3D-stack and the second 3D-stack are connected by bridges 59a and 59b.

In the first 3D-stack, a first top chip merging a plurality of first arithmetic pipelines $117_{-1}$ and a plurality of first marching-register files $22_{-1}$, a first middle chip merging a first marching-cache memory $21_{-1}$ and a first bottom chip merging a first marching main memory $31_{-1}$ are 3D-stacked vertically. Each of the first arithmetic pipelines $117_{-1}$ may include a vector-processing unit, and each of the first marching-cache files $22_{-1}$ may include marching-vector registers. Between the first top and first middle chips, a plurality of joint members $55a_{-1}$ are inserted, and between the first middle and first bottom chips, a plurality of joint members $55b_{-1}$ are inserted. For example, each of joint members $55a_{-1}$ and $55b_{-1}$ may be implemented by an electrical conductive bump such as a solder ball, a gold (Au) bump, a silver (Ag) bump, a copper (Cu) bump, a nickel-gold (Ni—Au) alloy bump or a nickel-gold-indium (Ni—Au—In) alloy bump. Similarly, in the second 3D-stack, a second top chip merging a plurality of second arithmetic pipelines $117_{-2}$ and a plurality of second marching-register files $22_{-2}$, a second middle chip merging a second marching-cache memory $21_{-2}$ and a second bottom chip merging a second marching main memory $31_{-2}$ are 3D-stacked vertically. Each of the second arithmetic pipelines $117_{-2}$ may include a vector-processing unit, and each of the second marching-cache files $22_{-2}$ may include marching-vector registers. Between the second top and second middle chips, a plurality of joint members $55a_{-2}$ are inserted, and between the second middle and second bottom chips, a plurality of joint members $55b_{-2}$ are inserted. For example, each of joint members $55a_{-2}$ and $55b_{-2}$ may be implemented by an electrical conductive bump such as a solder ball, a gold (Au) bump, a silver (Ag) bump, a copper (Cu) bump, a nickel-gold (Ni—Au) alloy bump or a nickel-gold-indium (Ni—Au—In) alloy bump. Although the illustration is omitted, heat-dissipating plates can be inserted between the first top and first middle chips, between the first middle and first bottom chips, between the second top and second middle chips and between the second middle and second bottom chips similar to the configuration shown in FIGS. 44(a)-45(c) so as to achieve "cool chips".

Similar to the computer system of the fourth embodiment, a field programmable gate array (FPGA) may switch-control the operations of the first and second 3D-stacks, by traveling a thread or chaining of vector processing on the first arithmetic pipelines $117_{-1}$ and the second arithmetic pipelines $117_{-2}$, implementing a HPC system, which can be used for GPU-based general-purpose computing.

Figure 48:
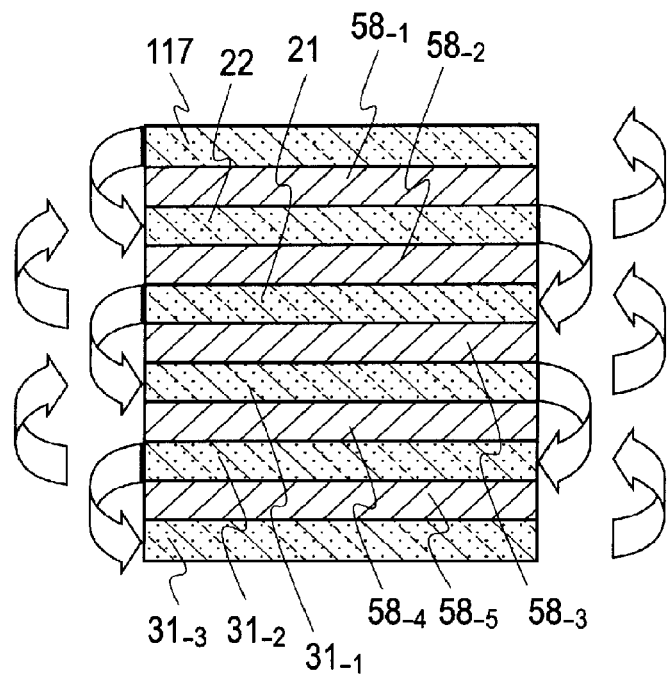
FIG. 48 illustrates a cross-sectional view of another three-dimensional configuration used in the computer system pertaining to the fifth embodiment of the present invention.

Still alternatively, as shown in FIG. 48, a first chip (top chip) merging a plurality of arithmetic pipelines 117, a second chip merging and a plurality of marching-register files 22, a third chip merging a marching-cache memory 21, a fourth chip merging a first marching main memory $31_{-1}$, a fifth chip merging a marching main memory $31_{-2}$ and a sixth chip (bottom chip) merging a third marching main memory $31_{-3}$ can be stacked vertically. Each of the arithmetic pipelines 117 may include a vector-processing unit, and each of the marching-register files 22 may include marching-vector registers so that vector instructions generated from loops in a source program can be executed in the vector-processing unit. A first heat dissipating plate $58_{-1}$ is inserted between the first and second chips, a second heat dissipating plate $58_{-2}$ is between the second and third chips, a third heat dissipating plate $58_{-1}$ is between the third and fourth chips, a fourth heat dissipating plate $58_{-4}$ is between the fourth and fifth chips, and a fifth heat dissipating plate $58_{-5}$ is between the fifth and sixth chips so as to achieve "cool chips". Because there are no interconnects inside the surfaces of these cool chips in the three-dimensional configuration shown in FIG. 48, it is easy to insert the heat dissipating plates $58_{-1}$, $58_{-2}$, $58_{-3}$, $58_{-4}$, $58_{-5}$ such as diamond chips between these six chips alternately.

The cool-chip-configuration shown in FIG. 48 is not limited to a case of six chips, but expandable to three-dimensional stacking structures with any number of chips, because the sandwich structure shown in FIG. 48 is suitable for establishing the thermal flow from active computing chips through the heat dissipating plates $58_{-1}$, $58_{-2}$, $58_{-3}$, $58_{-4}$, $58_{-5}$ to outside of the cool computer system more effectively. Therefore, the number of cool chips in the computer system of the fifth embodiment can be increased in proportion to the scale of the computer system.

Figure 49:
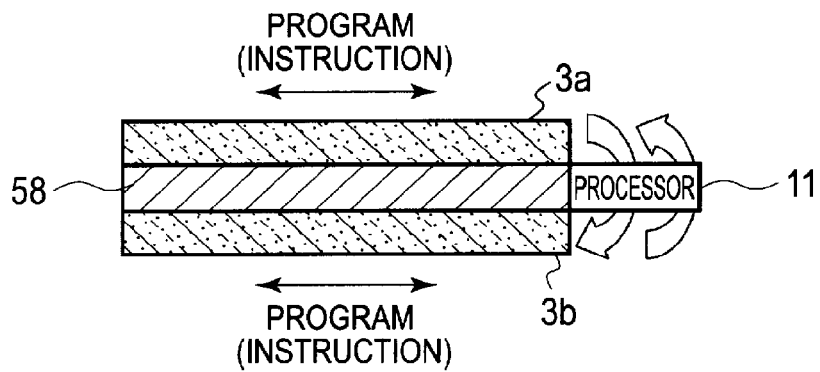
FIG. 49 illustrates schematically a cross-sectional view of the three-dimensional configuration of a fundamental core of the computer system for executing the control processing, by representing control paths in the computer system pertaining to the fifth embodiment of the present invention.
Figure 50:
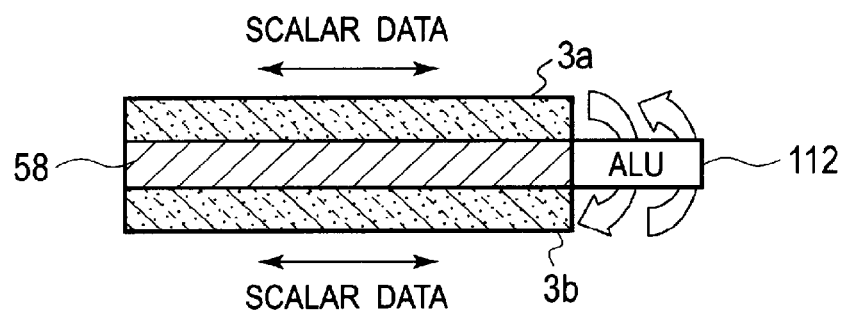
FIG. 50 illustrates schematically a cross-sectional view of the three-dimensional configuration of a fundamental core of the computer system for executing the scalar data processing, by representing data-paths for scalar data in the computer system pertaining to the fifth embodiment of the present invention.
Figure 51:
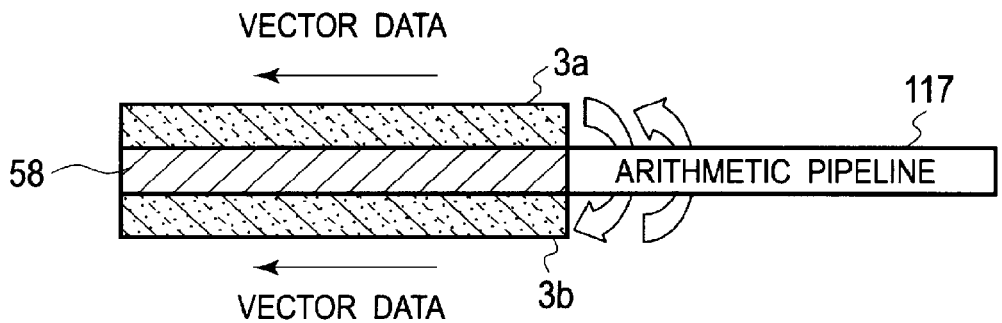
FIG. 51 illustrates schematically a cross-sectional view of the three-dimensional configuration of a fundamental core of the computer system for executing the vector/streaming data processing, by representing data-paths for vector/streaming data in the computer system pertaining to the fifth embodiment of the present invention.

FIGS. 49-51 show various examples of the three-dimensional (3D) stack, implementing a part of fundamental cores of the computer systems according to the fifth embodiment of the present invention, each of the 3D-stacks includes cooling technology with heat dissipating plate 58 such as diamond plate inserted between the semiconductor memory chips 3a and 3b, in which at least one of the marching memory classified in the marching memory family is merged, the term of "the marching memory family" includes the marching-instruction register file 22a and the marching-data register file 22b connected to the ALU 112 explained in the second embodiment, and the marching-instruction cache memory 21a and the marching-data cache memory 21b explained in the third embodiment, in addition to the marching main memory 31 explained in the first embodiment of the present invention.

That is, as shown in FIG. 49, a 3D-stack, implementing a part of the fundamental core of the computer system pertaining to the fifth embodiment of the present invention, embraces a first semiconductor memory chip 3a merging at least one of the marching memory in the marching memory family, a heat dissipating plate 58 disposed under the first semiconductor memory chip 3a, a second semiconductor memory chip 3b disposed under the heat dissipating plate 58, which merges at least one of the marching memory in the marching memory family, and a processor 11 disposed at a side of the heat dissipating plate 58. Here, in FIG. 49, because the location of the processor 11 is illustrated as one of the examples, the processor 11 can be disposed at any required or appropriate site in the configuration of the 3D-stack or external of the 3D-stack, depending on the design choice of the 3D-stack. For example, the processor 11 can be allocated at the same horizontal level of the first semiconductor memory chip 3a or at the level of the second semiconductor memory chip 3b. The marching memory merged on the first semiconductor memory chip 3a and the marching memory merged on the second semiconductor memory chip 3b stores program instruction, respectively. In the 3D configuration shown in FIG. 49, in which the first semiconductor memory chip 3a, the heat dissipating plate 58 and the second semiconductor memory chip 3b are stacked vertically, a first control path is provided between the first semiconductor memory chip 3a and the processor 11, and a second control path is provided between the second semiconductor memory chip 3b and the processor 11 so as to facilitate the execution of the control processing with the processor 11. A further data-path may be provided between the first semiconductor memory chip 3a and the second semiconductor memory chip 3b so as to facilitate direct communication of the program instruction between the first semiconductor memory chip 3a and the second semiconductor memory chip 3b.

And, as shown in FIG. 50, another 3D-stack, implementing a part of the fundamental core of the computer system pertaining to the fifth embodiment of the present invention, embraces a first semiconductor memory chip 3a merging at least one of the marching memory in the marching memory family, a heat dissipating plate 58 disposed under the first semiconductor memory chip 3a, a second semiconductor memory chip 3b disposed under the heat dissipating plate 58, which merges at least one of the marching memory in the marching memory family, and a ALU 112 disposed at a side of the heat dissipating plate 58. The location of the ALU 112 is not limited to the site illustrated in FIG. 50, and the ALU 112 can be disposed at any required or appropriate site in the configuration of the 3D-stack or external of the 3D-stack, such as a site allocated at the same horizontal level of the first semiconductor memory chip 3a or at the level of the second semiconductor memory chip 3b, depending on the design choice of the 3D-stack. The marching memory merged on the first semiconductor memory chip 3a and the marching memory merged on the second semiconductor memory chip 3b read/write scalar data, respectively. In the 3D configuration shown in FIG. 50, in which the first semiconductor memory chip 3a, the heat dissipating plate 58 and the second semiconductor memory chip 3b are stacked vertically, a first data-path is provided between the first semiconductor memory chip 3a and the ALU 112, and a second data-path is provided between the second semiconductor memory chip 3b and the ALU 112 so as to facilitate the execution of the scalar data processing with the ALU 112. A further data-path may be provided between the first semiconductor memory chip 3a and the second semiconductor memory chip 3b so as to facilitate direct communication of the scalar data between the first semiconductor memory chip 3a and the second semiconductor memory chip 3b.

Further, as shown in FIG. 51, a still another 3D-stack, implementing a part of the fundamental core of the computer system pertaining to the fifth embodiment of the present invention, embraces a first semiconductor memory chip 3a merging at least one of the marching memory in the marching memory family, a heat dissipating plate 58 disposed under the first semiconductor memory chip 3a, a second semiconductor memory chip 3b disposed under the heat dissipating plate 58, which merges at least one of the marching memory in the marching memory family, and an arithmetic pipelines 117 disposed at a side of the heat dissipating plate 58. Similar to the topologies shown in FIGS. 49 and 50, the location of the arithmetic pipelines 117 is not limited to the site illustrated in FIG. 51, and the arithmetic pipelines 117 can be disposed at any required or appropriate site. The marching memory merged on the first semiconductor memory chip 3a and the marching memory merged on the second semiconductor memory chip 3b read/write vector/streaming data, respectively. In the 3D configuration shown in FIG. 51, in which the first semiconductor memory chip 3a, the heat dissipating plate 58 and the second semiconductor memory chip 3b are stacked vertically, a first data-path is provided between the first semiconductor memory chip 3a and the arithmetic pipelines 117, and a second data-path is provided between the second semiconductor memory chip 3b and the arithmetic pipelines 117 so as to facilitate the execution of the vector/streaming data processing with the arithmetic pipelines 117. A further data-path may be provided between the first semiconductor memory chip 3a and the second semiconductor memory chip 3b so as to facilitate direct communication of the vector/streaming data between the first semiconductor memory chip 3a and the second semiconductor memory chip 3b.

Figure 52:
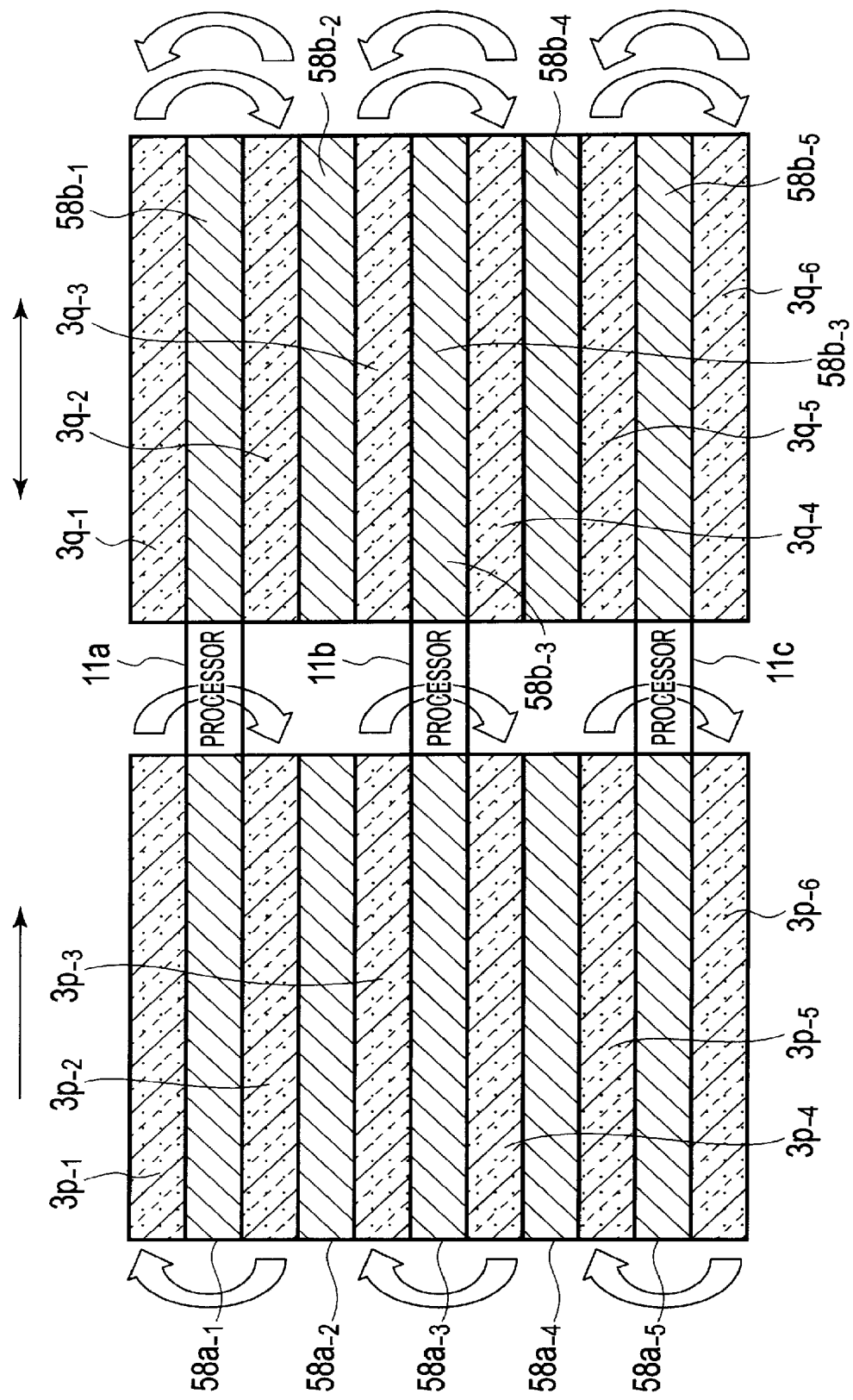
FIG. 52 illustrates schematically a cross-sectional view of the three-dimensional configuration of a fundamental core of the computer system, configured to execute the scalar data part of the computer system, where a plurality of processing units (CPUs) execute not only scalar data but also vector/streaming data, and pipelined ALUs are included in the processing units, by representing the combination of scalar data-path and the control path for the computer system pertaining to the fifth embodiment of the present invention.

As shown in FIG. 52, the 3D hybrid computer system according to the fifth embodiment encompasses a first left chip (top left chip) $3p_{-1}$ merging at least one of the marching memory in the marching memory family, a second left chip $3p_{-2}$ merging at least one of the marching memory in the marching memory family, a third left chip $3p_{-3}$ merging at least one of the marching memory in the marching memory family, a fourth left chip $3p_{-4}$ merging at least one of the marching memory in the marching memory family, a fifth left chip $3p_{-5}$ merging at least one of the marching memory in the marching memory family and a sixth left chip (bottom left chip) $3p_{-6}$ merging at least one of the marching memory in the marching memory family, which are stacked vertically. A first left heat dissipating plate $58a_{-1}$ is inserted between the first left chip $3p_{-1}$ and second left chip $3p_{-2}$, a second left heat dissipating plate $58a_{-2}$ is inserted between the second left chip $3p_{-2}$ and third left chip $3p_{-3}$, a third left heat dissipating plate $58a_{-1}$ is inserted between the third left chip $3p_{-3}$ and fourth left chip $3p_{-4}$, a fourth left heat dissipating plate $58a_{-1}$ is inserted between the fourth left chip $3p_{-4}$ and fifth left chip $3p_{-5}$, and a fifth left heat dissipating plate $58a_{-5}$ is inserted between the fifth left chip $3p_{-5}$ and sixth left chip $3p_{-6}$ so as to achieve "cool left chips".

And, a first right chip (top right chip) $3q_{-1}$ merging at least one of the marching memory in the marching memory family, a second right chip $3q_{-2}$ merging at least one of the marching memory in the marching memory family, a third right chip $3q_{-3}$ merging at least one of the marching memory in the marching memory family, a fourth right chip $3q_{-4}$ merging at least one of the marching memory in the marching memory family, a fifth right chip $3q_{-5}$ merging at least one of the marching memory in the marching memory family and a sixth right chip (bottom right chip) $3q_{-6}$ merging at least one of the marching memory in the marching memory family are stacked vertically. A first right heat dissipating plate $58b_{-1}$ is inserted between the first right chip $3q_{-1}$ and second right chip $3q_{-2}$, a second right heat dissipating plate $58b_{-2}$ is inserted between the second right chip $3q_{-2}$ and third right chip $3q_{-3}$, a third right heat dissipating plate $58b_{-1}$ is inserted between the third right chip $3q_{-3}$ and fourth right chip $3q_{-4}$, a fourth right heat dissipating plate $58b_{-4}$ is inserted between the fourth right chip $3q_{-4}$ and fifth right chip $3q_{-5}$, and a fifth right heat dissipating plate $58b_{-5}$ is inserted between the fifth right chip 4, and sixth right chip $3q_{-6}$ so as to achieve "cool right chips".

A first processing unit 11a is provided between the first left heat dissipating plate $58a_{-1}$ and the first right heat dissipating plate $58b_{-1}$, a second processing unit 11b is provided between the third left heat dissipating plate $58a_{-3}$ and the third right heat dissipating plate $58b_{-3}$, and a third processing unit 11c is provided between the fifth left heat dissipating plate 58a, and the fifth right heat dissipating plate $58b_{-5}$, and pipelined ALUs are respectively included in the processing units 11a, 11b, 11c.

The scalar data-path and control path are established between the first left chip $3p_{-1}$ and second left chip $3p_{-2}$, the scalar data-path and control path are established between the second left chip $3p_{-2}$ and third left chip $3p_{-3}$, the scalar data-path and control path are established between the third left chip $3p_{-3}$ and fourth left chip $3p_{-4}$, the scalar data-path and control path are established between the fourth left chip $3p_{-4}$ and fifth left chip $3p_{-5}$, and the scalar data-path and control path are established between the fifth left chip $3p_{-5}$ and sixth left chip $3p_{-6}$, the scalar data-path and control path are established between the first right chip $3q_{-1}$ and second right chip $3q_{-2}$, the scalar data-path and control path are established between the second right chip $3q_{-2}$ and third right chip $3q_{-3}$, the scalar data-path and control path are established between the third right chip $3q_{-3}$ and fourth right chip $3q_{-4}$, the scalar data-path and control path are established between the fourth right chip $3q_{-4}$ and fifth right chip $3q_{-2}$, and the scalar data-path and control path are established between the fifth right chip $3q$, and sixth right chip $3q_{-6}$. The 3D computer system shown in FIG. 52 can execute not only scalar data but also vector/streaming data through the combination of scalar data-path and control path for the computer system.

Because there are no interconnects inside the surfaces of these cool chips in the 3D configuration shown in FIG. 52, it is easy to insert the heat dissipating plates $58a_{-1}$, $58a_{-2}$, $58a_{-3}$, $58a_{-4}$, $58a_{-5}$ such as diamond left chips between these six left chips alternately, and to insert the heat dissipating plates $58b_{-1}$, $58b_{-2}$, $58b_{-3}$, $58b_{-4}$, $58b_{-5}$ such as diamond right chips between these six right chips alternately.

Other Embodiments

Various modifications will become possible for those skilled in the art after receiving the teaching of the present disclosure without departing from the scope thereof.

There are several different forms of parallel computing such as bit-level, instruction level, data, and task parallelism, and as well known as "Flynn's taxonomy", programs and computers are classified as to whether they were operating using a single set or multiple sets of instructions, whether or not those instructions were using a single or multiple sets of data.

Figure 53:
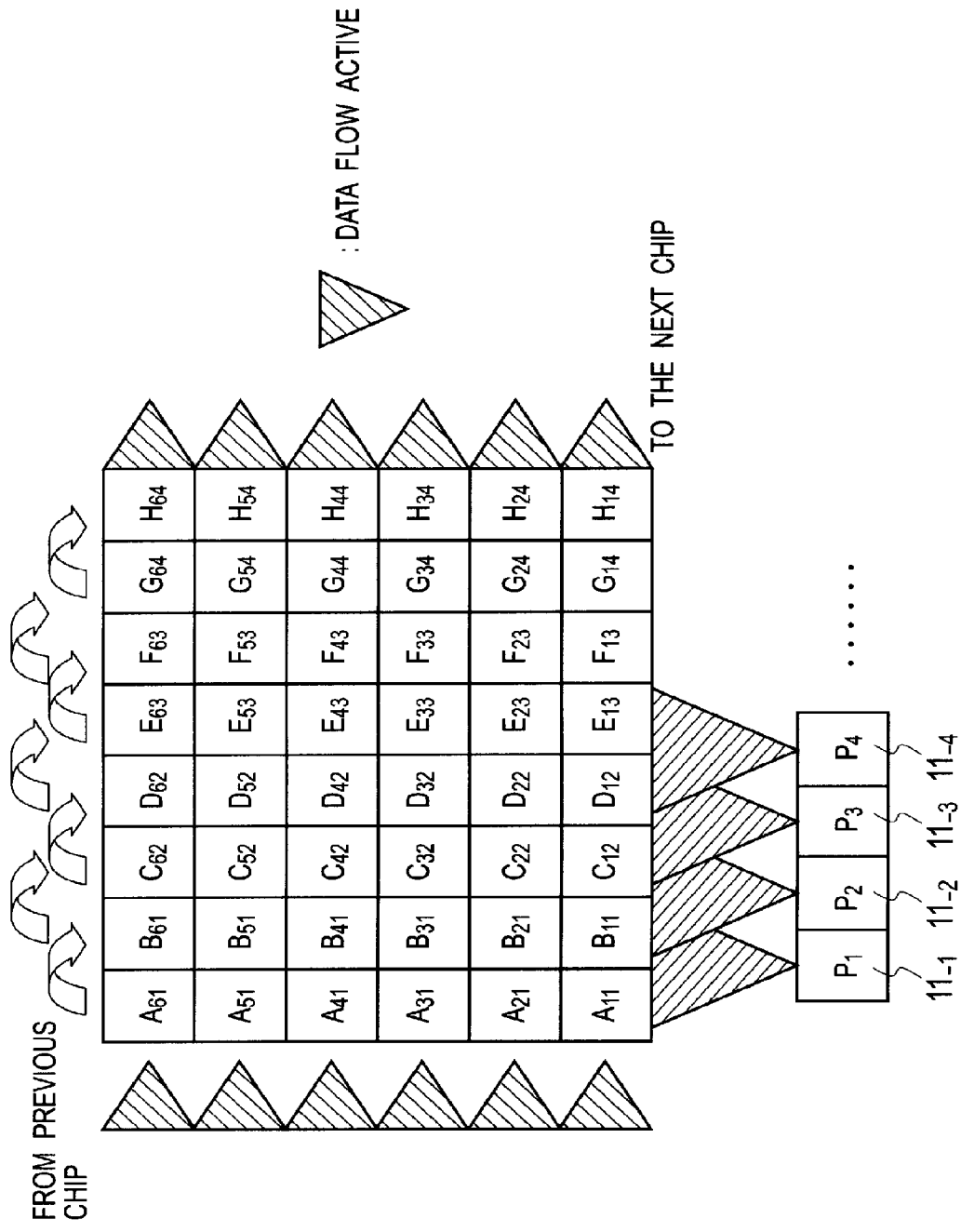
FIG. 53 illustrates a bit-level parallel processing of scalar/vector data in MISD architecture.

For example, as shown in FIG. 53, a marching memory, which may include the marching-register file, the marching-cache memory, and the marching main memory already discussed in the first to fifth embodiments can implement a bit-level parallel processing of scalar/vector data in a multiple-instruction-single-data (MISD) architecture, by which many independent instruction streams provided vertically to a first processor $11_{-1}$, a second processor $11_{-2}$, a third processor $11_{-3}$, a fourth processor $11_{-4}$, . . . , in parallel operate on a single horizontal stream of data at a time with a systolic array of processors $11_{-1}$, $11_{-2}$, $11_{-3}$, $11_{-4}$.

Figure 54:
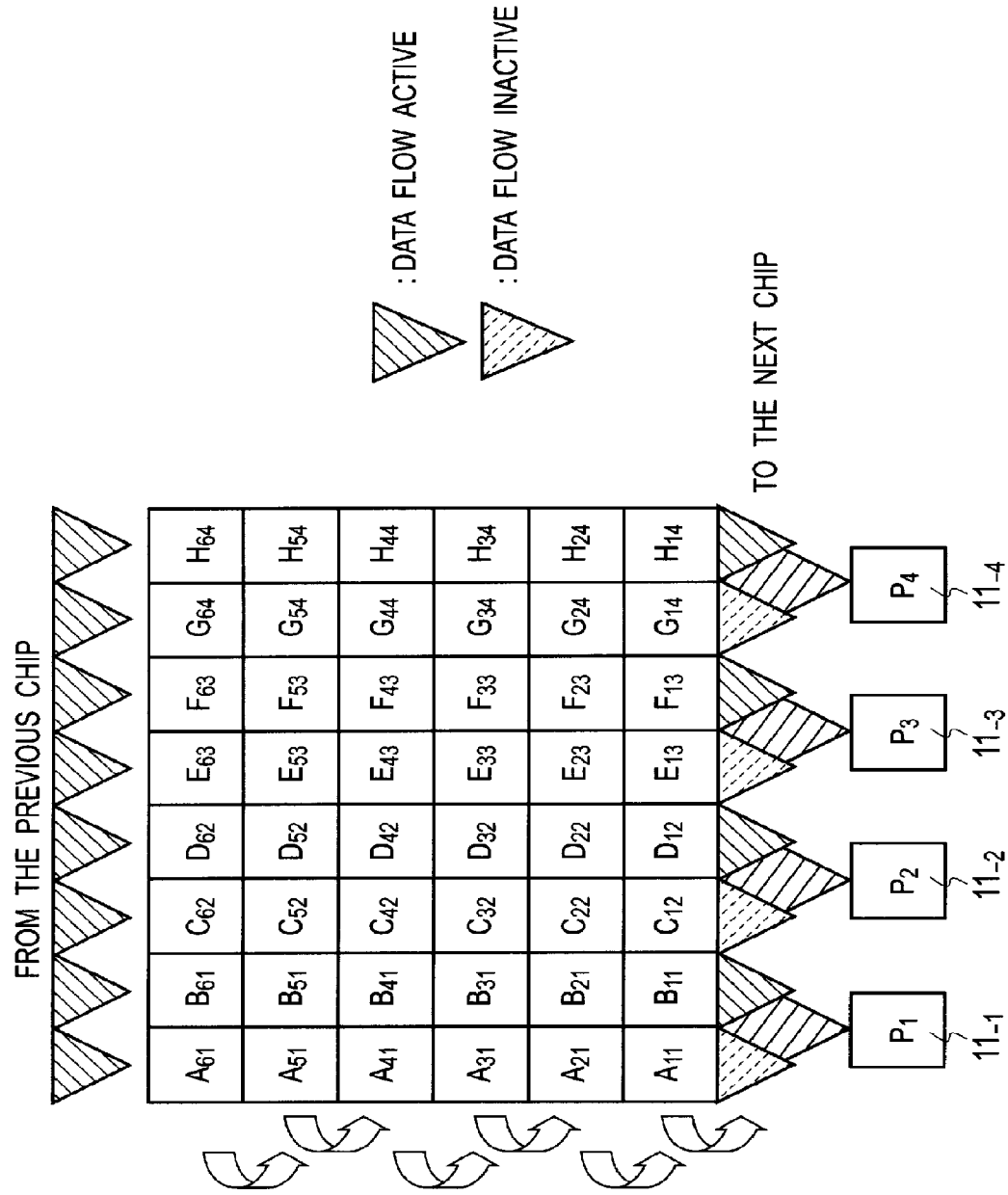
FIG. 54 illustrates a parallel processing of vector data in SIMD architecture.

Alternatively, as shown in FIG. 54, arithmetic-level parallelism can be established by a marching memory, which may include the marching-register file, the marching-cache memory, and the marching main memory already discussed in the first to fifth embodiments, with a single-instruction-multiple-data (SIMD) architecture, by which a single instruction stream is provided to a first processor $11_{-1}$, a second processor $11_{-2}$, a third processor $11_{-3}$, and a fourth processor $11_{-4}$, so that the single instruction stream can operate on multiple vertical streams of data at a time with the array of processors $11_{-1}$, $11_{-2}$, $11_{-3}$, $11_{-4}$.

Figure 55:
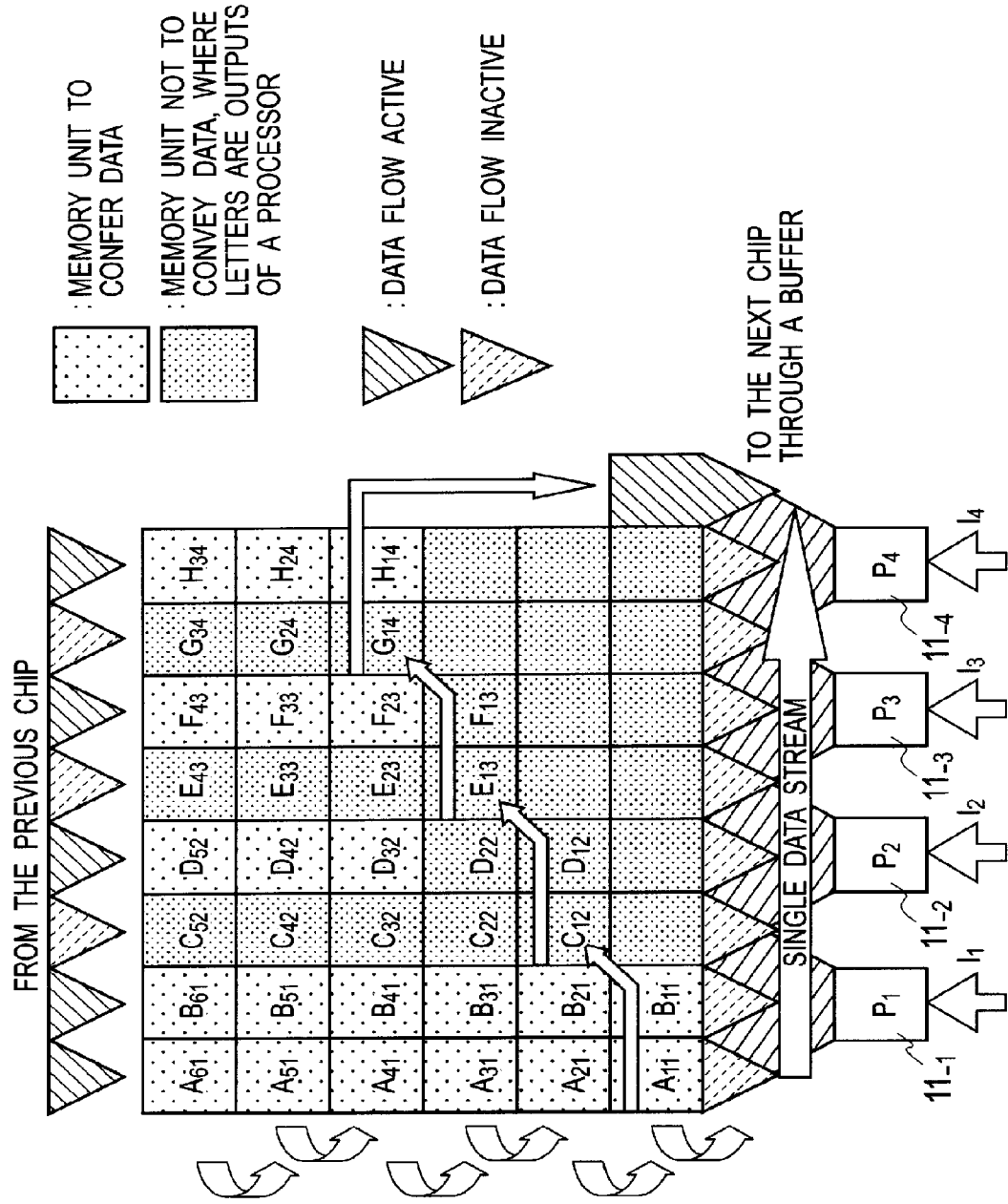
FIG. 55 illustrates a typical chaining in vector processing.

Still alternatively, as shown in FIG. 55, a marching memory, which may include the marching-register file, the marching-cache memory, and the marching main memory already discussed in the first to fifth embodiments, can implement a typical chaining in vector processing with a first processor $11_{-1}$, a second processor $11_{-2}$, a third processor $11_{-3}$, and a fourth processor $11_{-4}$ to which a first instruction $I_1$, a second instruction $I_2$, a third instruction $I_3$, and a fourth instruction $I_4$ are provided respectively.

Figure 56:
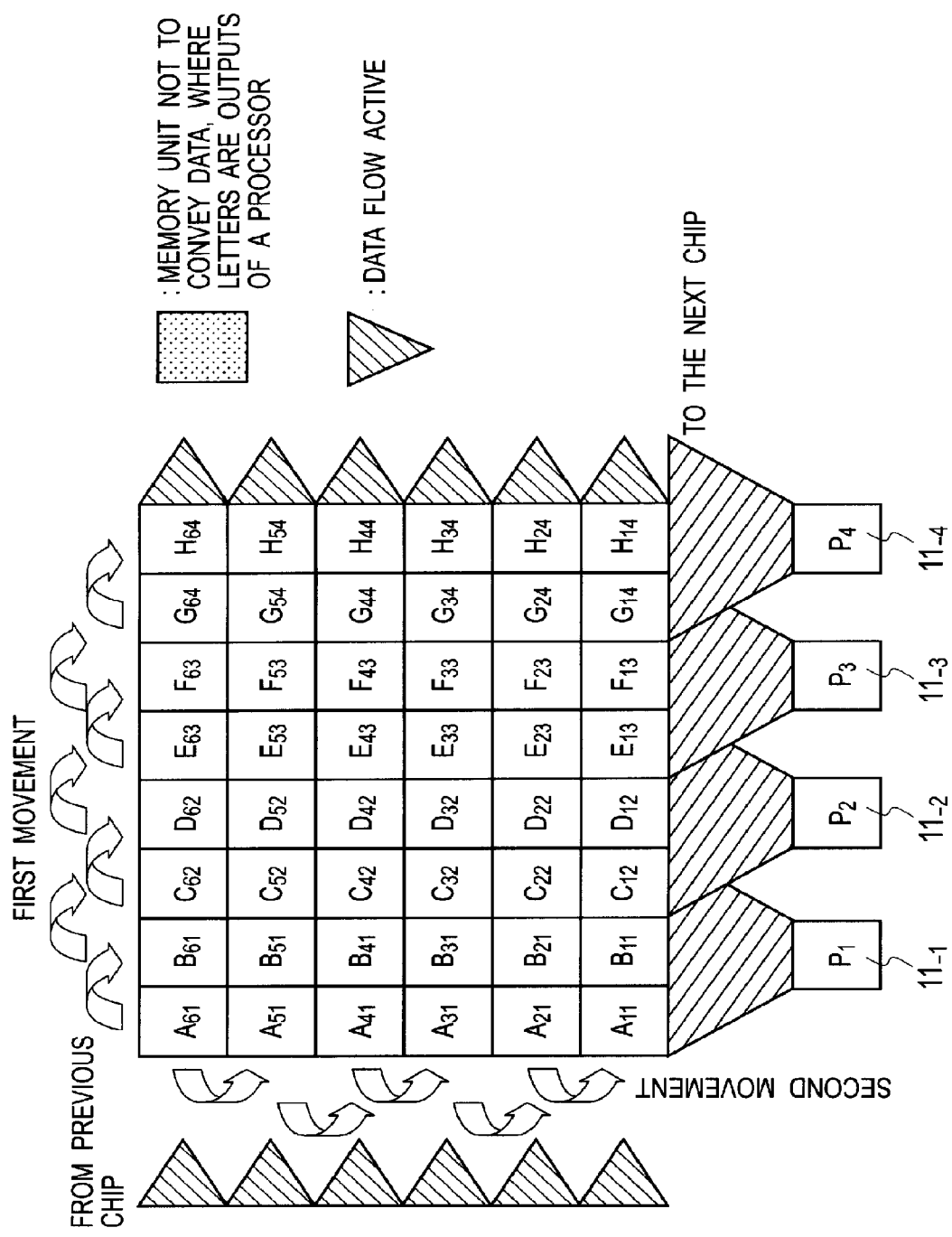
FIG. 56 illustrates a parallel processing of scalar/vector data in MISD architecture.

Furthermore, as shown in FIG. 56, a marching memory, which may include the marching-register file, the marching-cache memory, and the marching main memory already discussed in the first to fifth embodiments, can implement a parallel processing of a single horizontal stream of scalar/vector data in a MISD architecture with a first processor $11_{-1}$, a second processor $11_{-2}$, a third processor $11_{-3}$, and a fourth processor $11_{-4}$.

Figure 57:
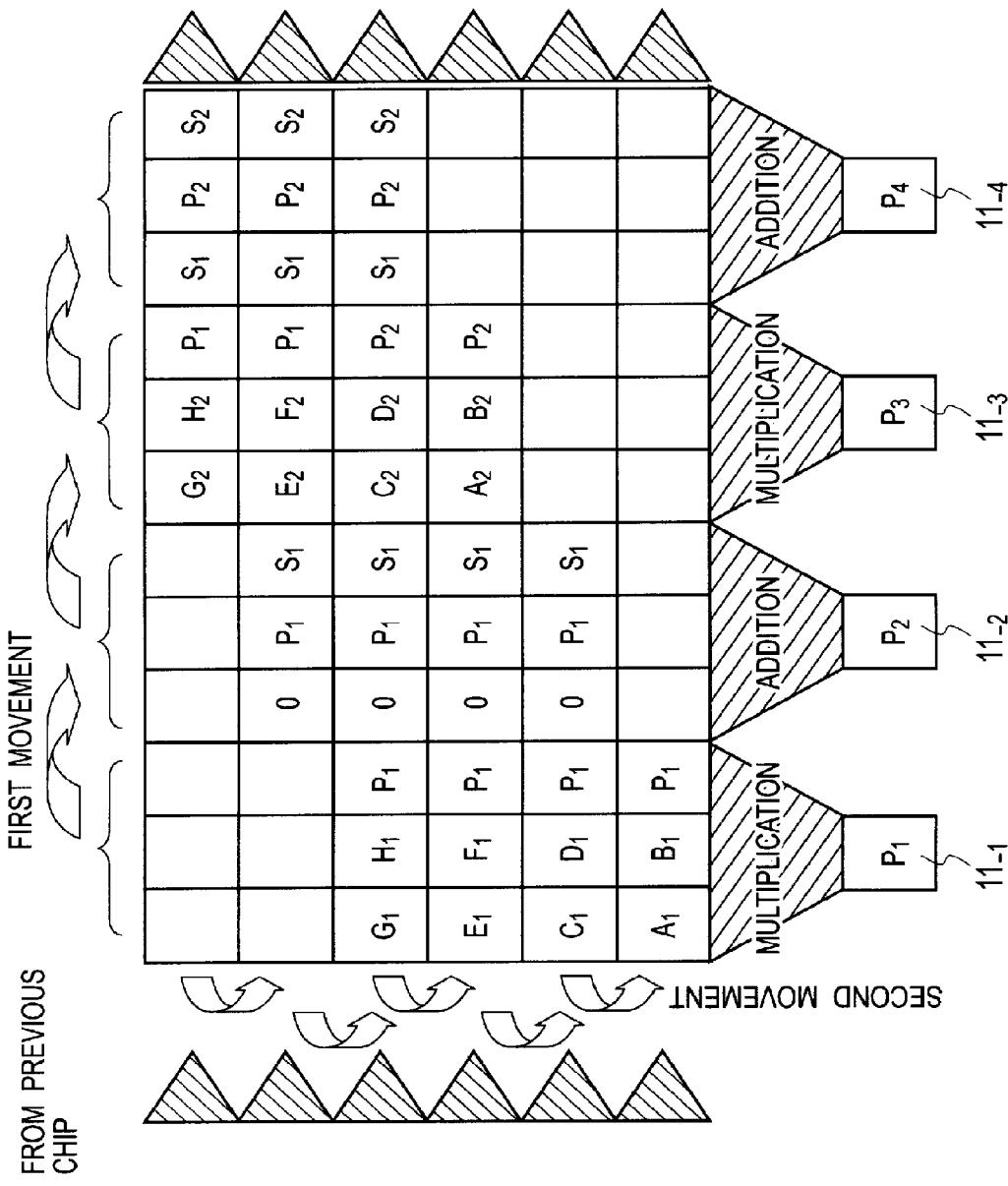
FIG. 57 illustrates a parallel processing of scalar/vector data in MISD architecture.

Furthermore, as shown in FIG. 57, a marching memory, which may include the marching-register file, the marching-cache memory, and the marching main memory already discussed in the first to fifth embodiments, can implement a parallel processing of a single horizontal stream of scalar/vector data in a MISD architecture with a first processor $11_{-1}$ configured execute multiplication, a second processor $11_{-2}$ configured execute addition, a third processor $11_{-3}$ configured execute multiplication, and a fourth processor $11_{-4}$ configured execute addition.

Furthermore, as to process-level parallelism, a single-thread-stream and single-data-stream architecture, a single-thread-stream and multiple-data-streams architecture, a multiple-thread-streams and single-data-stream architecture, and a multiple-thread-streams and multiple-data-streams architecture can be achieved with a marching memory, which may include the marching-register file, the marching-cache memory, and the marching main memory already discussed in the first to fifth embodiments.

Thus, the present invention of course includes various embodiments and modifications and the like, which are not detailed above. Therefore, the scope of the present invention will be defined in the following claims.

INDUSTRIAL APPLICABILITY

The instant invention can be applied to industrial fields of computer systems.

The invention claimed is:

1. A marching main memory adapted for a computer system having a processor and the marching main memory, the processor including a control unit having a clock generator generating a clock signal, and an arithmetic logic unit executing arithmetic and logic operations synchronized with the clock signal, the marching main memory comprising:
- an array of memory units, in which a plurality of the memory units are aligned along a column direction, each of the memory units comprising an array of cells aligned along the column direction, each of the cells storing information, so that each of the memory units can store a unit of information aligned along the column direction, and a plurality of one-dimensional arrangements of the memory units aligned along the column direction are further deployed along a row direction;
- an input-terminal column comprising a plurality of input terminals aligned along the column direction, each of the allocations of the input terminals are respectively assigned to the row positions of the cells in the memory units aligned along the column direction, through the input-terminal column, units of information are fed to the array of cells in each of the memory units aligned along the column direction; and
- an output-terminal column comprising a plurality of output terminals aligned along the column direction, each of the allocations of the output terminals are respectively assigned to the row positions of the cells in the memory units aligned along the column direction, at least a part of the output terminals in the output-terminal column are connected to the arithmetic logic unit,
- wherein the units of information stored in each of the memory units are transferred synchronously with the clock signal in an organized marching fashion in the array of the memory units, toward the output-terminal column, and the stored information is provided in parallel to the processor through the part of the output terminals, and the arithmetic logic unit can execute the arithmetic and logic operations synchronously with the clock signal, with the information being fed sequentially through the part of the output terminals.

2. A computer system comprising:
a processor including:
- a control unit having a clock generator configured to generate a clock signal, and
- an arithmetic logic unit configured to execute arithmetic and logic operations synchronized with the clock signal; and
- a marching main memory comprising an array of memory units, in which a plurality of the memory units are aligned along a column direction, each of the memory units comprising an array of cells aligned along the column direction, each of the cells storing information, so that each of the memory units can store a unit of information aligned along the column direction, and a plurality of one-dimensional arrangements of the memory units aligned along the column direction are further deployed along a row direction,
- wherein the marching main memory further comprises:
  - an input-terminal column comprising a plurality of input terminals aligned along the column direction, each of the allocations of the input terminals are respectively assigned to the row positions of the cells in the memory units aligned along the column direction, through the input-terminal column, units of information are fed to the array of cells in each of the memory units aligned along the column direction; and
  - an output-terminal column comprising a plurality of output terminals aligned along the column direction, each of the allocations of the output terminals are respectively assigned to the row positions of the cells in the memory units aligned along the column direction, at least a part of the output terminals in the output-terminal column are connected to the arithmetic logic unit,
- wherein the units of information stored in each of the memory units are transferred synchronously with the clock signal in an organized marching fashion in the array toward the output-terminal column, and the stored information is provided in parallel to the processor through the part of the output terminals, and the arithmetic logic unit can execute the arithmetic and logic operations synchronously with the clock signal, with the information being fed sequentially through the part of the output terminals, in addition the results of the processing in the arithmetic logic unit are sent out to the marching main memory through the part of the output terminals.

3. The computer system of claim 2, wherein the memory units are arranged two dimensionally on a chip.

4. The computer system of claim 3, wherein a plurality of chips are stacked vertically, sandwiching heat dissipating plates there between, so as to implement a three dimensional memory unit array.

5. The computer system of claim 4, wherein the heat conducting plates are made of diamond.

6. The computer system of claim 3, wherein a first chip merging the vector processing units and the marching-vector registers, a second chip merging the marching-cache memory and a third chip merging the marching main memory are stacked vertically, sandwiching heat dissipating plates there between.

7. The computer system of claim 2, wherein the processor further includes a plurality of arithmetic pipelines configured to receive a flow of the unit of information through the part of the output terminals in the output-terminal column from the marching main memory, synchronously with the clock signal.

8. The computer system of claim 2, wherein the arithmetic logic unit implements a processor core.

9. The computer system of claim 8, wherein the processor includes a plurality of processor cores.

10. The computer system of claim 9, further comprising a marching-cache memory having an array of cache memory units, cache input terminals of the second array configured to receive the stored information from the marching main memory, and cache output terminals of the second array, configured to store information in each of cache memory units and to transfer successively, step by step, the stored information in each of cache memory units to an adjacent cache memory unit, synchronized with the clock signal from the cache memory units adjacent to the cache input terminals toward the cache memory units adjacent to the cache output terminals, so as to provide actively and sequentially the stored information to the processor through the cache output terminals so that the processor cores can operate with the stored information.

11. The computer system of claim 10, further comprising a marching-register file having an array of register file cells, register file input terminals of the array configured to receive the stored information from the marching-cache memory, and register file output terminals of the array, configured to store information in each of register file cells and to transfer successively, step by step, the stored information in each of register file cells to an adjacent register file cell being synchronized with the clock signal from the register file cells adjacent to the register file input terminals toward the register file cells adjacent to the register file output terminals, so as to provide actively and sequentially the stored information to the processor cores through the register file output terminals.

12. The computer system of claim 11, wherein the control unit further has a field programmable gate array configured to switch-control operations of the marching main memory, the marching-cache memory, and the marching-register file.

13. The computer system of claim 12, wherein the marching main memory and the marching-cache memory are merged on a same chip.

14. The computer system of claim 12, wherein the marching-register file and at least one of the processor cores are merged on a same chip.

15. The computer system of claim 2, wherein each of the memory units aligned along the column direction comprises:
   an array of first cells configured to transfer the units of information stored in each of the memory units, synchronously with the clock signal in the organized marching fashion, toward the output-terminal column, and
   another array of second cells configured to transfer the units of information stored in each of the memory units, synchronously with a second clock signal in the organized marching fashion, toward the input-terminal column.

16. The computer system of claim 15, further comprising a clock selector for selecting the clock signal or the second clock signal, and when the clock selector selects the second clock signal, being controlled by the control unit, results of the processing in the arithmetic logic unit are sent out sequentially to the marching main memory as a set of information, through the part of the output terminals in the output-terminal column, so that the set of information can be stored in the marching main memory, and the set of information is synchronously transferred toward the input-terminal column in the organized marching fashion in the array.

17. The computer system of claim 2, wherein a part of the memory units aligned along the column direction comprises a first memory unit, which comprises an array of first cells configured to transfer the units of information synchronously with the clock signal toward the output-terminal column in the organized marching fashion, and
   another part of the memory units aligned along the column direction comprises a second memory unit, which comprises an array of second cells configured to transfer the units of information synchronously with a second clock signal toward the input-terminal column in the organized marching fashion.

18. The computer system of claim 17, further comprising a clock selector for selecting the clock signal or the second clock signal, and
   when the clock selector selects the second clock signal, being controlled by the control unit, results of the processing in the arithmetic logic unit are sent out sequentially to the marching main memory as a set of information, through the part of the output terminals in the output-terminal column, so that the set of information can be stored in the marching main memory, and the set of information is synchronously transferred toward the input-terminal column in the organized marching fashion in the array.

19. A computer system comprising:
   a processor including:
      a control unit having a clock generator configured to generate a clock signal, and
      an arithmetic logic unit configured to execute arithmetic and logic operations synchronized with the clock signal;
   a marching main memory comprising an array of memory units, in which a plurality of the memory units are aligned along a column direction, each of the memory units comprising an array of cells aligned along the column direction, each of the cells storing information, so that each of the memory units can store a unit of information aligned along the column direction, and a plurality of one-dimensional arrangements of the memory units aligned along the column direction are further deployed along a row direction; and
   a marching-cache memory having a first marching-cache array, in which a plurality of first cache memory units are aligned along a column direction, assigned to the location of at least part of the memory units aligned along the column direction, each of the first cache memory units store a unit of information aligned along the column direction, and a plurality of one-dimensional arrangements of the first cache memory units aligned along the column direction are further deployed along a row direction;
   wherein the marching main memory further comprises an input-terminal column and an output-terminal column aligned along the column direction, the allocations of the input and output-terminal columns are respectively assigned to the row positions of the cells aligned along the column direction,
   the marching-cache memory further comprises a cache input-terminal column of the first marching-cache array configured to receive the unit of stored information from the marching main memory, the cache input-terminal column being connected to the output-terminal column, and a cache output-terminal column, the cache output-terminal column is connected to the arithmetic logic unit through the input-terminal column, units of information are fed to the array of cells in each of the memory units aligned along the column direction in the marching main memory,
   the units of information stored in each of the memory units are transferred synchronously with the clock signal in an organized marching fashion in the array, toward the output-terminal column, and the stored information is provided in parallel to the marching-cache memory through the output-terminal column and the cache input-terminal column,
   the units of information are stored in each of the first cache memory units aligned along the column direction, and the stored units of information are transferred synchronously with the clock signal in an organized marching fashion, toward the cache output-terminal column, and the stored units of information are provided in parallel to the processor through the cache output-terminal column, and
   the arithmetic logic unit can execute the arithmetic and logic operations synchronously with the clock signal, with the stored information being fed sequentially through the cache output-terminal column.

20. The computer system of claim 19, wherein the arithmetic logic unit comprises a plurality of arithmetic pipelines, each of which includes a vector processing unit.

* * * * *